United States Patent
Kim et al.

(10) Patent No.: US 9,825,234 B2
(45) Date of Patent: Nov. 21, 2017

(54) ORGANIC LIGHT-EMITTING DIODE

(71) Applicant: Samsung Display Co., LTD., Yongin, Gyeonggi-do (KR)

(72) Inventors: Myeong-Suk Kim, Yongin (KR); Sung-Wook Kim, Yongin (KR); Jae-Hong Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 947 days.

(21) Appl. No.: 14/025,794

(22) Filed: Sep. 12, 2013

(65) Prior Publication Data

US 2014/0326960 A1 Nov. 6, 2014

(30) Foreign Application Priority Data

May 3, 2013 (KR) .................. 10-2013-0050098

(51) Int. Cl.
*H01L 51/50* (2006.01)
*H01L 51/00* (2006.01)

(52) U.S. Cl.
CPC ...... *H01L 51/0067* (2013.01); *H01L 51/0072* (2013.01); *H01L 51/5016* (2013.01)

(58) Field of Classification Search
CPC ... H01L 51/50; H01L 51/0061; H01L 51/006; H01L 51/5012; H01L 51/5056; H01L 51/5072; H01L 51/5088; H01L 51/5092; H01L 51/5296
USPC ........... 252/301.26, 301.16; 257/40; 544/341
See application file for complete search history.

(56) References Cited

U.S. PATENT DOCUMENTS

| | | | | |
|---|---|---|---|---|
| 7,906,902 B2* | 3/2011 | Burn | .................. | C07F 15/0033 252/301.16 |
| 7,982,213 B2 | 7/2011 | Okajima et al. | | |
| 8,114,529 B2 | 2/2012 | Kitazawa et al. | | |
| 8,357,800 B2* | 1/2013 | Nazeeruddin | ....... | C07F 15/0033 546/4 |
| 8,920,942 B2* | 12/2014 | Otsu | ..................... | C09K 11/06 252/301.16 |
| 9,337,358 B2* | 5/2016 | Byrne | ................. | C08G 61/123 |
| 9,365,679 B2* | 6/2016 | Zhou | ....................... | C09K 11/06 |
| 9,376,529 B2* | 6/2016 | Brown | ................ | C07D 285/14 |
| 9,564,598 B2* | 2/2017 | Ito | ....................... | H01L 51/0074 |
| 2004/0076853 A1* | 4/2004 | Jarikov | .................. | C09K 11/06 428/690 |
| 2007/0122657 A1 | 5/2007 | Klubek et al. | | |
| 2008/0210930 A1* | 9/2008 | Kamatani | ........... | C07F 15/0033 257/40 |
| 2010/0152448 A1* | 6/2010 | Rigo | .................... | C07D 221/10 546/10 |
| 2010/0174078 A1* | 7/2010 | Nazeeruddin | ....... | C07F 15/0033 546/4 |
| 2010/0219407 A1 | 9/2010 | Kamatani et al. | | |
| 2010/0295026 A1* | 11/2010 | Tsuji | ....................... | C09K 11/06 257/40 |
| 2011/0156017 A1* | 6/2011 | Lee | .......................... | C07C 15/28 257/40 |
| 2011/0204348 A1* | 8/2011 | Nishizeki | ............... | C09K 11/06 257/40 |
| 2012/0085997 A1* | 4/2012 | Sugita | .................. | C07D 471/04 257/40 |
| 2012/0091446 A1* | 4/2012 | Jung | ....................... | C09K 11/06 257/40 |
| 2013/0112920 A1* | 5/2013 | Stoessel | ............... | C07D 487/02 252/301.16 |
| 2013/0292653 A1* | 11/2013 | Park | ...................... | C07D 221/08 257/40 |
| 2014/0183422 A1* | 7/2014 | Stoessel | .............. | C07F 15/0086 252/519.2 |
| 2014/0358198 A1* | 12/2014 | Buchholz | ............... | C09K 11/06 607/88 |

(Continued)

*Primary Examiner* — Douglas McGinty
(74) *Attorney, Agent, or Firm* — Lewis Roca Rothgerber Christie LLP

(57) ABSTRACT

An organic light-emitting diode (OLED) includes a first electrode; a second electrode facing the first electrode; and an organic layer between the first electrode and the second electrode. The organic layer includes a compound represented by one of Formula 1 or Formula 2, and a metallic complex.

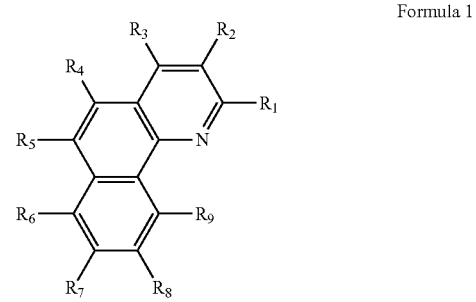

Formula 1

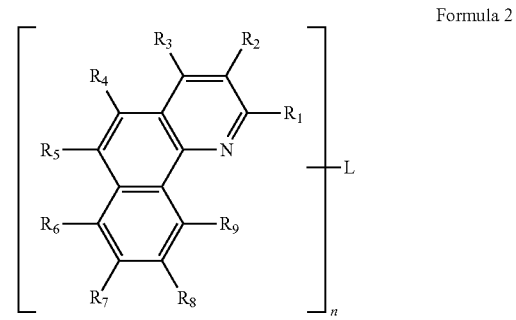

Formula 2

20 Claims, 1 Drawing Sheet

(56) References Cited

U.S. PATENT DOCUMENTS

2016/0194439 A1* 7/2016 Qin .................. C08G 61/126
　　　　　　　　　　　　　　　　　　　　252/501.1
2016/0214942 A1* 7/2016 Parham ............... C07D 401/14
2017/0077419 A1* 3/2017 Kim .................. H01L 51/0072

* cited by examiner

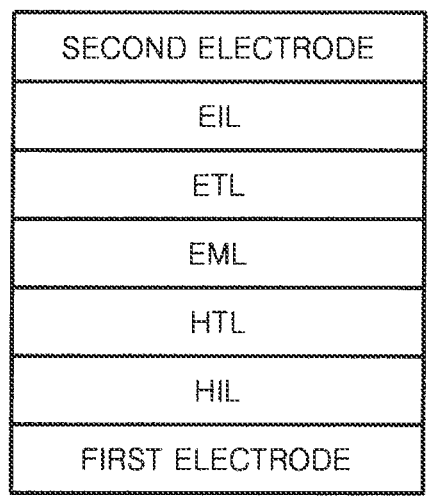

ORGANIC LIGHT-EMITTING DIODE

CROSS-REFERENCE TO RELATED APPLICATION

This application claims priority to and the benefit of Korean Patent Application No. 10-2013-0050098, filed on May 3, 2013 in the Korean Intellectual Property Office, the entire content of which is incorporated herein by reference

BACKGROUND

1. Technical Field

Embodiments of the present invention relate to organic light-emitting diodes.

2. Description of the Related Art

Organic light-emitting diodes (OLEDs) are self-emitting devices having advantages such as wide viewing angles, good contrast, quick response speeds, high brightness, and good driving voltage characteristics. Also, OLEDs can provide multicolored images.

A typical organic light-emitting diode structure includes a substrate, and an anode, a hole transport layer (HTL), an emission layer (EML), an electron transport layer (ETL), and a cathode sequentially stacked on the substrate. The HTL, the EML, and the ETL are organic thin films formed of organic compounds.

An operating principle of a typical organic light-emitting diode having the above-described structure is as follows. When a voltage is applied between the anode and the cathode, holes injected from the anode move to the EML via the HTL, and electrons injected from the cathode move to the EML via the ETL. Carriers, such as the holes and electrons, recombine in the EML to generate excitons. When the excitons drop from an excited state to a ground state, light is emitted.

SUMMARY

According to embodiments of the present invention, an organic light-emitting diode (OLED) has high color purity, high efficiency, and a long lifetime.

According to an aspect of the present invention, an organic light-emitting diode (OLED) includes: a first electrode; a second electrode; and an organic layer between the first electrode and the second electrode. The organic layer includes a compound of Formula 1 or 2 below, and a metallic complex.

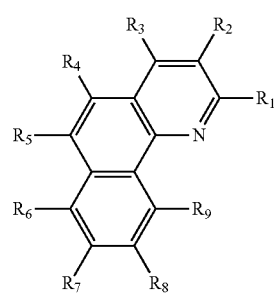

Formula 1

In Formula 1, $R_1$ to $R_9$ are each independently a hydrogen atom, a deuterium atom, a substituted or unsubstituted $C_1$-$C_{50}$ alkyl group, a substituted or unsubstituted $C_3$-$C_{50}$ cycloalkyl group, a substituted or unsubstituted $C_1$-$C_{50}$ alkoxy group, a substituted or unsubstituted $C_5$-$C_{50}$ aryloxy group, a substituted or unsubstituted $C_5$-$C_{50}$ arylthio group, a substituted or unsubstituted $C_5$-$C_{60}$ aryl group, an amino group substituted with a $C_5$-$C_{50}$ aryl group, a substituted or unsubstituted $C_3$-$C_{60}$ heteroaryl group, a substituted or unsubstituted $C_6$-$C_{60}$ condensed polycyclic group, a halogen group, a cyano group, a nitro group, a hydroxyl group, or a carboxyl group.

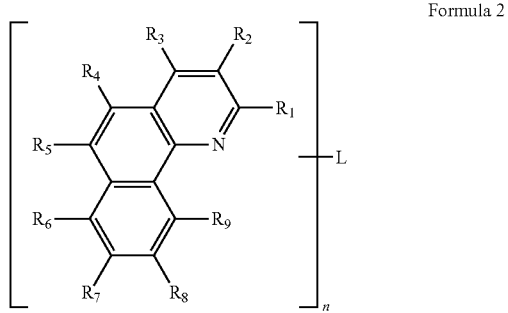

Formula 2

In Formula 2, $R_1$ to $R_9$ are as described above with respect to Formula 1. Also, the symbol "-" in the notation "-L" represents a bonding site for connection to a benzoquinone moiety at a position corresponding to one of $R_1$ to $R_9$. As such, each of $R_1$ to $R_9$ is independently either a bonding site to a benzoquinone moiety or is selected from the substituents described above with respect to Formula 1.

L represents a single bond, a substituted or unsubstituted $C_6$-$C_{60}$ arylene group or a substituted or unsubstituted $C_3$-$C_{60}$ heteroarylene group.

n is an integer from 2 to 4.

BRIEF DESCRIPTION OF THE DRAWING

The above and other features and advantages of the present invention will become more apparent by reference to the following detailed description when considered in conjunction with the attached drawing, in which:

FIG. 1 is a schematic cross-sectional view of an organic light-emitting diode (OLED) according to an embodiment of the present invention.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

According to an aspect of the present invention, an organic light-emitting diode (OLED) includes a first electrode; a second electrode; and an organic layer between the first electrode and the second electrode and including a compound of Formula 1 or Formula 2 below, and a metallic complex.

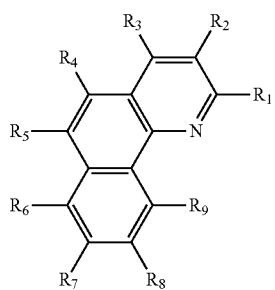

Formula 1

In Formula 1 above, $R_1$ to $R_9$ may each independently be a hydrogen atom, a deuterium atom, a substituted or unsubstituted $C_1$-$C_{50}$ alkyl group, a substituted or unsubstituted $C_3$-$C_{50}$ cycloalkyl group, a substituted or unsubstituted $C_1$-$C_{50}$ alkoxy group, a substituted or unsubstituted $C_5$-$C_{50}$ aryloxy group, a substituted or unsubstituted $C_5$-$C_{50}$ arylthio group, a substituted or unsubstituted $C_5$-$C_{60}$ aryl group, an amino group substituted with a $C_5$-$C_{50}$ aryl group, a substituted or unsubstituted $C_3$-$C_{60}$ heteroaryl group, a substituted or unsubstituted $C_6$-$C_{60}$ condensed polycyclic group, a halogen atom, a cyano group, a nitro group, a hydroxyl group, or a carboxyl group.

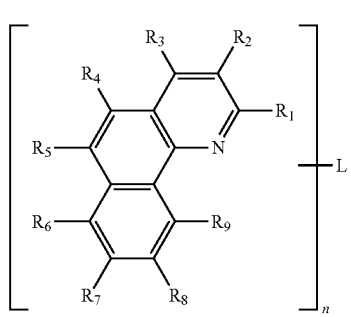

Formula 2

In Formula 2 above, $R_1$ to $R_9$ are as described above with respect to Formula 1.

The symbol "-" in a the notation "-L" represents a bonding site for connection to a benzoquinone moiety at a position corresponding to one of $R_1$ to $R_9$. As such, each of $R_1$ to $R_9$ is independently either a bonding site to a benzoquinone moiety or is selected from the substituents described above with respect to Formula 1.

L is a single bond, a substituted or unsubstituted $C_6$-$C_{60}$ arylene group or a substituted or unsubstituted $C_3$-$C_{60}$ heteroarylene group.

n is an integer from 2 to 4.

The compound of Formula 1 or Formula 2 is used with a phosphorescent dopant, such as a platinum (Pt) complex dopant. Thus, compared to a conventional combination of an iridium (Ir) complex dopant and a host, diode performance is improved. In particular, compared to the conventional combination of an Ir-based dopant and a host, the combination of a Pt-based or osmium (Os)-based complex and the compound of Formula 1 or Formula 2 improves the emission and lifetime characteristics of the diodes.

The compounds of Formula 1 and Formula 2, and the metallic complex will be described in detail.

According to an embodiment of the present invention, a metal of the metallic complex may be Ir, Pt, Os, or palladium (Pd).

According to another embodiment of the present invention, in Formula 1 or Formula 2, adjacent substituents among $R_1$ to $R_9$ may be selectively connected to each other to form a ring.

According to another embodiment of the present invention, in Formula 1 or Formula 2, n may be an integer of 2 or 3.

According to another embodiment of the present invention, in Formula 1 or Formula 2, $R_2$ and $R_7$ may independently be any moiety represented by one of Formulas 2a to 2c below.

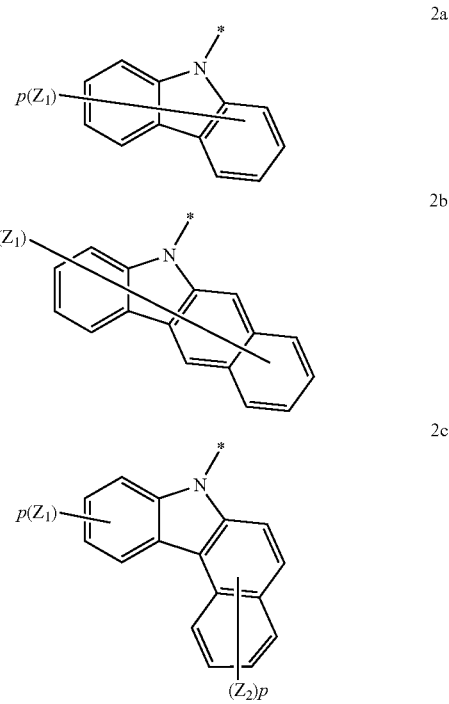

In Formulas 2a to 2c, $Z_1$ and $Z_2$ may each independently be a hydrogen atom, a deuterium atom, a substituted or unsubstituted $C_1$-$C_{20}$ alkyl group, a substituted or unsubstituted $C_5$-$C_{20}$ aryl group, a substituted or unsubstituted $C_3$-$C_{20}$ heteroaryl group, a substituted or unsubstituted $C_6$-$C_{20}$ condensed polycyclic group, a halogen atom, a cyano group, a nitro group, a hydroxyl group, or a carboxyl group.

p is an integer from 1 to 9.

* is a binding site.

According to another embodiment of the present invention, in Formula 1 or Formula 2, $R_4$ and $R_5$ may independently be any moiety represented by one of Formulas 3a to 3d below.

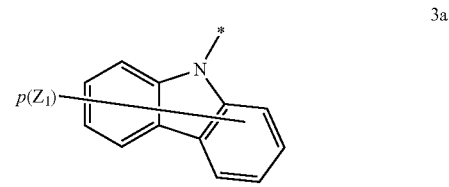

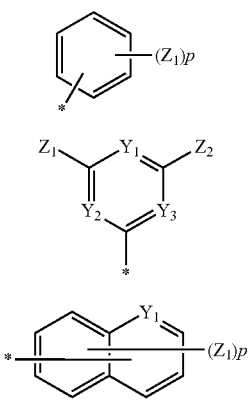

In Formulas 3a to 3d, $Z_1$ and $Z_2$ may each independently be a hydrogen atom, a deuterium atom, a substituted or unsubstituted $C_1$-$C_{20}$ alkyl group, a substituted or unsubstituted $C_5$-$C_{20}$ aryl group, a substituted or unsubstituted $C_3$-$C_{20}$ heteroaryl group, a substituted or unsubstituted $C_6$-$C_{20}$ condensed polycyclic group, a halogen group, a cyano group, a nitro group, a hydroxyl group, or a carboxyl group.

$Y_1$ to $Y_3$ may each independently be CH or N.

p is an integer from 1 to 8.

* is a binding site.

According to another embodiment of the present invention, in Formula 1 or Formula 2, $R_1$, $R_3$, $R_6$, $R_8$, and $R_9$ may each independently be a hydrogen atom or a deuterium atom.

According to another embodiment of the present invention, in Formula 1 or Formula 2, L may be any moiety represented by one of Formulas 4a and 4b below.

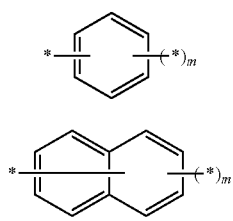

In Formulas 4a and 4b above, m is an integer from 1 to 3, and * is a binding site.

Hereinafter, some representative substituents useful in embodiments of the present invention will be described. However, the number of carbon atoms in the listed representative substituents are presented for illustrative purposes only, and the number of carbon atoms in the substituents is not limited to the number listed. Additionally, any suitable substituent can be used in embodiments of the present invention, and those substituents that are not specifically listed here are considered known by those of ordinary skill in the art.

The unsubstituted $C_1$-$C_{60}$ alkyl group may be linear or branched. Non-limiting examples of the unsubstituted $C_1$-$C_{60}$ alkyl group include a methyl group, an ethyl group, a propyl group, an iso-butyl group, a sec-butyl group, a pentyl group, an iso-amyl group, a hexyl group, a heptyl group, an octyl group, a nonanyl group, and a dodecyl group. The substituted $C_1$-$C_{60}$ alkyl group refers to the substitution of at least one hydrogen atom of the unsubstituted $C_1$-$C_{60}$ alkyl group with a deuterium atom, a halogen group, a hydroxyl group, a nitro group, a cyano group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_2$-$C_{10}$ alkenyl group, a $C_2$-$C_{10}$ alkynyl group, a $C_6$-$C_{16}$ aryl group, a $C_4$-$C_{16}$ heteroaryl group, or an organosilyl group.

The unsubstituted $C_2$-$C_{60}$ alkenyl group indicates an unsubstituted alkyl group having at least one carbon-carbon double bond in the center or at a terminal end of the group. Non-limiting examples of the unsubstituted $C_2$-$C_{60}$ alkenyl group include an ethenyl group, a propenyl group, a butenyl group, and the like. The substituted $C_2$-$C_{60}$ alkenyl group refers to the substitution of at least one hydrogen atom of the unsubstituted alkenyl group with the substituents described above with respect to the substituted alkyl group.

The unsubstituted $C_2$-$C_{60}$ alkynyl group indicates an unsubstituted alkyl group having at least one carbon-carbon triple bond in the center or at a terminal of the group. Non-limiting examples of the unsubstituted $C_2$-$C_{60}$ alkynyl group include acetylene, propylene, phenylacetylene, naphthylacetylene, isopropylacetylene, t-butylacetylene, diphenylacetylene, and the like. The substituted $C_2$-$C_{60}$ alkynyl group refers to the substitution of at least one hydrogen atom of the unsubstituted $C_2$-$C_{60}$ alkynyl group with the substituents described above with respect to the substituted alkyl group.

The unsubstituted $C_3$-$C_{60}$ cycloalkyl group indicates a cyclic alkyl group forming a $C_3$-$C_{60}$ ring. The substituted alkyl group refers to the substitution of at least one hydrogen atom of the $C_3$-$C_{60}$ cycloalkyl group with the substituents described above with respect to the $C_1$-$C_{60}$ alkyl group.

The unsubstituted $C_1$-$C_{60}$ alkoxy group has a structure of —OA where A is the unsubstituted $C_1$-$C_{60}$ alkyl group described above. Non-limiting examples of the unsubstituted $C_1$-$C_{60}$ alkoxy group include a methoxy group, an ethoxy group, a propoxy group, an isopropyloxy group, a butoxy group, a pentoxy group, and the like. The substituted $C_1$-$C_{60}$ alkoxy group refers to the substitution of at least one hydrogen atom of the unsubstituted alkoxy group with the substituents described above with respect to the substituted alkyl group.

The unsubstituted $C_5$-$C_{60}$ aryl group indicates a carbocyclic aromatic system including at least one ring. When the unsubstituted $C_5$-$C_{60}$ aryl group has two or more rings, the rings may be fused or linked to each other by a single bond. The term 'aryl' refers to an aromatic system such as phenyl, napthyl, and anthracenyl. The substituted $C_5$-$C_{60}$ aryl group refers to the substitution of at least one hydrogen atom of the aryl group with the substituents described above with respect to the $C_1$-$C_{60}$ alkyl group.

Non-limiting examples of the substituted or unsubstituted $C_5$-$C_{60}$ aryl group include a phenyl group, a $C_1$-$C_{10}$ alkylphenyl group (i.e., an ethylphenyl group), a halophenyl group (i.e., an o-, m-, or p-fluorophenyl group or a dichlorophenyl group), a cyanophenyl group, a dicyanophenyl, a trifluoromethoxyphenyl group, a biphenyl group, a halobiphenyl group, a cyanobiphenyl group, a $C_1$-$C_{10}$ alkylbiphenyl group, a $C_1$-$C_{10}$ alkoxybiphenyl group, an o-, m-, or p-toryl group, an o-, m-, or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (i.e., a fluoronaphthyl group), a $C_1$-$C_{10}$ alkylnaphthyl group (i.e., a methylnaphthyl group), a $C_1$-$C_{10}$ alkoxynaphthyl group (i.e., a methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, and the like.

The unsubstituted $C_3$-$C_{60}$ heteroaryl group may include one, two, or three hetero atoms selected from N, O, P, or S. When the unsubstituted $C_3$-$C_{60}$ heteroaryl group has two or more of rings, the rings may be fused or linked to each other by a single bond. Non-limiting examples of the unsubstituted $C_4$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a dibenzothiophene group, and the like. The substituted $C_3$-$C_{60}$ heteroaryl group refers to the substitution of at least one hydrogen atom of the heteroaryl group with the substituents described above with respect to the substituted $C_1$-$C_{60}$ alkyl group.

The unsubstituted $C_5$-$C_{60}$ aryloxy group is a group represented by —$OA_1$ in which $A_1$ is a $C_5$-$C_{60}$ aryl group. Non-limiting examples of the aryloxy group include a phenoxy group, and the like. The substituted $C_5$-$C_{60}$ aryloxy group refers to the substitution of at least one hydrogen atom of the aryloxy group with the substituents described above with respect to the substituted $C_1$-$C_{60}$ alkyl group.

The unsubstituted $C_5$-$C_{60}$ arylthio group is a group represented by —$SA_1$ in which $A_1$ is a $C_5$-$C_{60}$ aryl group. Non-limiting examples of the arylthio group include a benzenethio group, a naphthylthio group, and the like. The substituted $C_5$-$C_{60}$ arylthio group refers to the substitution of at least one hydrogen atom of the arylthio group with the substituents described above with respect to the substituted $C_1$-$C_{60}$ alkyl group.

The unsubstituted $C_6$-$C_{60}$ condensed polycyclic group refers to a substituent including at least two rings, including at least aromatic ring and at least one non-aromatic ring that are fused to each other. Alternatively, the unsubstituted $C_6$-$C_{60}$ condensed polycyclic group refers to a substituent having an unsaturated group within a ring but that is unable to form a conjugated structure. The unsubstituted $C_6$-$C_{60}$ condensed polycyclic group is distinct from the aryl or heteroaryl groups by inclusion of the non-aromatic component.

The trialkylsilyl group refers to a moiety including 3 alkyl groups bonded to silicon (Si), and the dialkylsilyl group refers to a moiety including 2 alkyl groups or 1 alkyl group bonded to Si. The triarylsilyl group refers to a moiety including 3 aryl groups bonded to Si.

Non-limiting examples of the compound of Formula 1 or Formula 2 according to embodiments of the present invention include Compounds 1-58 below, but Formulae 1 and 2 are not limited thereto.

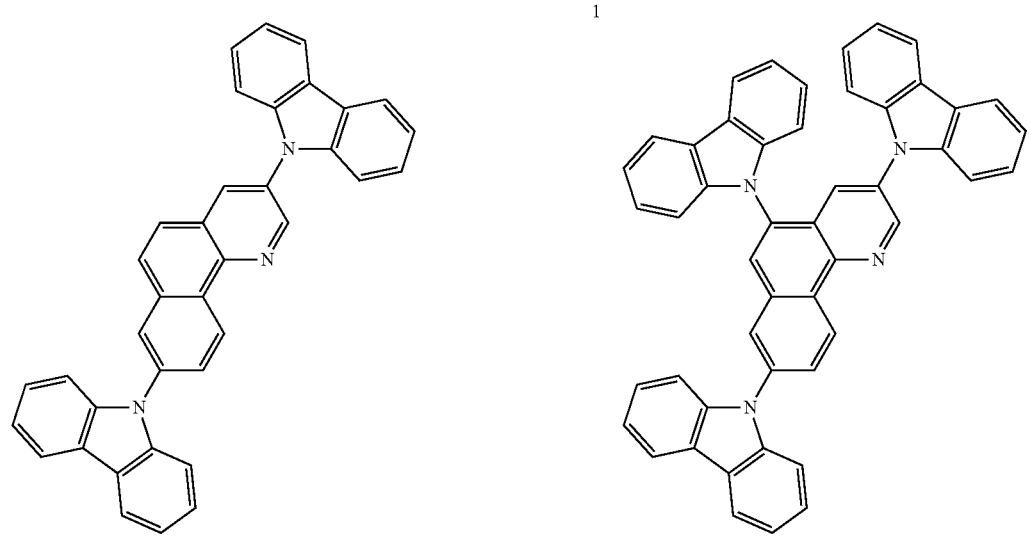

-continued
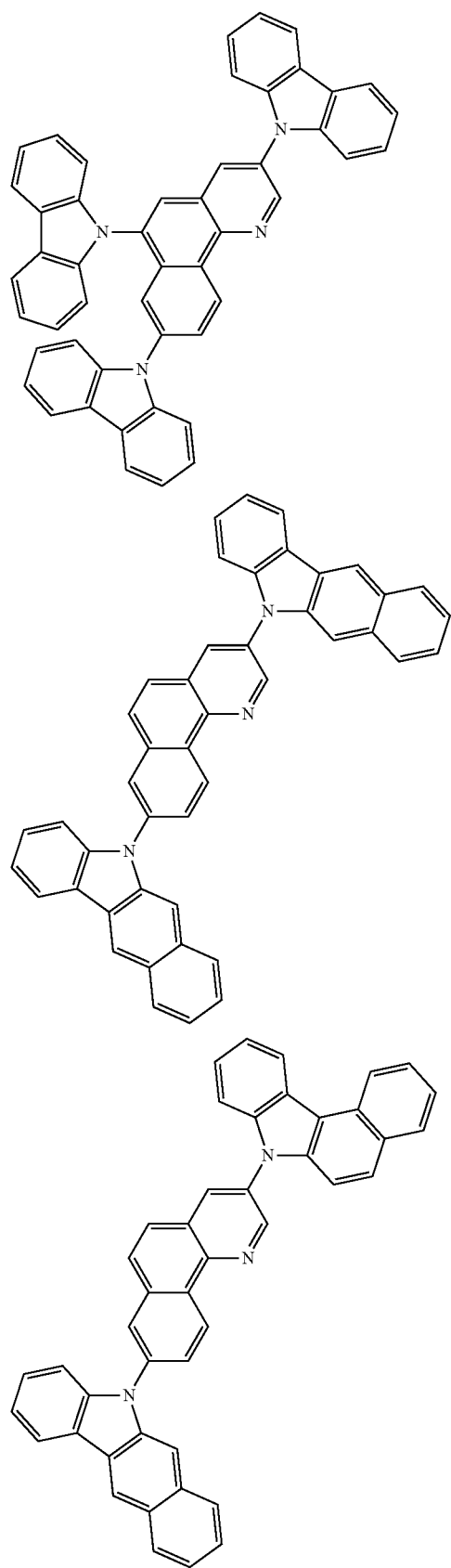
3
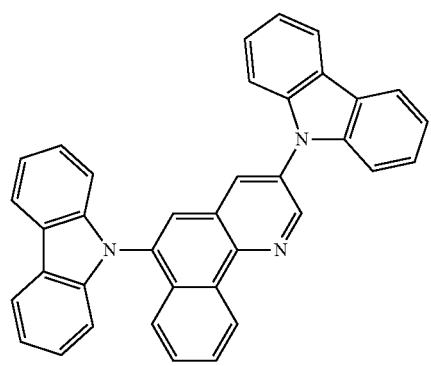
4
5
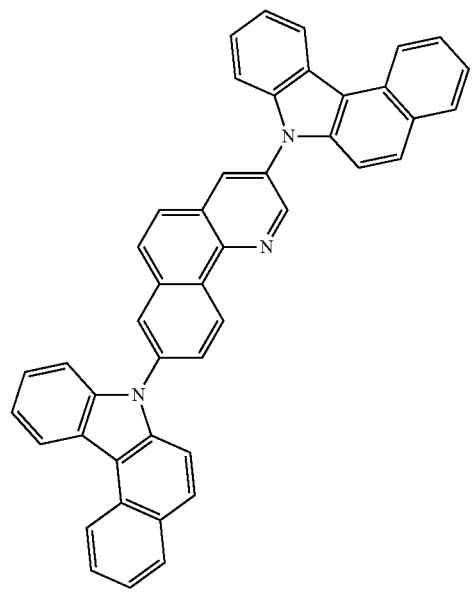
6
7
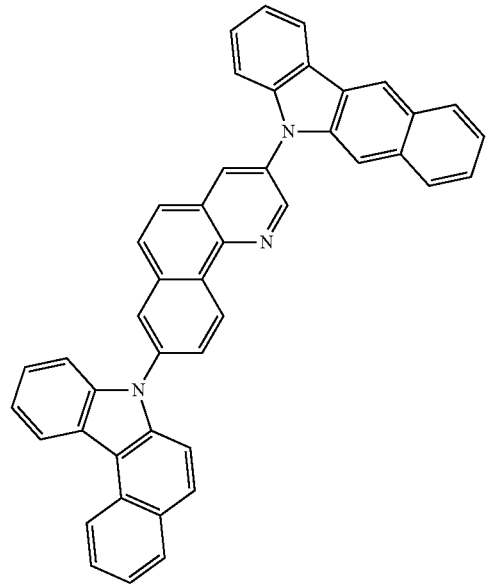
8

-continued
9
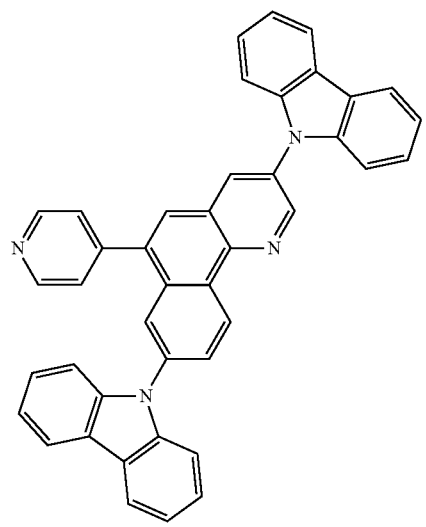
10
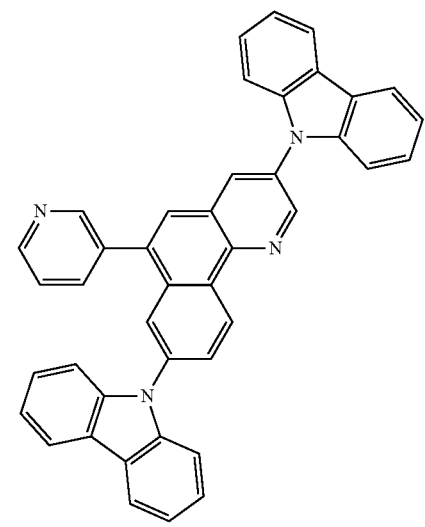
11
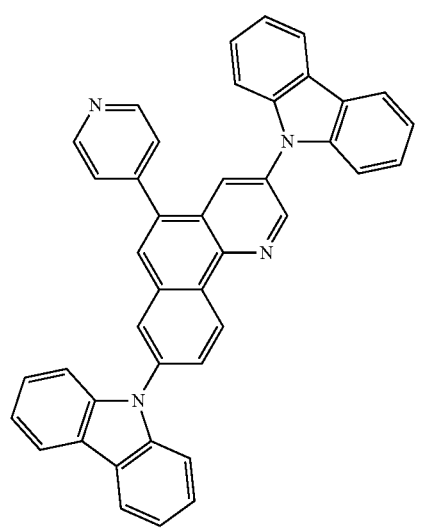
12
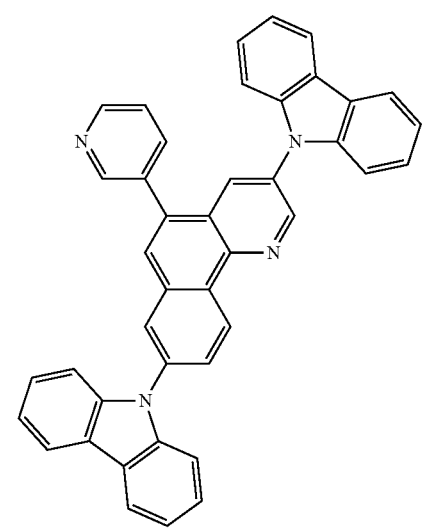
13
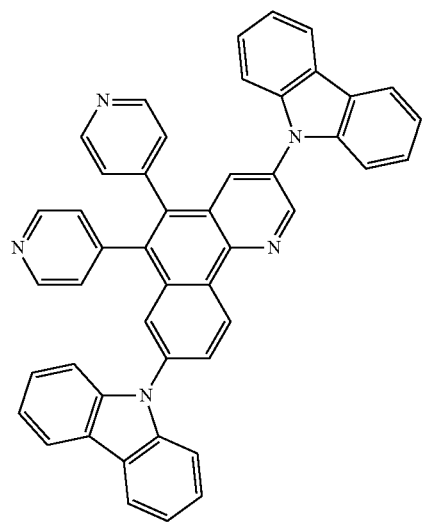
14
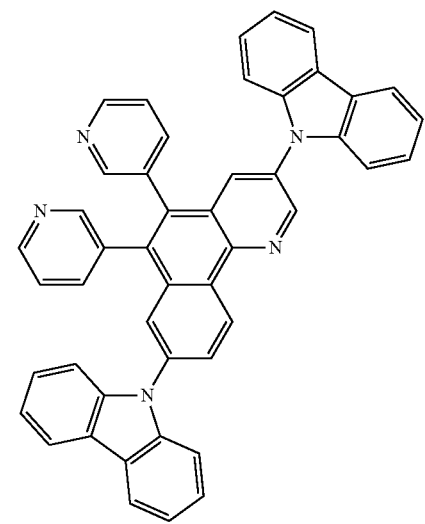

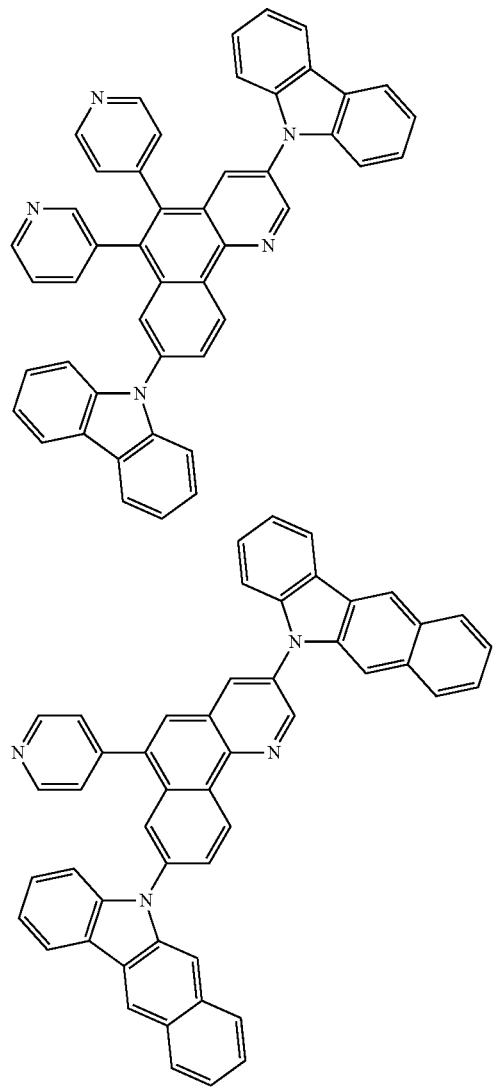
15
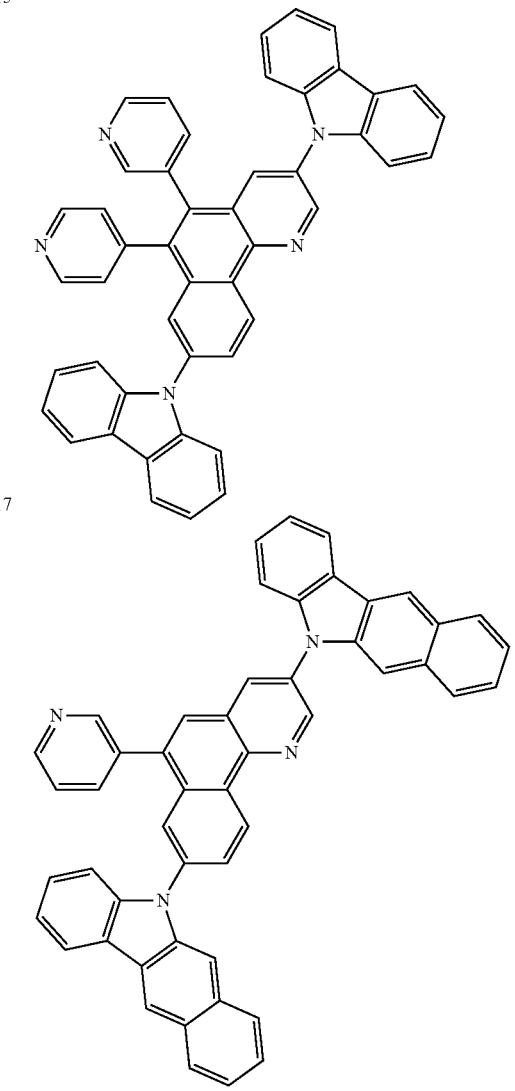
16
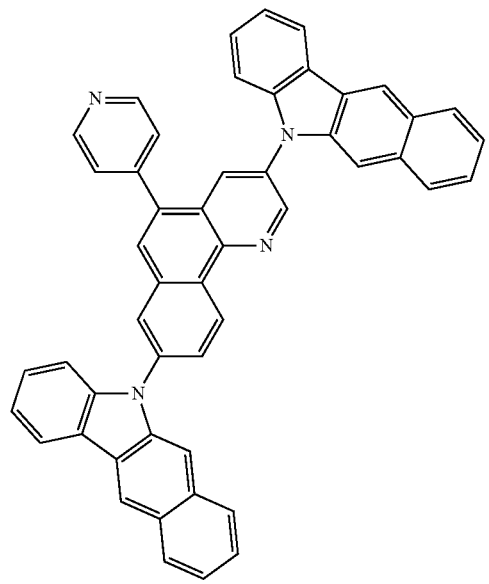
19
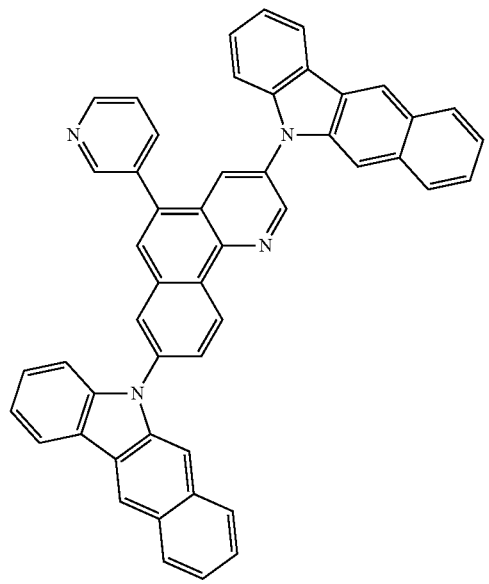
20

-continued
21
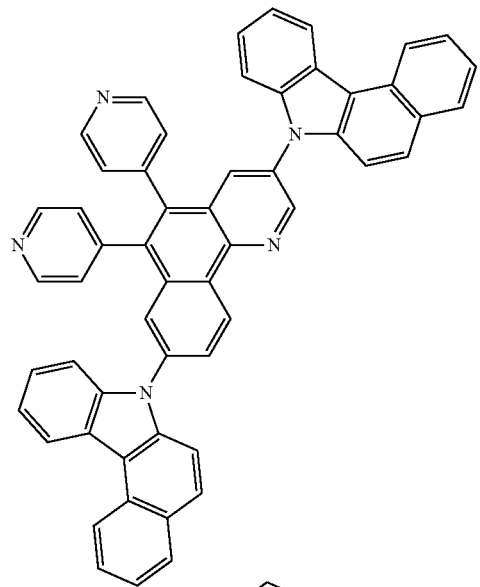
22
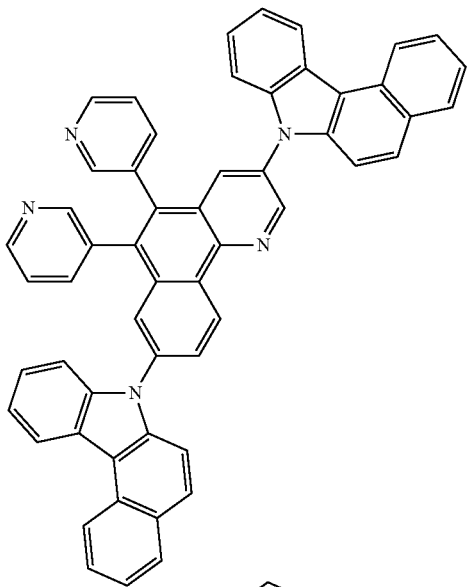
23
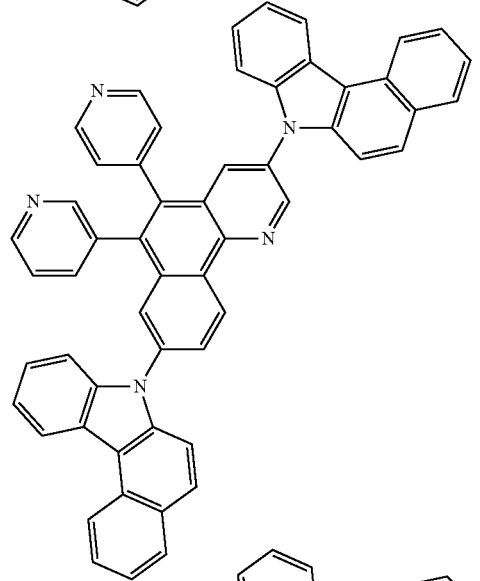
24
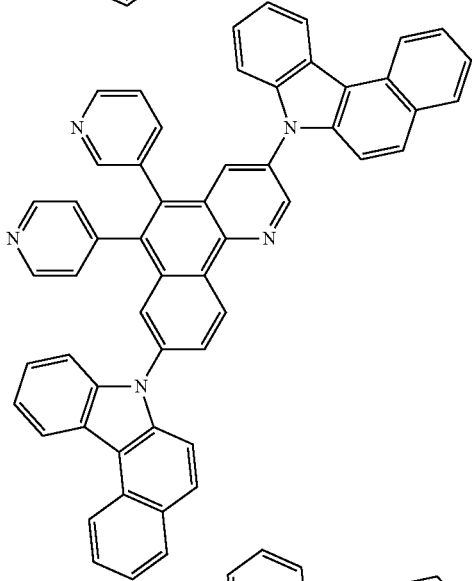
25
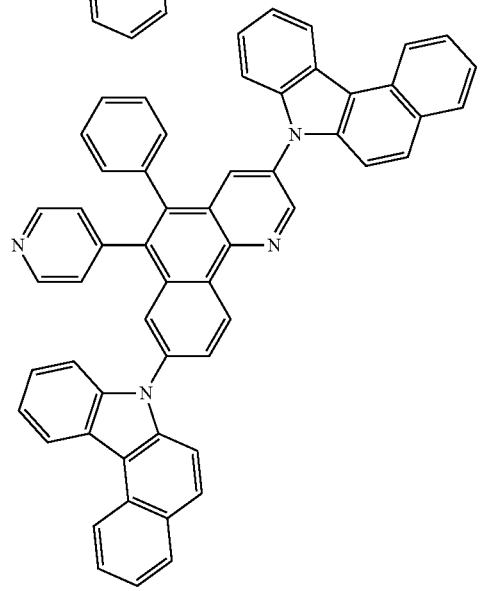
26
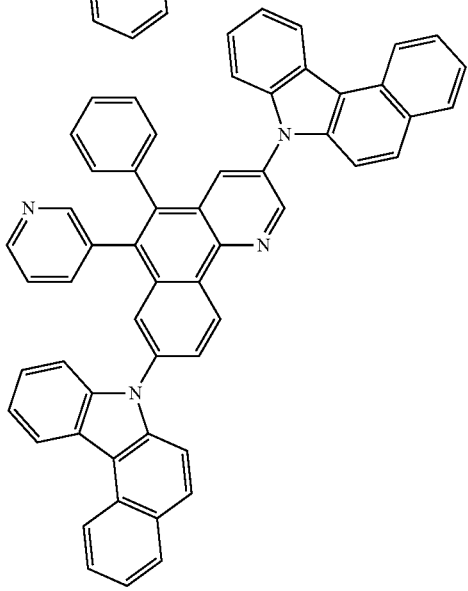

-continued
27
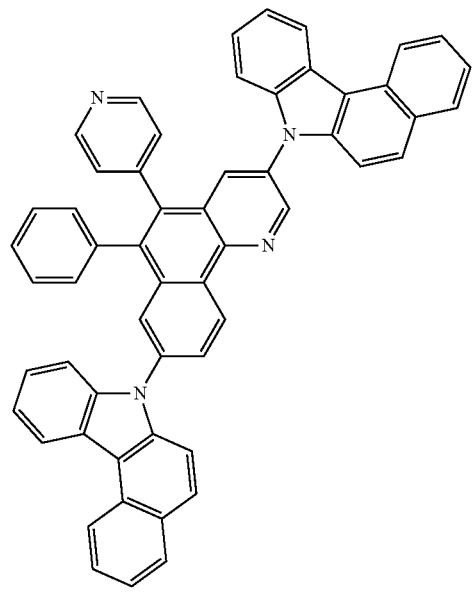
28
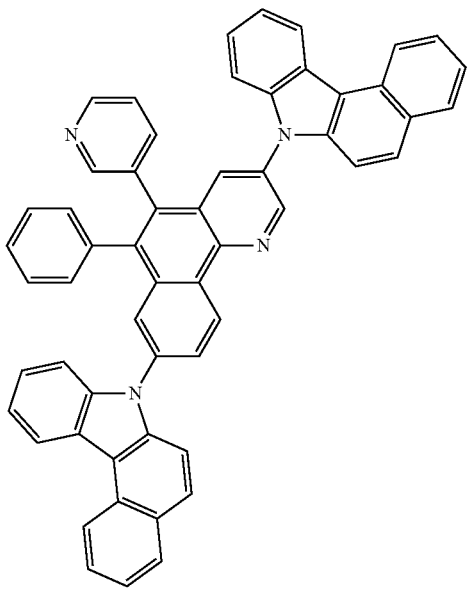
29
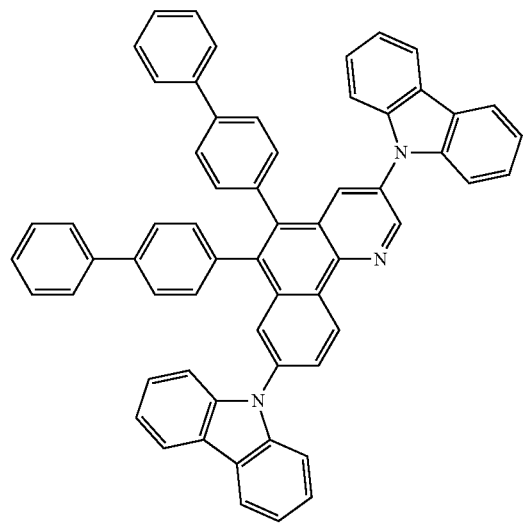
30
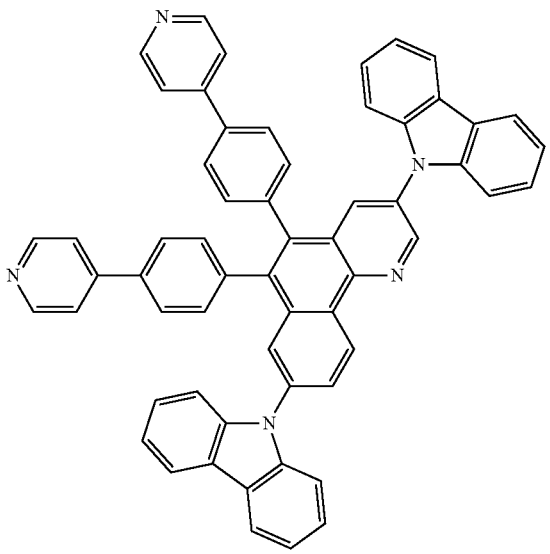
31
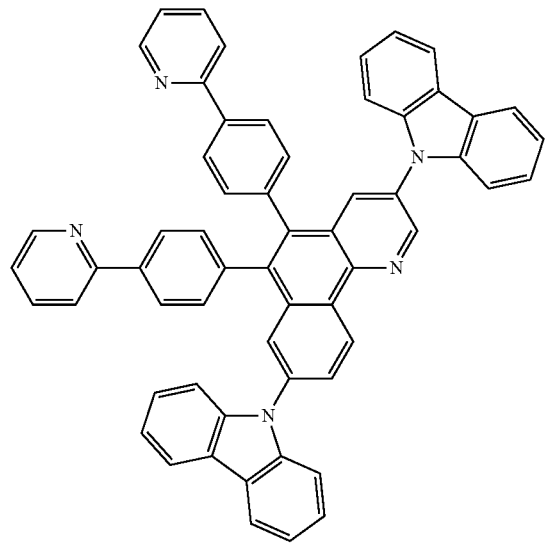
32
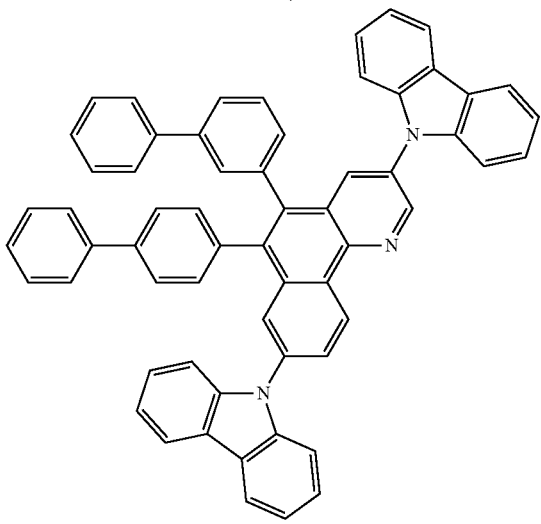

-continued
33
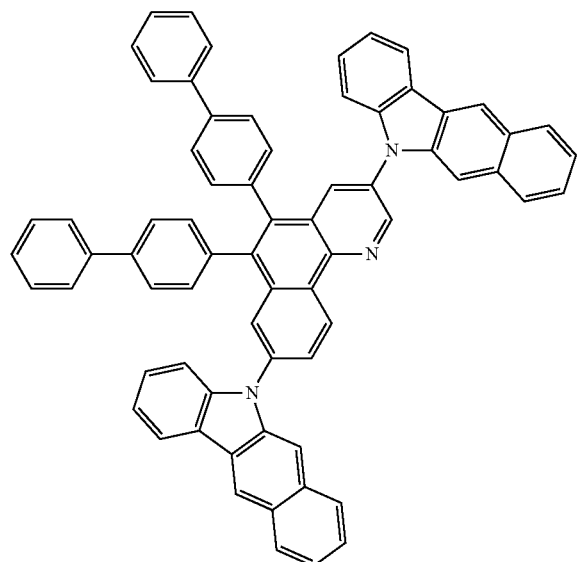
34
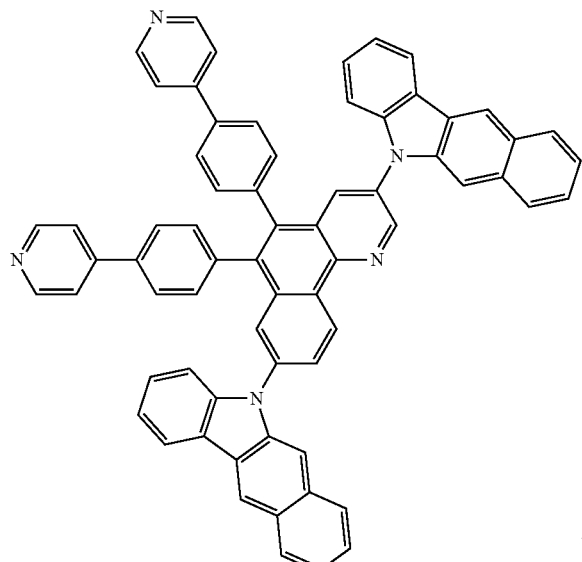
35
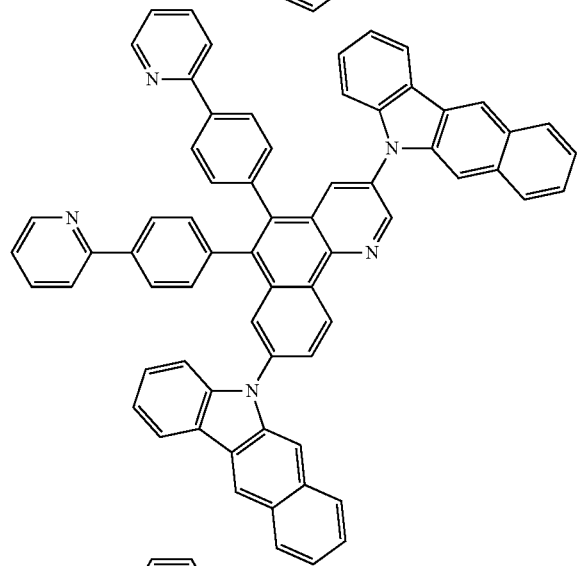
36
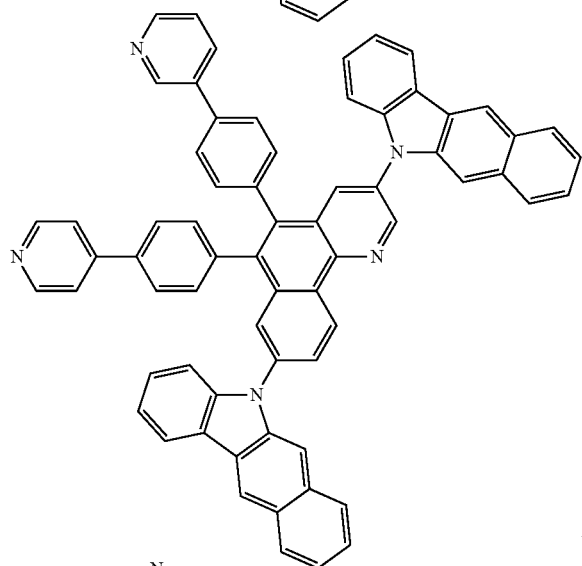
37
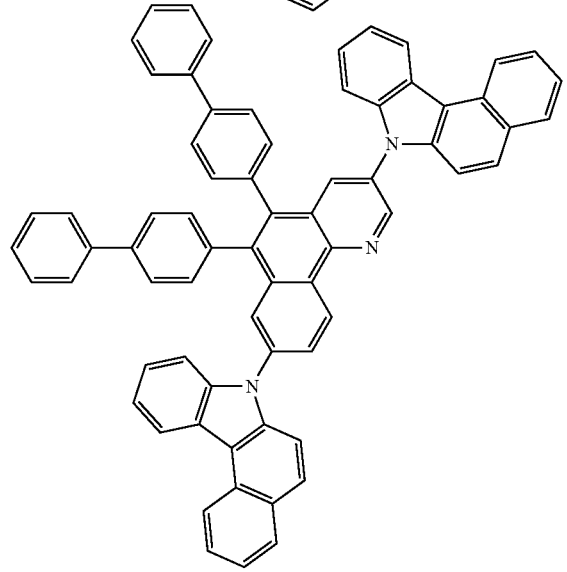
38
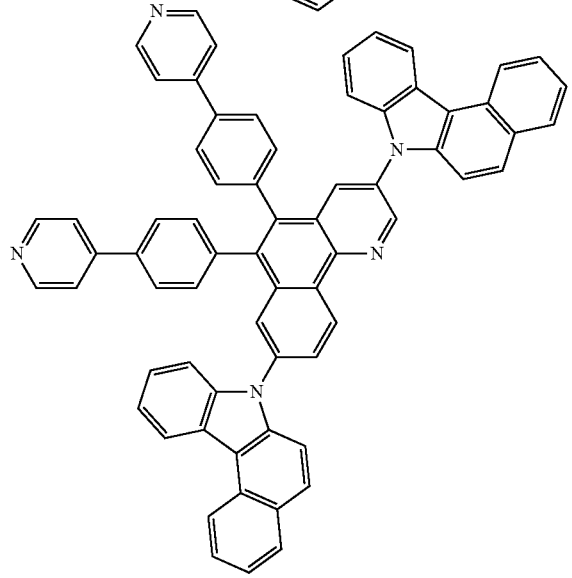

-continued
39
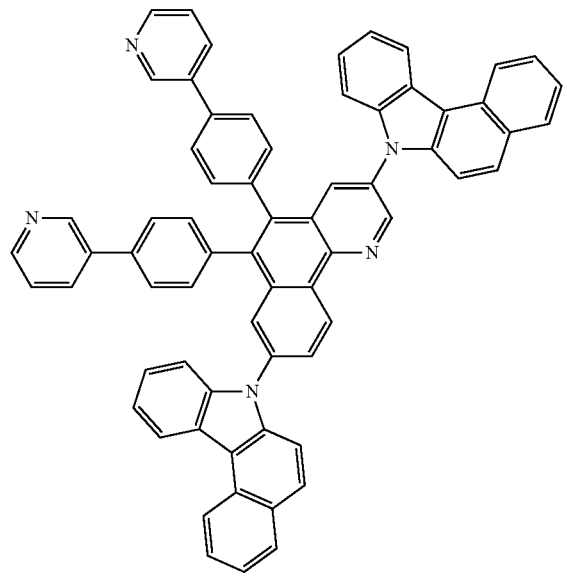
40
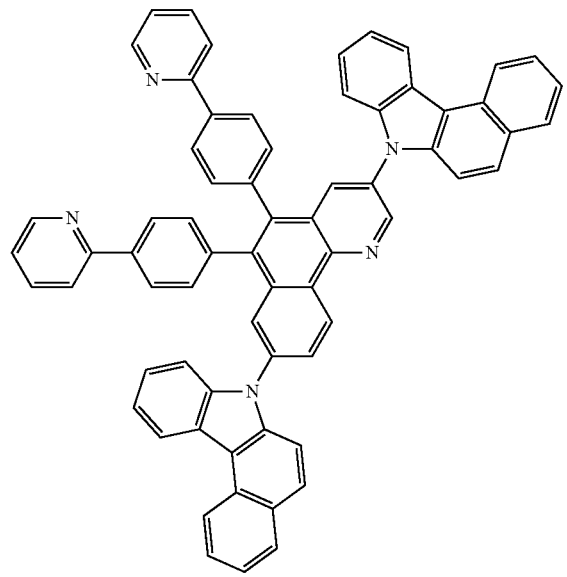
41
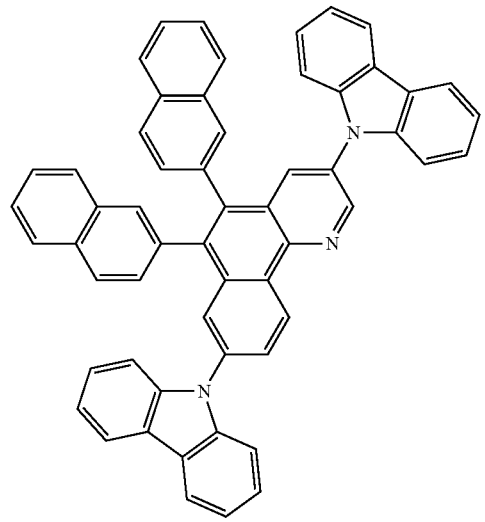
42
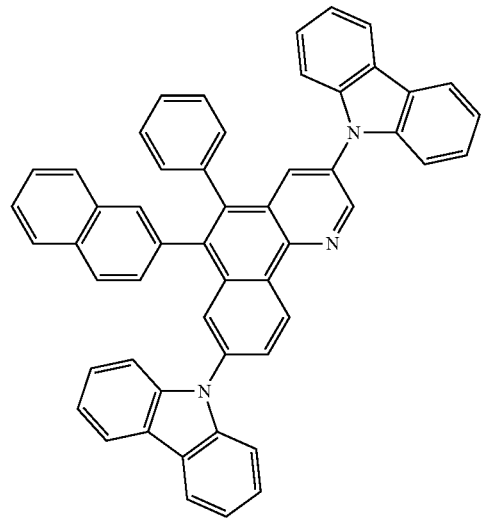
43
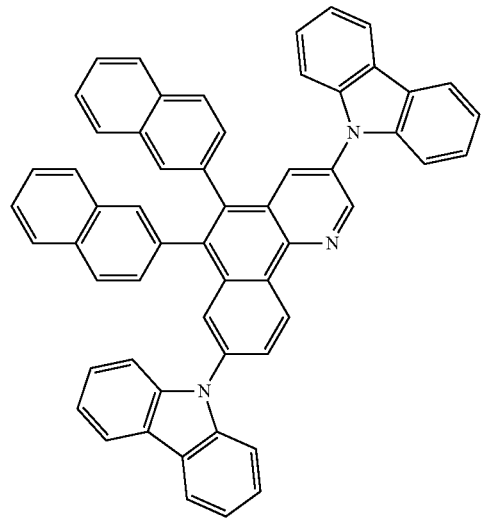
44
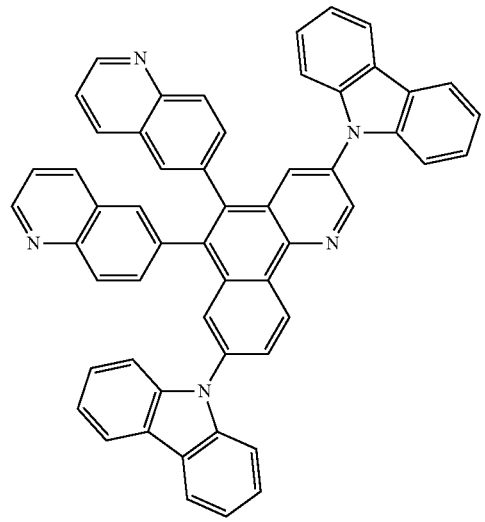

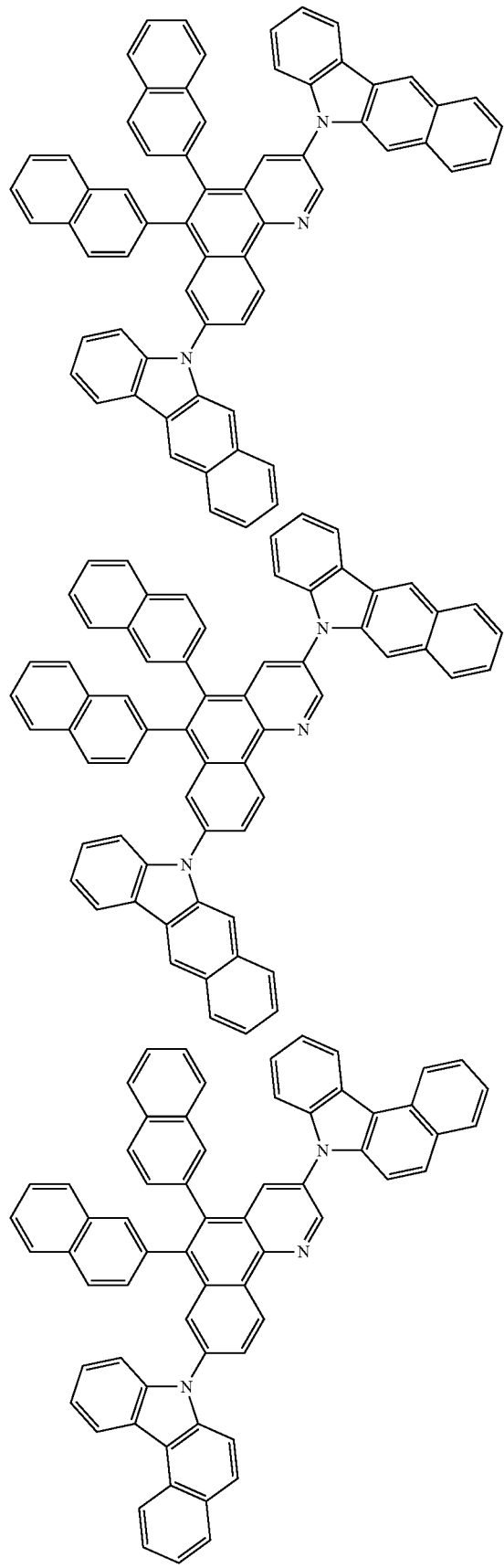
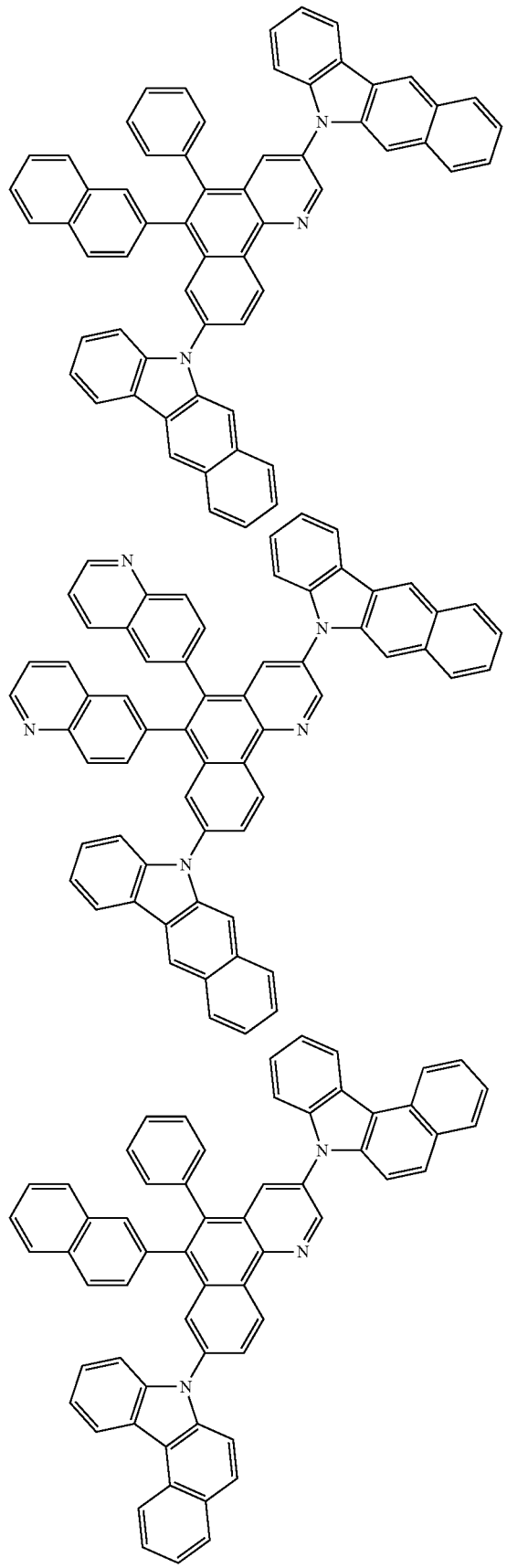

-continued
51
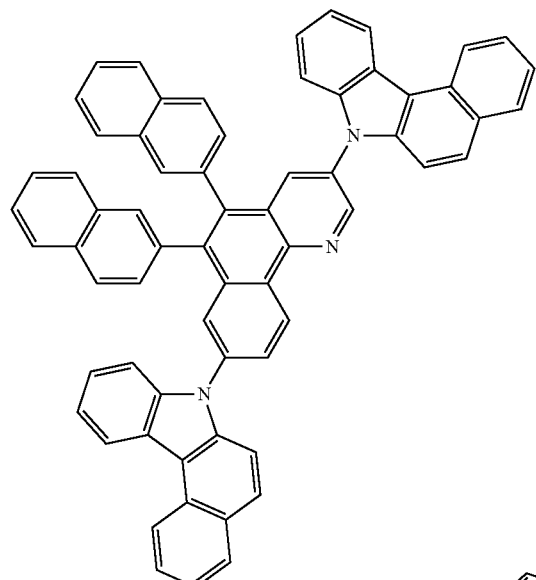
52
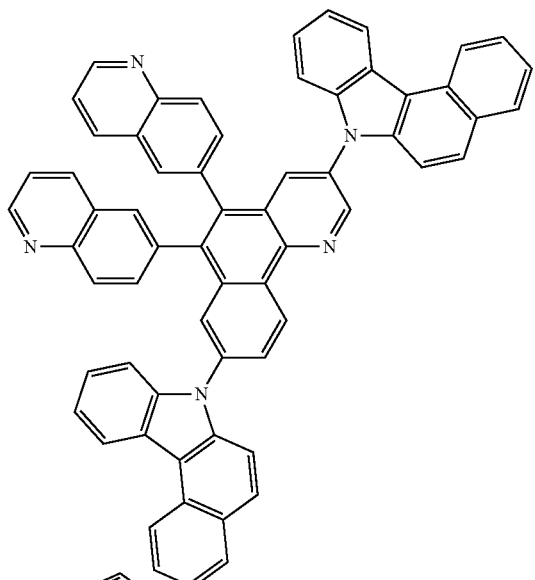
53
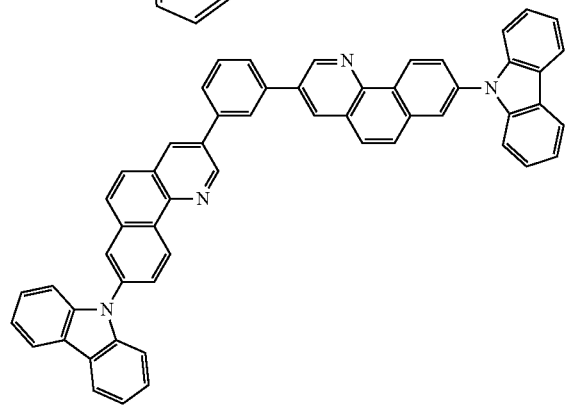
54
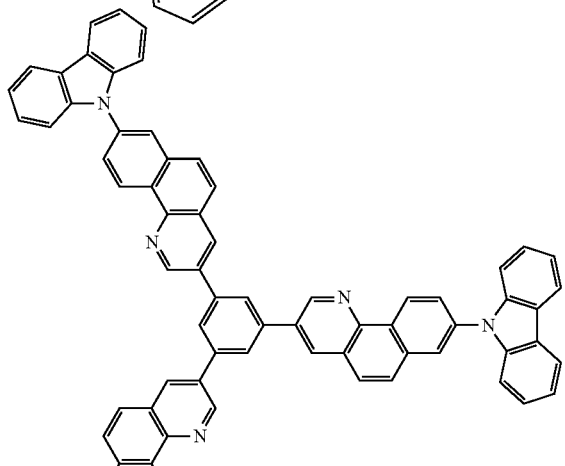
55
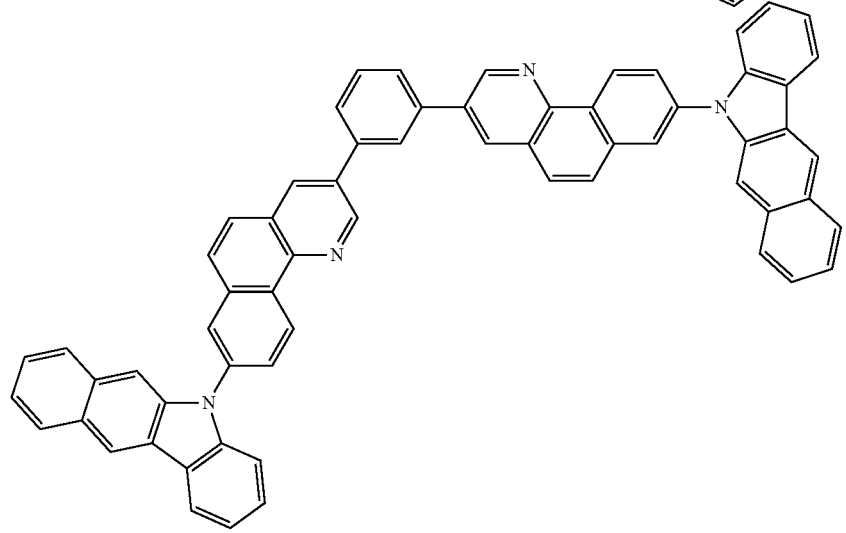

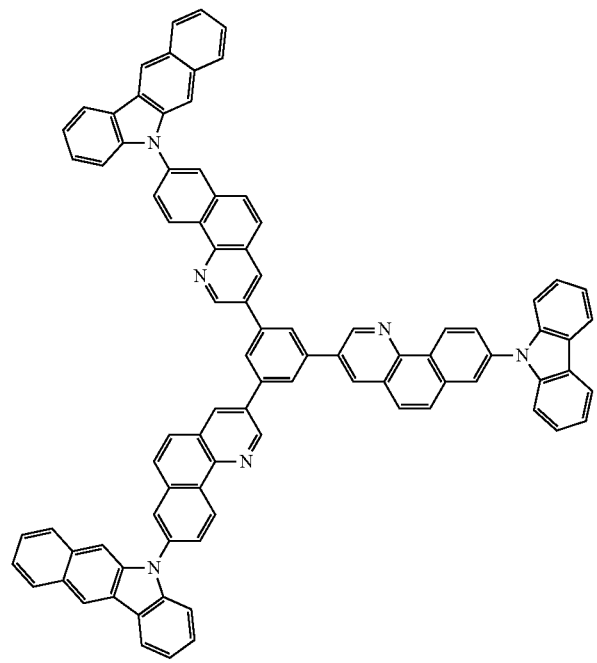
56
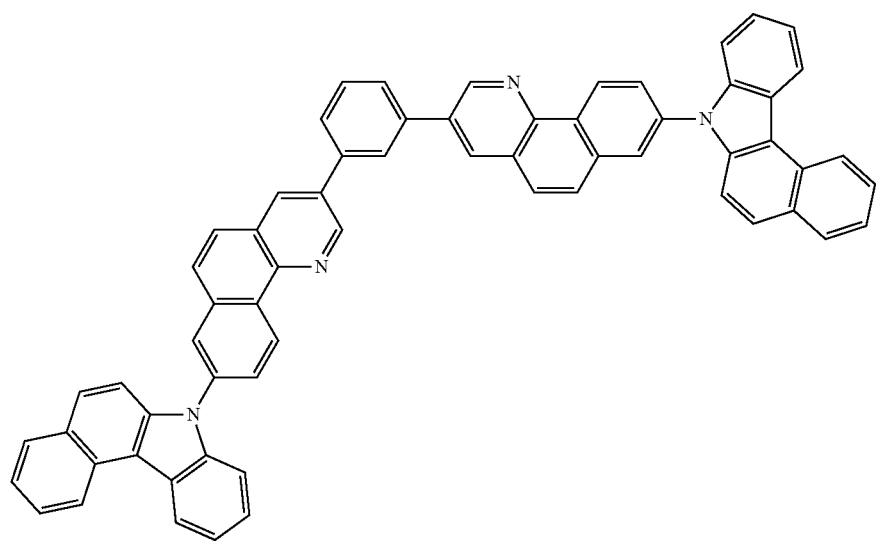
57

-continued

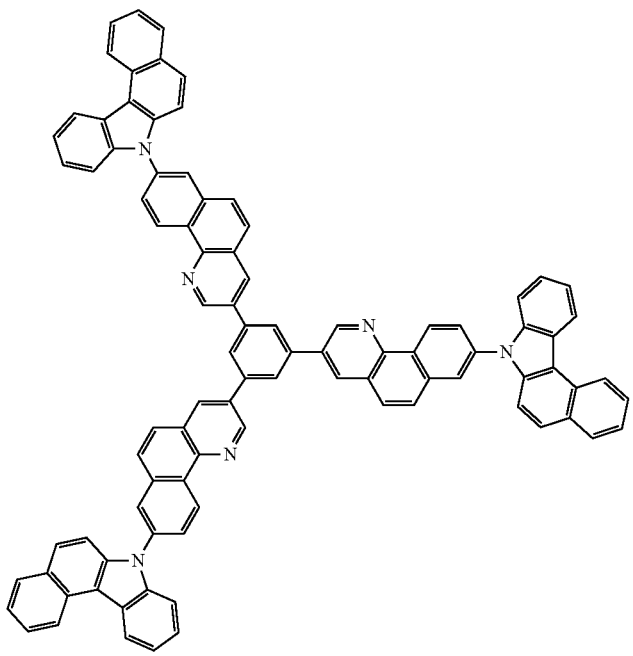

Examples of the metallic complex are described later with reference to the dopant.

According to another aspect of the present invention, an OLED includes an organic layer that may include at least one of a hole injection layer (HIL), a hole transport layer (HTL), a functional layer having both hole injection and hole transport capabilities (hereinafter, referred as an "H-functional layer"), a buffer layer, an electron blocking layer (EBL), an emission layer (EML), a hole blocking layer (HBL), an electron transport layer (ETL), an electron injection layer (EIL), and/or a functional layer having both electron injection and electron transport capabilities (hereinafter, referred as an "E-functional layer").

In greater detail, the organic layer may be an EML, and the compound of Formula 1 or Formula 2 may be used as a phosphorescent host.

In some embodiments, the metallic complex may be used as a dopant.

In some embodiments, the OLED may include an EIL, an ETL, an EML, a HIL, a HTL, or an H-functional layer having both hole injection and hole transport capabilities. The EML may include the compound of Formula 1 or Formula 2. The OLED may further include an anthracene-based compound, an arylamine-based compound, or a styryl-based compound.

In some embodiments, the OLED may include an EIL, an ETL, an EML, a HIL, a HTL, or an H-functional layer having both hole injection and hole transport capabilities. At least a red layer, a green layer, a blue layer, and a white layer of the EML may include a phosphorescent compound, and the HIL, the HTL, or the H-functional layer having both hole injection and hole transport capabilities may include a charge-generating material. The charge-generating material may be a p-dopant, and the p-dopant may be a quinone derivative, a metallic oxide, or a cyano group-containing compound.

In some embodiments, the organic layer may include an ETL, and the ETL may include an electron-transporting organic compound and a metallic complex. The metallic complex may be a lithium (Li) complex.

The term "organic layer," as used herein, refers to a single layer and/or a multi-layer disposed between the first electrode and the second electrode of the OLED. The organic layer includes an EML, and the EML may include the compound of Formula 1 or Formula 2 above. In some embodiments, the organic layer may include at least one of a HIL, HTL, an H-functional layer having both hole injection and hole transport capabilities. At least one of the HIL, the HTL, and the H-functional layer having both hole injection and hole transport capabilities may include the compound of Formula 1 or Formula 2 above.

The compound of Formula 1 or Formula 2 included in the EML may act as a host. The metallic complex included in the EML may act as a dopant.

FIG. 1 is a schematic view of an OLED according to an embodiment of the present invention. Hereinafter, a structure and a manufacturing method of an OLED according to an embodiment of the present invention will be described with reference to FIG. 1. A substrate (not illustrated), which may be any substrate typically used in OLEDs, may be a glass substrate or a transparent plastic substrate with mechanical strength, thermal stability, transparency, surface smoothness, ease of handling, and water resistance.

A first electrode may be formed by depositing or sputtering a first electrode material on the substrate. When the first electrode is an anode, the first electrode material may be a material with a high work function, thereby enabling easy hole injection. The first electrode may be a reflective electrode or a transmissive electrode. The first electrode material may be a transparent material with high conductivity, and non-limiting examples thereof include indium tin oxide (ITO), indium zinc oxide (IZO), tin oxide ($SnO_2$), and zinc oxide (ZnO). When magnesium (Mg), aluminum (Al), aluminum-lithium (Al—Li), calcium (Ca), magnesium-indium (Mg—In), magnesium-silver (Mg—Ag), or the like is used as the first electrode material, the first electrode may be a reflective electrode.

The first electrode may have a single-layer structure or a multi-layer structure including at least two layers. For example, the first electrode may have a three-layered structure of ITO/Ag/ITO, but is not limited thereto.

The organic layer may be disposed on the first electrode. The organic layer may include a HIL, a HTL, a buffer layer (not illustrated), an EML, an ETL, or an EIL.

An HIL may be formed on the first electrode by various methods, such as vacuum deposition, spin coating, casting, and Langmuir-Blodgett (LB) deposition. When the HIL is formed using vacuum deposition, the vacuum deposition conditions may vary depending on the compound used to form the HIL and the desired structure and thermal properties of the HIL to be formed. For example, the vacuum deposition may be performed at a temperature of about 100° C. to about 500° C., a pressure of about $10^8$ torr to about $10^{-3}$ torr, and a deposition rate of about 0.01 Å/sec to about 100 Å/sec. However, the deposition conditions are not limited thereto.

When the HIL is formed by spin coating, the coating conditions may vary depending on the compound used to form the HIL and the desired structure and thermal properties of the HIL to be formed. For example, the coating rate may be about 2,000 rpm to about 5,000 rpm, and the temperature at which heat treatment is performed to remove solvent after coating may be about 80° C. to about 200° C. However, the coating conditions are not limited thereto.

As a material for the HIL, any hole-injecting material may be used. Non-limiting examples of suitable hole-injection materials include N,N'-diphenyl-N,N'-bis-[4-(phenyl-m-tolyl-amino)-phenyl]-biphenyl-4,4'-diamine (DNTPD), phthalocyanine compounds such as copper phthalocyanine, m-MTDATA [4,4',4''-tris(3-methylphenylphenylamino)triphenylamine], 4,4',4''-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline/poly(4-styrenesulfonate) (PANI/PSS).

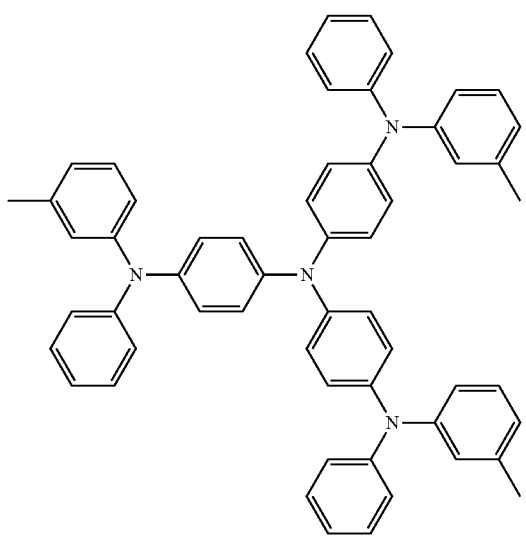

m-MTDATA

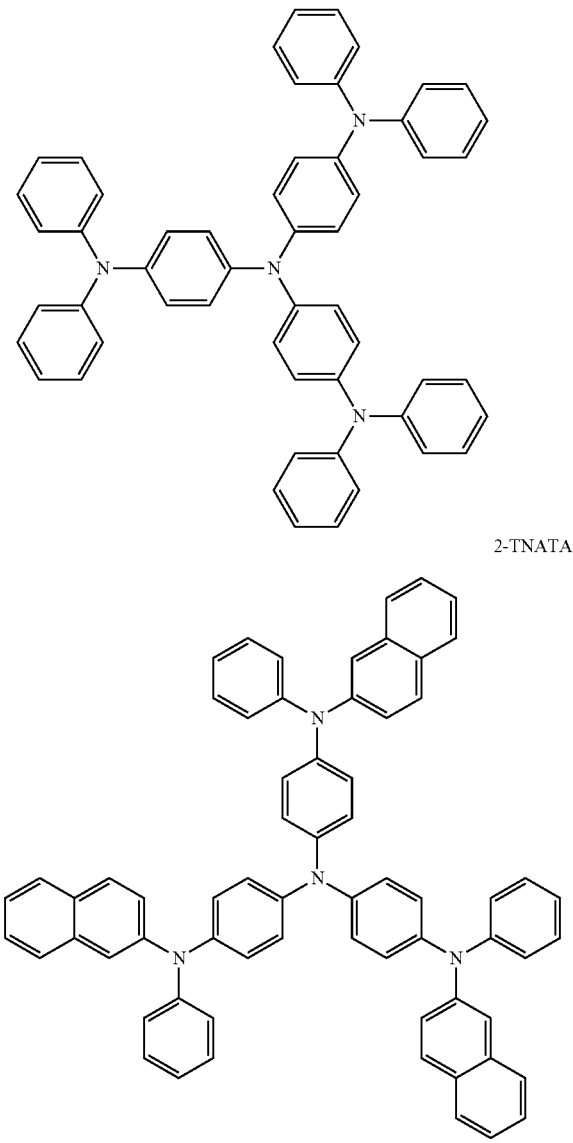

TDATA

2-TNATA

The thickness of the HIL may be about 100 Å to about 10,000 Å, for example, about 100 Å to about 1,000 Å. When the thickness of the HIL is within these ranges, the HIL may have satisfactory hole injection characteristics without a substantial increase in driving voltage.

Then, an HTL may be formed on the HIL by vacuum deposition, spin coating, casting, LB deposition, or the like. When the HTL is formed using vacuum deposition or spin coating, the deposition or coating conditions may be similar to those described above for the formation of the HIL, although the deposition or coating conditions may vary depending on the compound used to form the HTL.

As a material for the HTL, any hole-transporting material may be used. Non-limiting examples of suitable hole transporting materials include carbazole derivatives such as N-phenylcarbazole or polyvinylcarbazole, N,N'-bis(3-methylphenyl)-N,N-diphenyl-[1,1-biphenyl]-4,4'-diamine (TPD), 4,4',4''-tris(N-carbazolyl)triphenylamine) (TCTA), and N,N'-di(1-naphthyl)-N,N'-diphenylbenzidine (NPB).

TPD

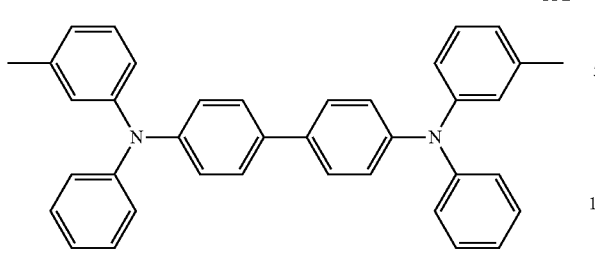

NPB

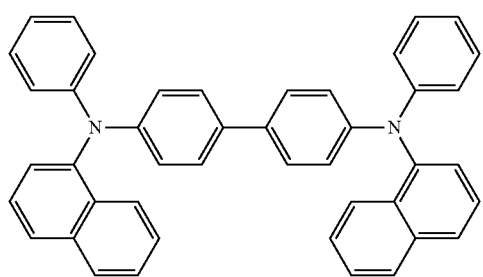

The thickness of the HTL may be about 50 Å to about 2,000 Å, for example, about 100 Å to about 1,500 Å. When the thickness of the HTL is within these ranges, the HTL may have satisfactory hole transport characteristics without a substantial increase in a driving voltage.

The H-functional layer (i.e., a functional layer having both hole injection and hole transport capabilities) may include one or more of the above-described materials for the HIL and the HTL. The thickness of the H-functional layer may be about 500 Å to about 10,000 Å, for example, about 100 Å to about 1,000 Å. When the thickness of the H-functional layer is within these ranges, the H-functional layer may have satisfactory hole injection and transport characteristics without a substantial increase in driving voltage.

In some embodiments, at least one of the HIL, the HTL, and the H-functional layer may include at least one compound represented by Formula 300 or Formula 350.

Formula 300

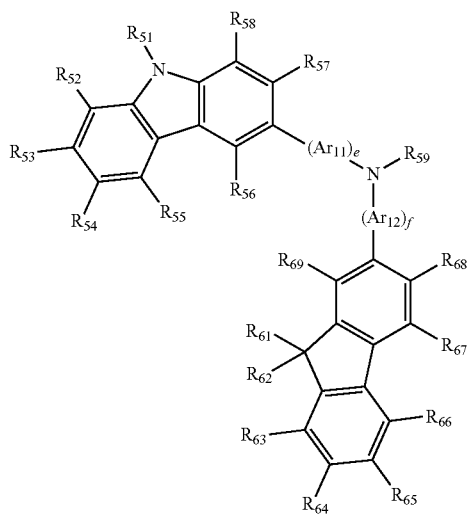

Formula 350

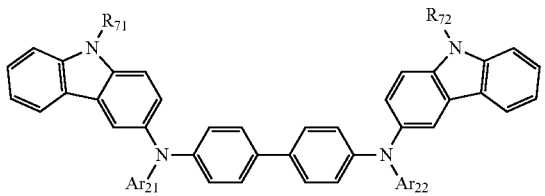

$Ar_{11}$, $Ar_{12}$, $Ar_{21}$, and $Ar_{22}$ in Formulas 300 and 350 may each independently be a substituted or unsubstituted $C_5$-$C_{60}$ arylene group.

e and f in Formula 300 may each independently be an integer from 0 to 5, for example, 0, 1, or 2. In some embodiments, e may be 1 and f may be 0, but Formula 300 is not limited thereto.

$R_{51}$ to $R_{58}$, $R_{61}$ to $R_{69}$, $R_{71}$, and $R_{72}$ in Formulas 300 and 350 may each independently be a hydrogen atom, a deuterium atom, a halogen group, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. For example, $R_{51}$ to $R_{58}$, $R_{61}$ to $R_{69}$, $R_{71}$, and $R_{72}$ may each independently be:

a hydrogen atom; a deuterium atom; a halogen atom; a hydroxyl group; a cyano group; a nitro group; an amino group; an amidino group; a hydrazine; a hydrazone; a carboxyl group or a salt thereof; a sulfonic acid or a salt thereof; a phosphoric acid or a salt thereof; a $C_1$-$C_{10}$ alkyl group (e.g., a methyl group, an ethyl group, a propyl group, a butyl group, a pentyl group, a hexyl group, or the like); a $C_1$-$C_{10}$ alkoxy group (e.g., a methoxy group, an ethoxy group, a propoxy group, a butoxy group, a pentoxy group, or the like); or a $C_1$-$C_{10}$ alkyl group or a $C_1$-$C_{10}$ alkoxy group substituted with at least one of a deuterium atom, a halogen group, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof; or a phenyl group; a naphthyl group; an anthryl group; a fluorenyl group; a pyrenyl group; or a phenyl group, a naphthyl group, an anthryl group, a fluorenyl group, or a pyrenyl group substituted with at least one of a deuterium atom, a halogen group, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, or a $C_1$-$C_{10}$ alkoxy group. However, $R_{51}$ to $R_{58}$, $R_{61}$ to $R_{69}$, $R_{71}$, and $R_{72}$ are not limited thereto.

$R_{59}$ in Formula 300 may be:

a phenyl group; a naphthyl group; an anthryl group; a biphenyl group; a pyridyl group; or a phenyl group, a naphthyl group, an anthryl group, a biphenyl group, or a pyridyl group substituted with at least one of a deuterium atom, a halogen group, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{20}$ alkyl group, or a substituted or unsubstituted $C_1$-$C_{20}$ alkoxy group.

In some embodiments, the compound of Formula 300 may be represented by Formula 300A below, but the Formula 300 is not limited thereto.

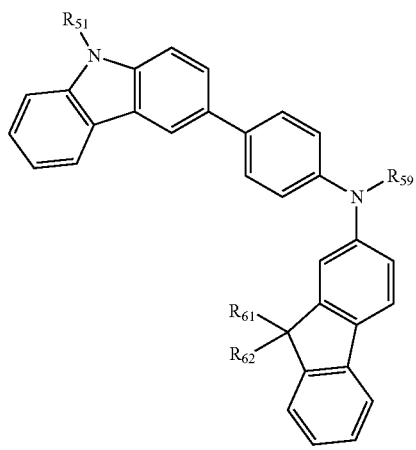

Formula 300A $R_{51}$, $R_{59}$, $R_{61}$, and $R_{62}$ in Formula 300A are as described above with respect to Formula 300.

For example, at least one of the HIL, HTL, and the H-functional layer may include at least one of the following Compounds 301 to 320, but the HIL, HTL and H-functional layers are not limited thereto.

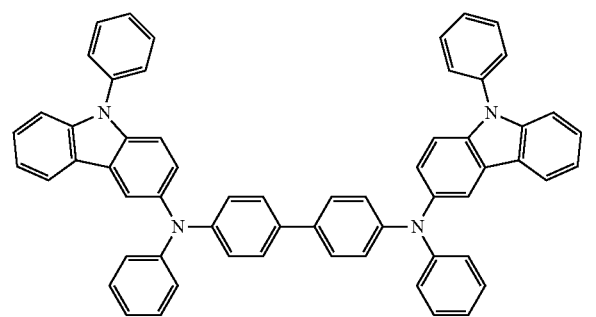

301

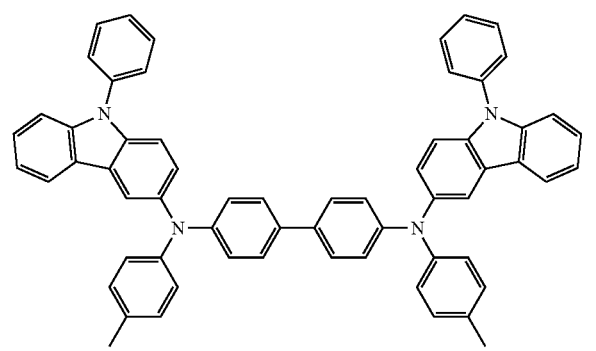

302

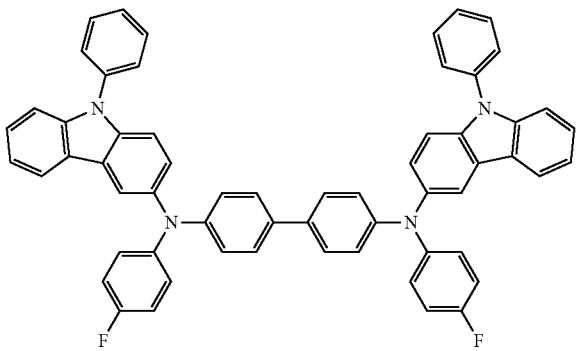

303

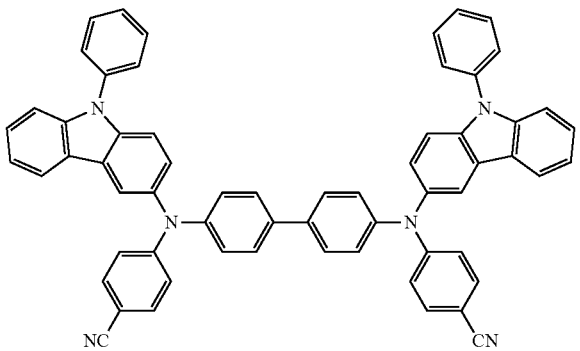

304

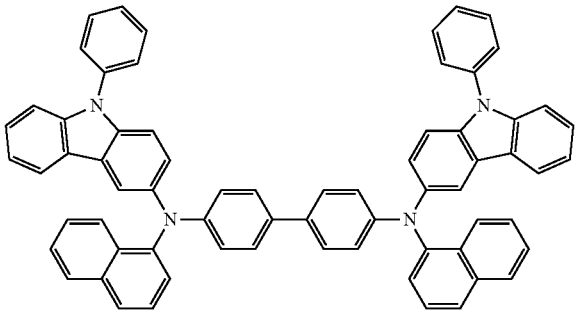

305

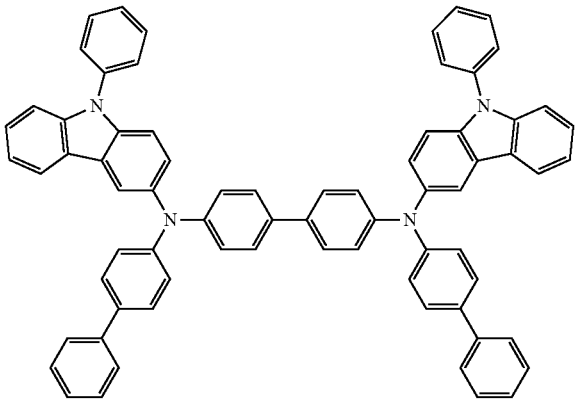

306

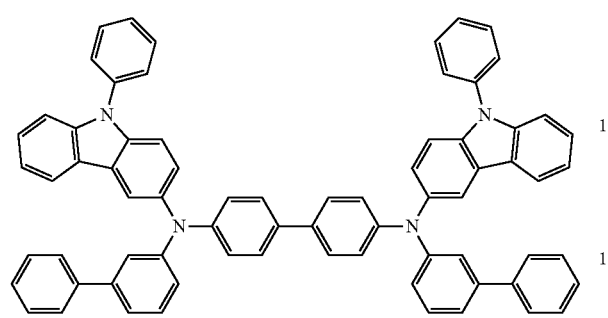
307
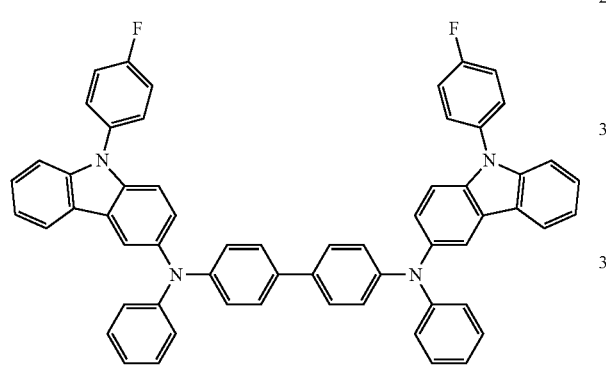
308
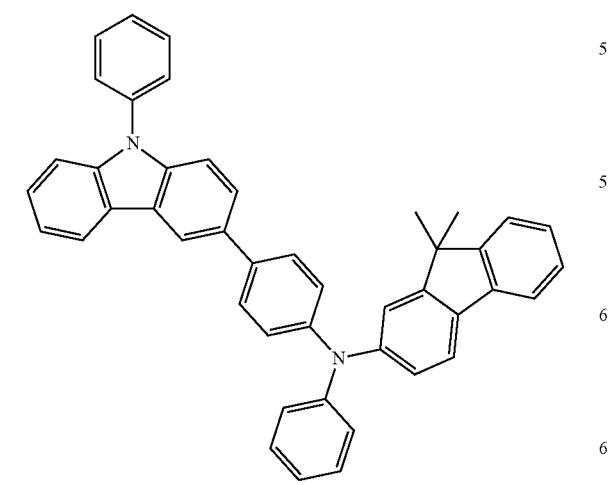
309
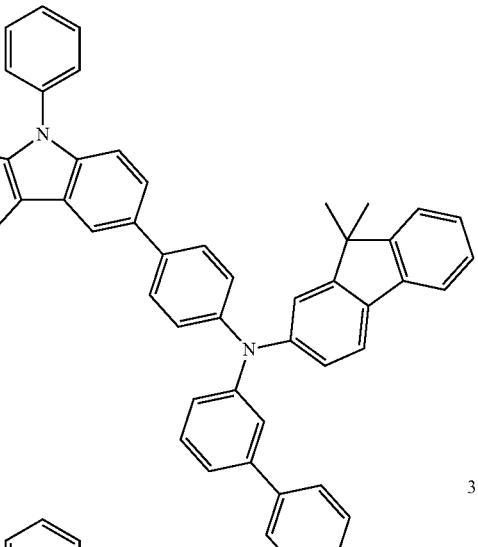
310
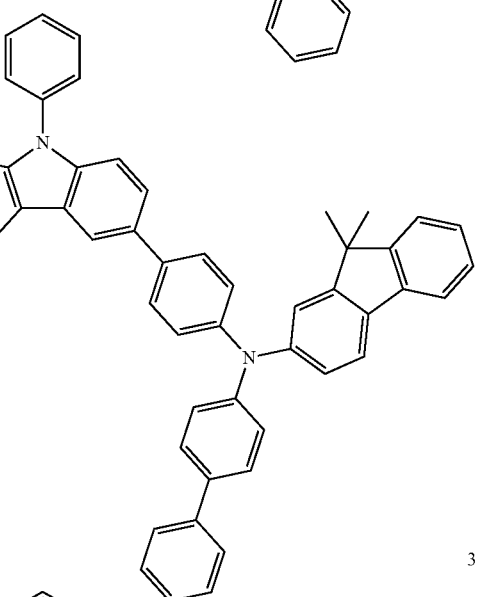
311
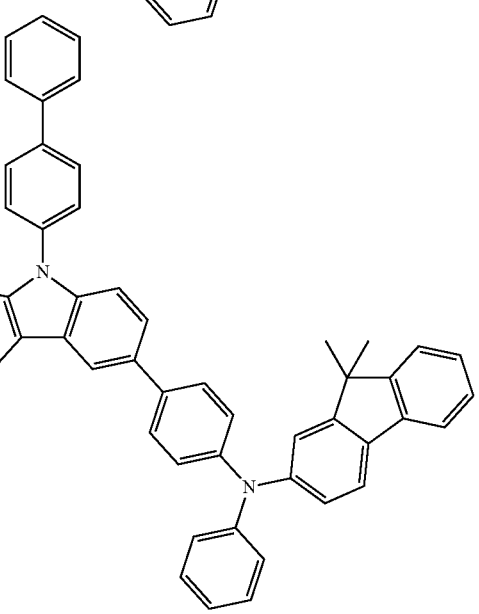
312

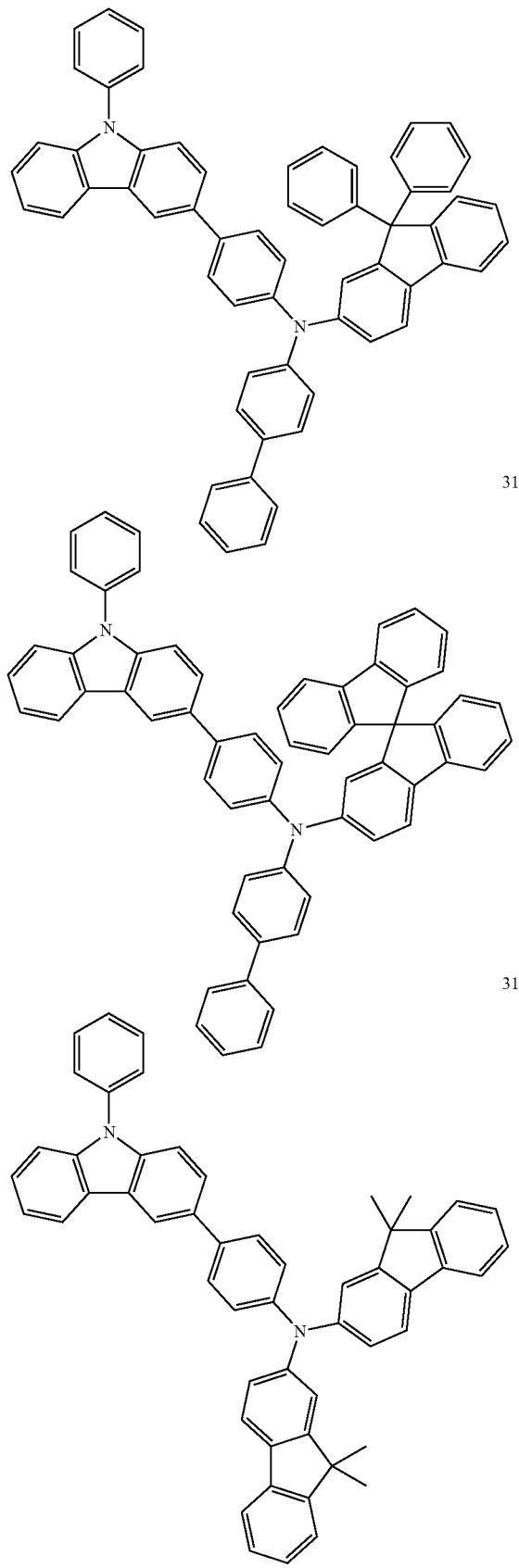
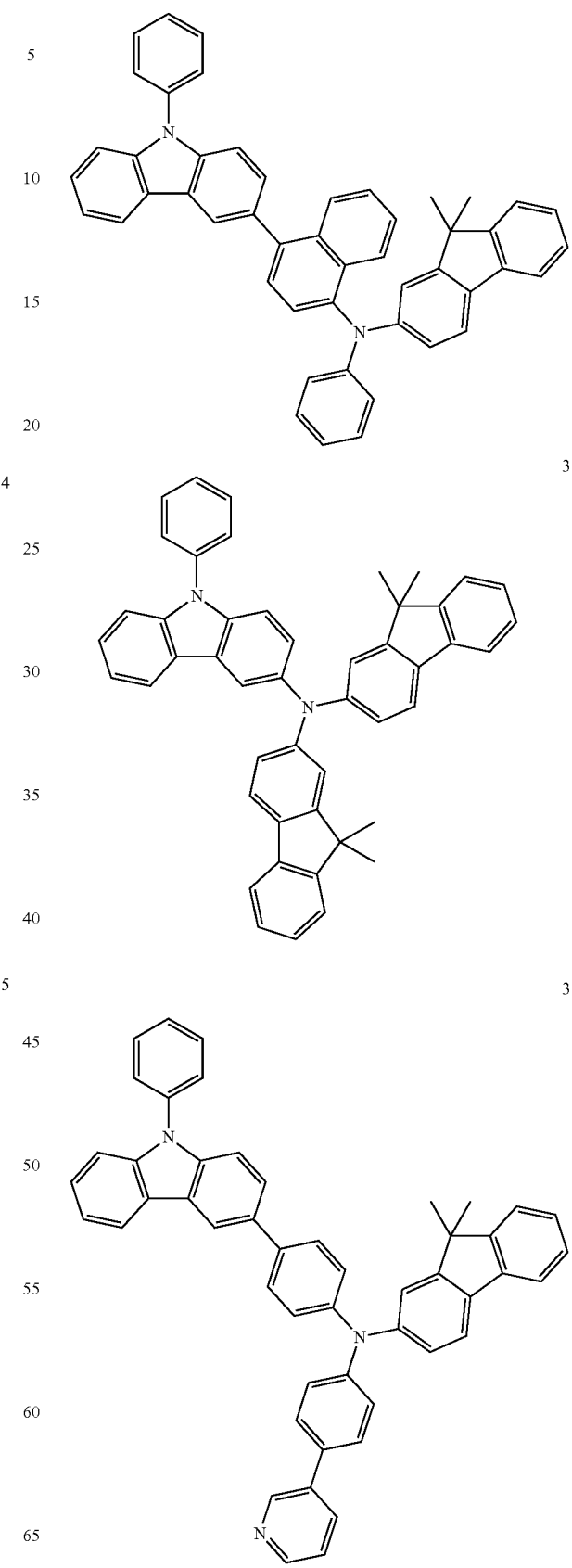

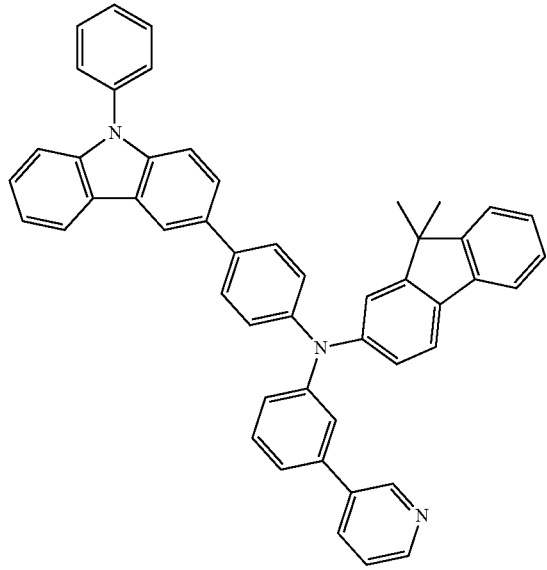

319

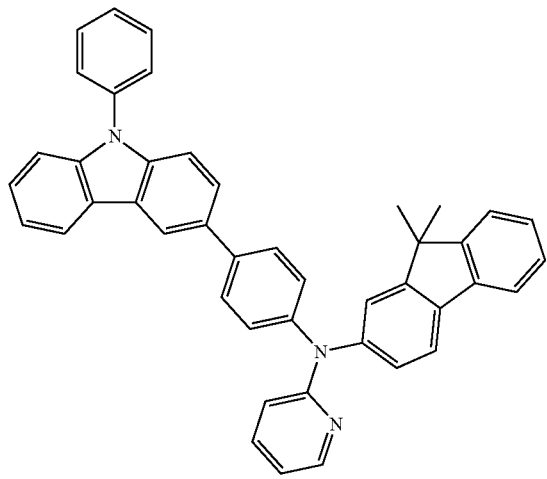

320

In order to improve conductivity of the film, at least one of the HIL, HTL, and the H-functional layer may further include a charge-generating material in addition to the hole-injecting material, hole-transporting material, and/or H-functional material having both hole injection and hole transport capabilities.

The charge-generating material may be, for example, a p-dopant. The p-dopant may be a quinone derivative, a metallic oxide, or a cyano group-containing compound, but is not limited thereto. Non-limiting examples of the p-dopant include quinone derivatives such as tetracyanoquinodimethane (TCNQ) and 2,3,5,6-tetrafluoro-tetracyano-1,4-benzoquinodimethane (F4-TCNQ); metallic oxides such as tungsten oxides and molybdenum oxides; and cyano group-containing compounds such as Compound 200 below, but the p-dopant is not limited thereto.

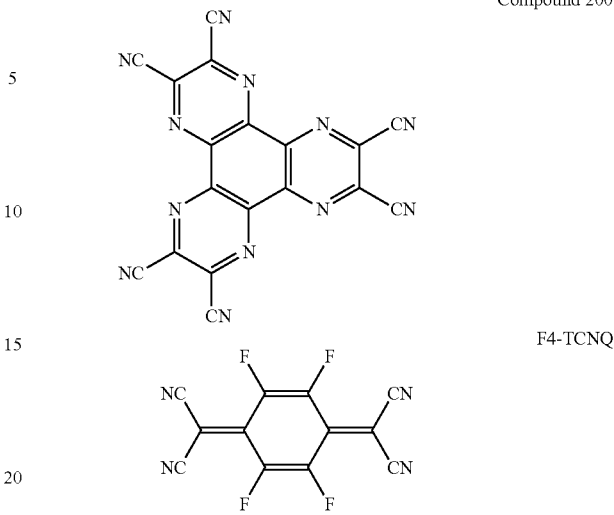

Compound 200

F4-TCNQ

When the HIL, the HTL, or the H-functional layer further includes the charge-generating material, various modifications may be possible, for example, the charge-generating material may be homogeneously dispersed or non-homogeneously distributed in the layers.

A buffer layer may be disposed between the EML and at least one of the HIL, HTL, and the H-functional layer. The buffer layer may compensate for an optical resonance distance of light according to a wavelength of the light emitted from the EML, and thus may increase efficiency. The buffer layer may include any hole injecting material or hole transporting material. In some other embodiments, the buffer layer may include the same material as one of the materials included in the HIL, the HTL, and the H-functional layer that underlie the buffer layer.

Then, an EML may be formed on the HIL, the H-functional layer, or the buffer layer by vacuum deposition, spin coating, casting, LB deposition, or the like. When the EML is formed using vacuum deposition or spin coating, the deposition or coating conditions may be similar to those described above for the formation of the HIL, although the conditions for deposition or coating may vary depending on the material used to form the EML.

The EML may include a compound according to an embodiment of the present invention. For example, the compound of Formula 1 or Formula 2 may be used as a host, and the metallic complex may be used as a dopant. In addition to the compound of Formula 1 or Formula 2, the EML may include a variety of light-emitting materials, for example, a host and a dopant. In regard to the dopant, both fluorescent dopants and phosphorescent dopants may be used.

In some embodiments, the metallic complex may be a phosphorescent dopant and may include an Ir, Pt, Pd, or Os complex, which will be described later. In some embodiments, for example, the metallic complex may include a Pt, Pd, or Os complex.

Non-limiting examples of the host include $Alq_3$, 4,4'-N,N'-dicarbazole-biphenyl (CBP), poly(n-vinylcarbazole) (PVK), 9,10-di(naphthylene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, distyrylarylene (DSA), dmCBP (see Formula below), and Compounds 501 to 509 below.

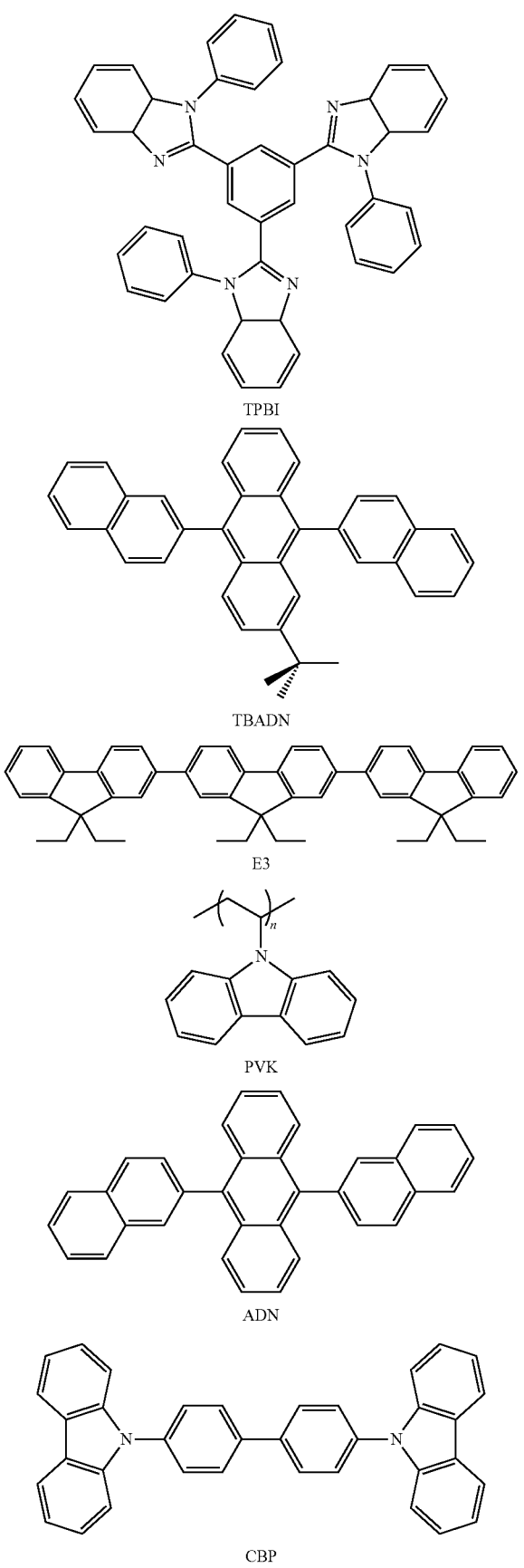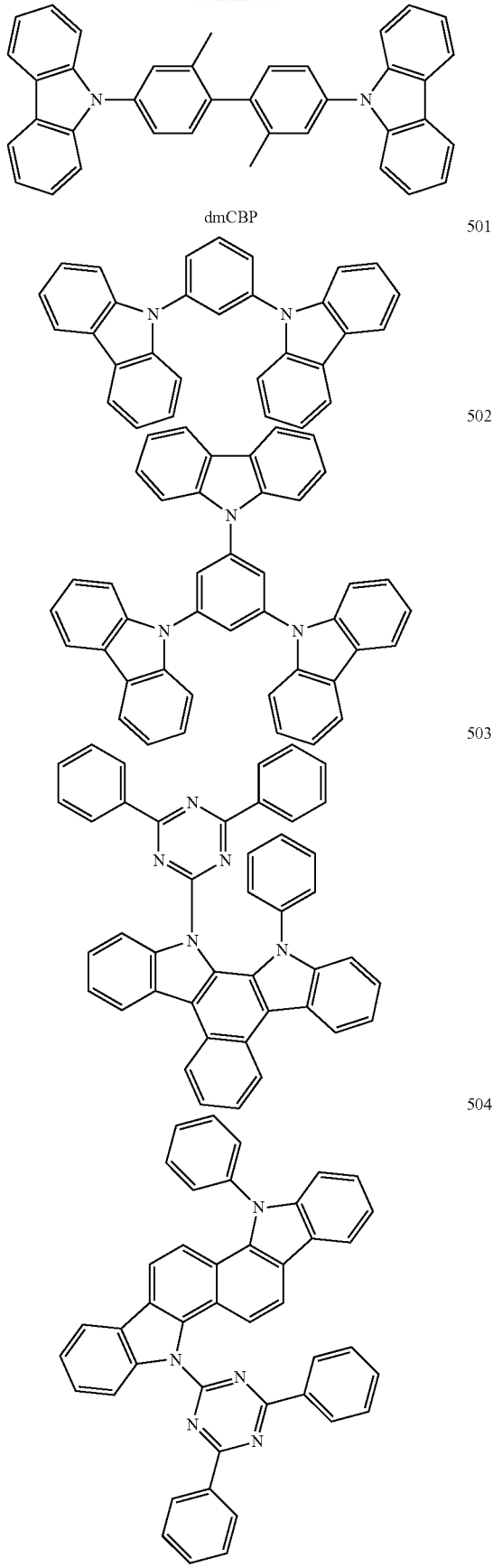

-continued

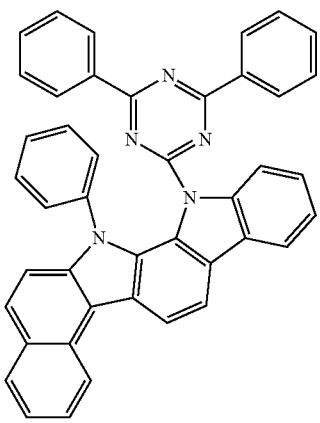
505

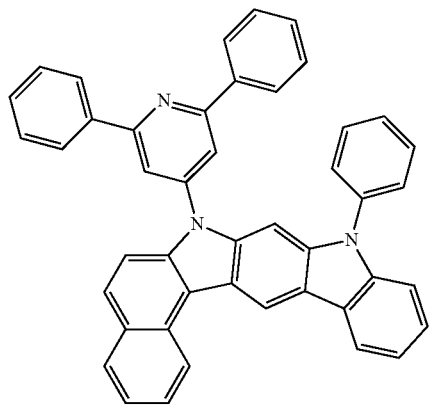
506

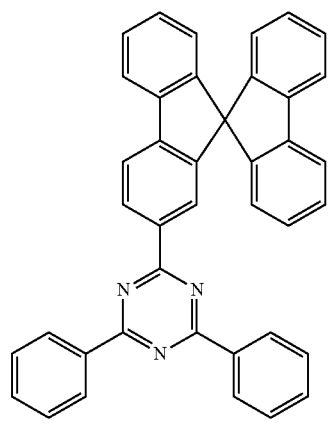
507

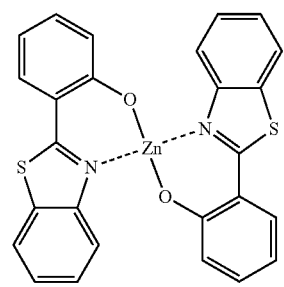
508

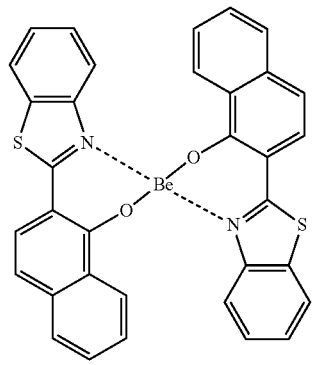
509

In some embodiments, an anthracene based compound represented by Formula 400 below may be used as the host.

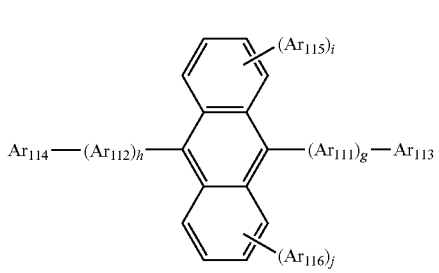

Formula 400

In Formula 400, $Ar_{111}$ and $Ar_{12}$ may each independently be a substituted or unsubstituted $C_5$-$C_{60}$ arylene group. $Ar_{113}$ to $A_{r116}$ may each independently be a substituted or unsubstituted $C_1$-$C_{10}$ alkyl group or a substituted or unsubstituted $C_5$-$C_{60}$ aryl group. g, h, l, and j may each independently be an integer from 0 to 4.

For example, $Ar_{111}$ and $Ar_{112}$ in Formula 400 may each independently be:

a phenylene group, a naphthylene group, a phenanthrenylene group, or a pyrenylene group; or a phenylene group, a naphthylene group, a phenanthrenylene group, or a pyrenylene group substituted with at least one of a phenyl group, a naphthyl group, or an anthryl group. However, $Ar_{111}$ and $Ar_{112}$ are not limited thereto.

g, h, i, and j in Formula 400 may each independently be 0, 1, or 2.

$Ar_{113}$ to $Ar_{116}$ in Formula 400 may each independently be:

a $C_1$-$C_{10}$ alkyl group substituted with at least one of a phenyl group, a naphthyl group, or an anthryl group; or a phenyl group; a naphthyl group; an anthryl group; a pyrenyl group; a phenanthrenyl group; a fluorenyl group; or a phenyl group, a naphthyl group, an anthryl group, a pyrenyl group, a phenanthrenyl group, or a fluorenyl group substituted with at least one of a deuterium atom, a halogen group, a hydroxyl group, a cyano group, a nitro group, an amino group, an amidino group, a hydrazine, a hydrazone, a carboxyl group or a salt thereof, a sulfonic add group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; or

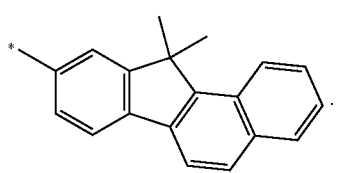 [SMILES: Cc1ccc2c(c1)C(C)(C)c1c-2ccc2ccccc12]
However, Ar<sub>113</sub> to Ar<sub>116</sub> are not limited thereto.
For example, the anthracene-based compound represented by Formula 400 above may be one of the following compounds below, but is not limited thereto,
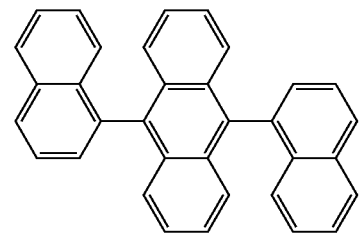
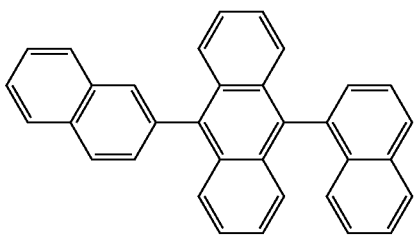
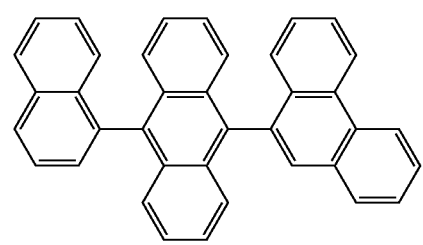
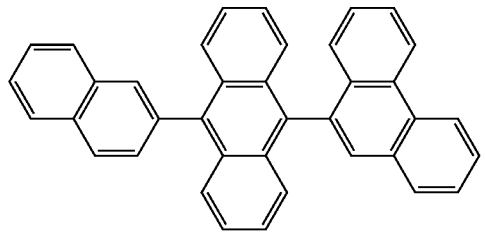
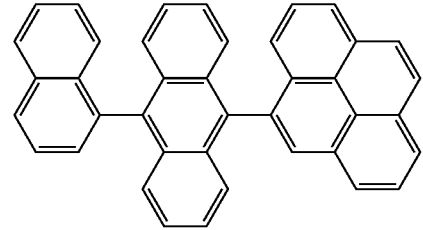
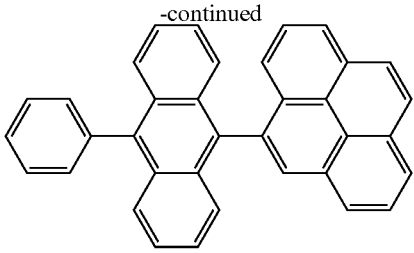
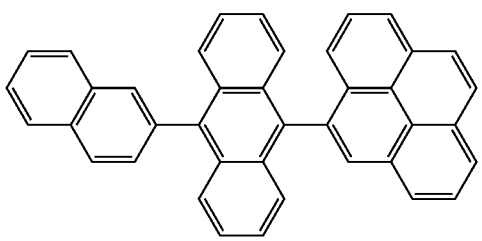
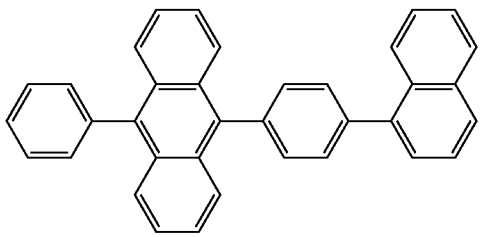
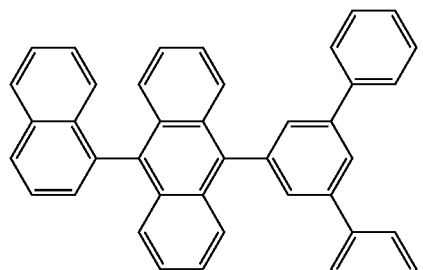
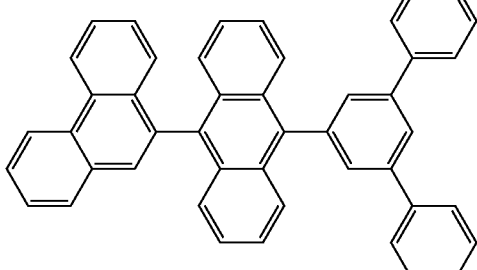
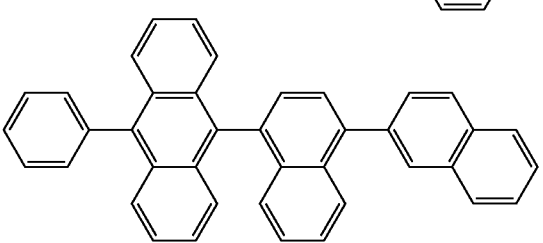

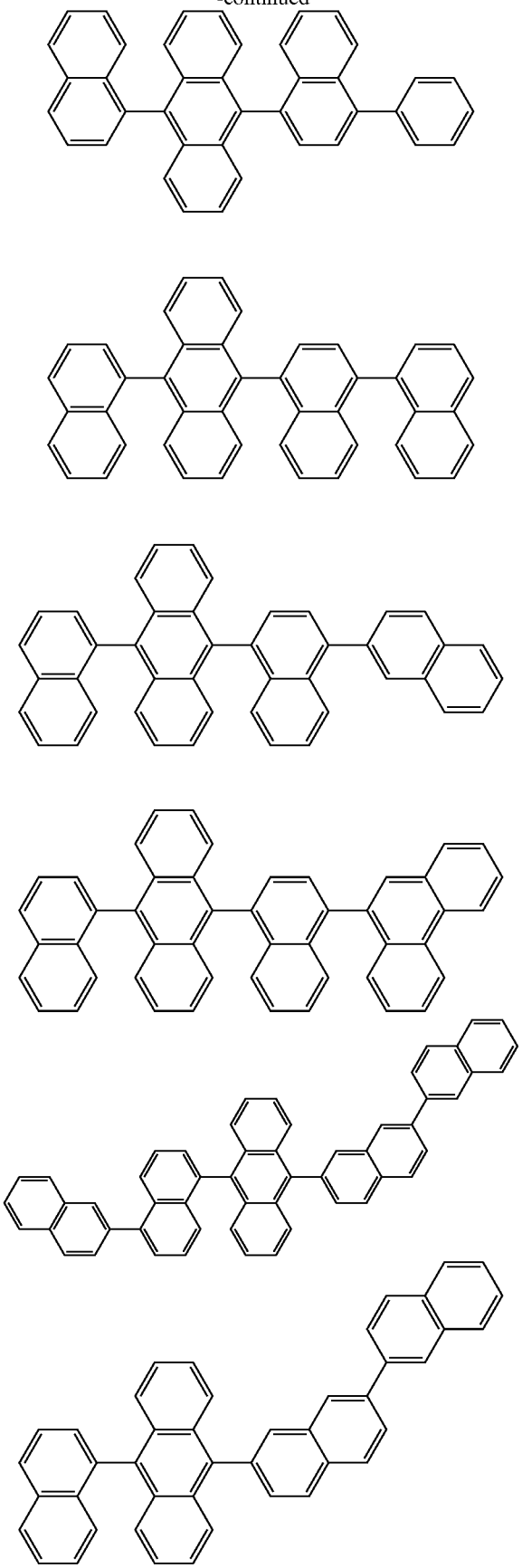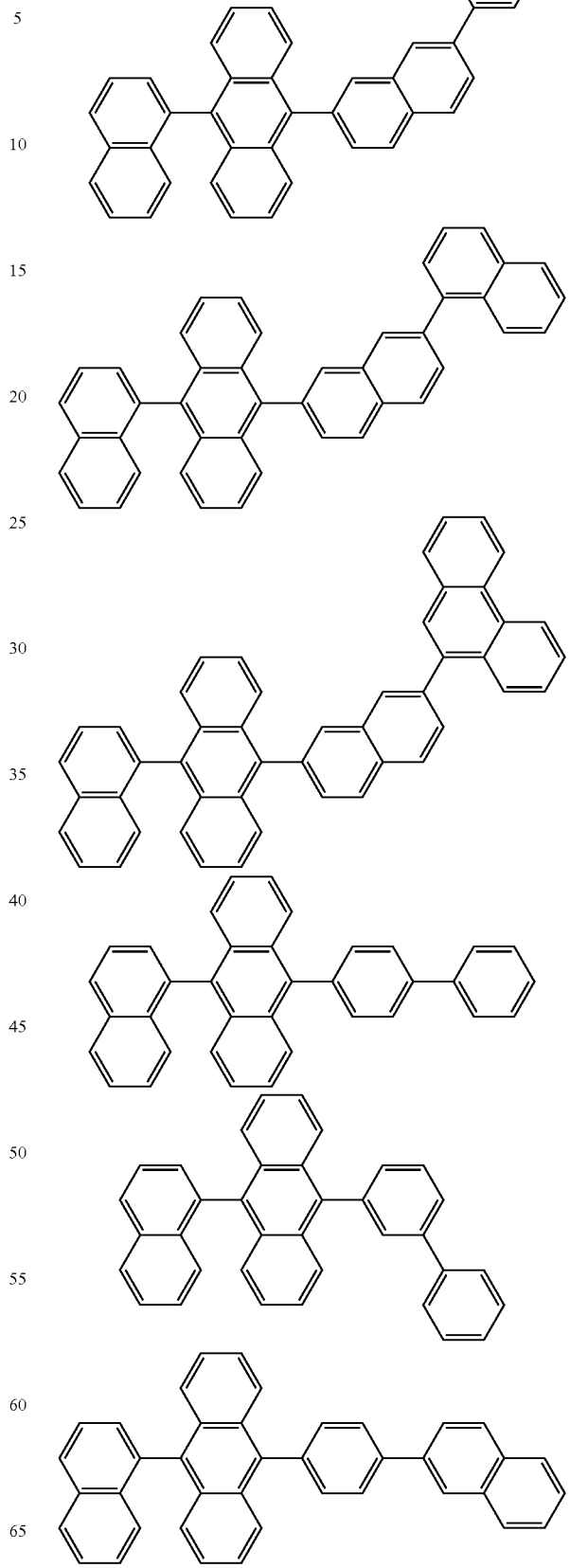

51
-continued
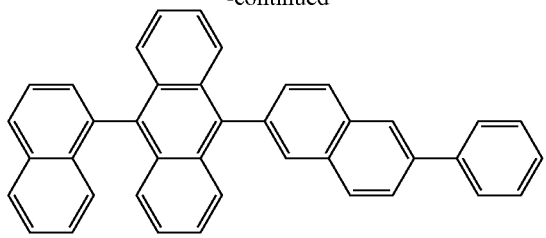
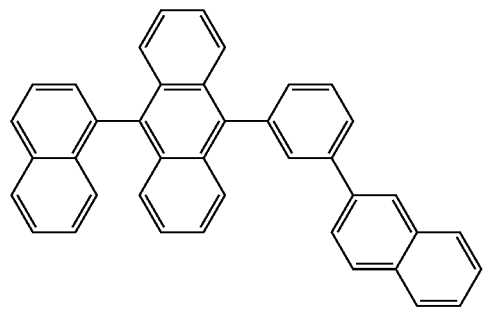
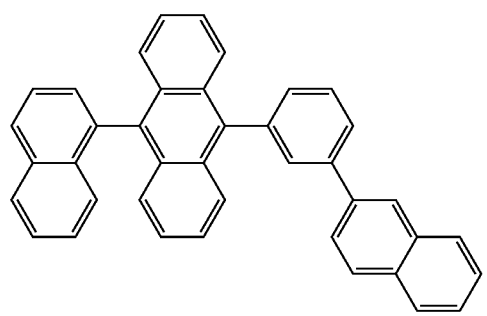
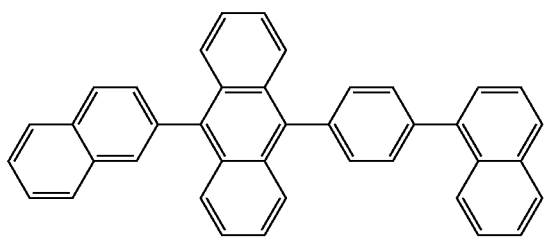
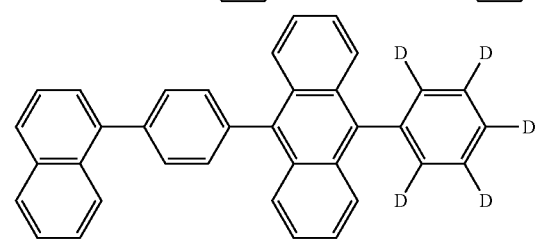
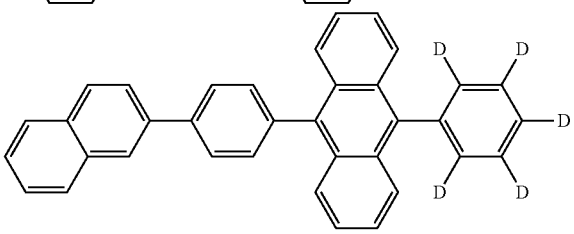
52
-continued
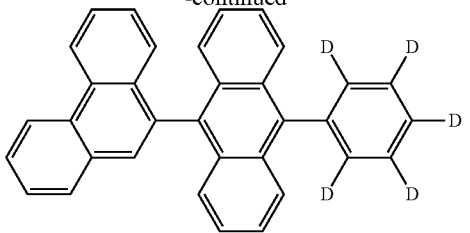
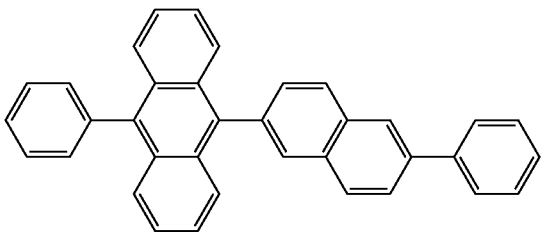
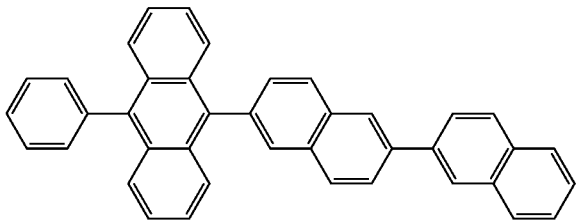
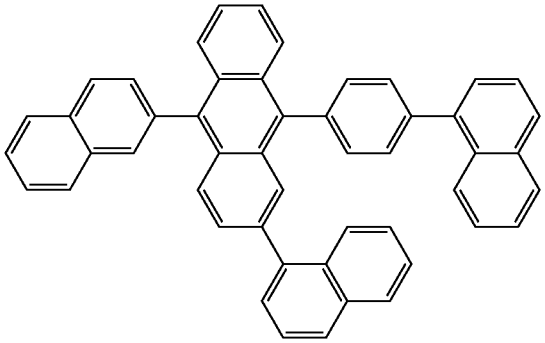
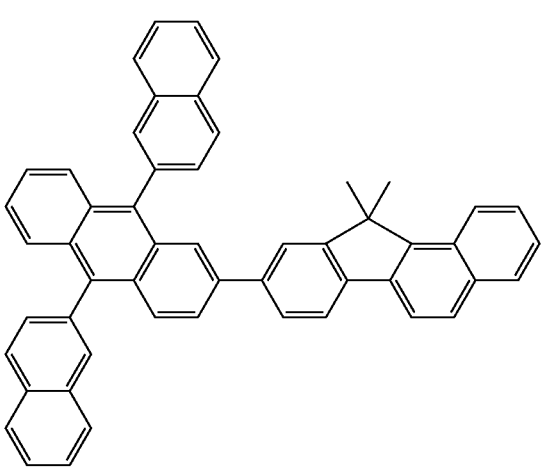

-continued

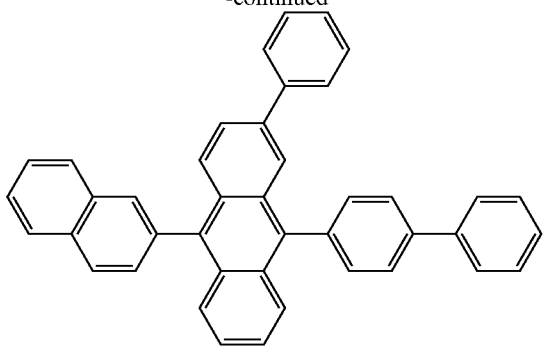

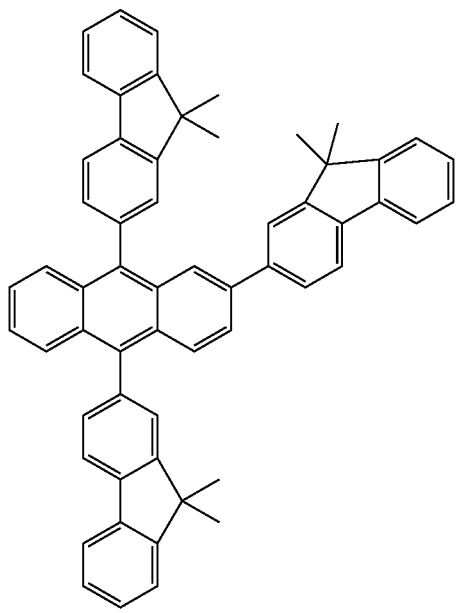

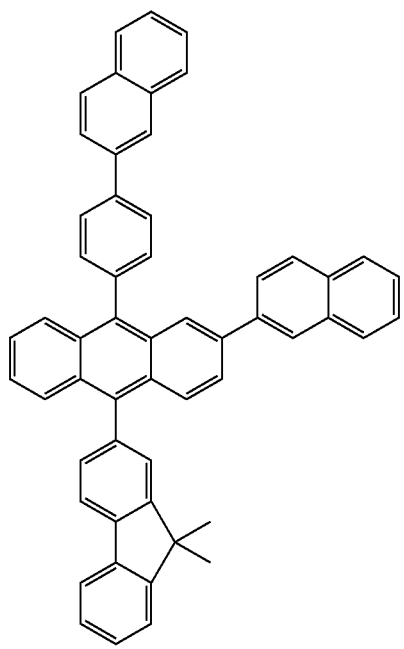

-continued

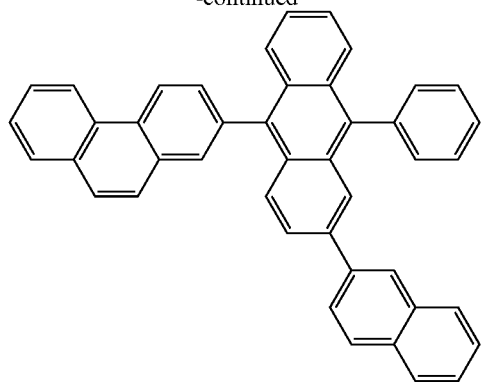

In some embodiments, an anthracene-based compound represented by Formula 401 below may be used as the host.

Formula 401

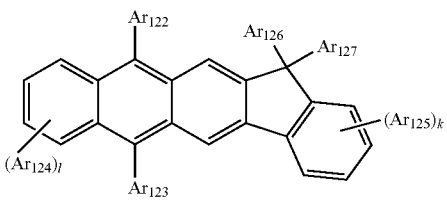

$Ar_{122}$ to $Ar_{125}$ in Formula 401 are as described above with respect to $Ar_{113}$ in Formula 400.

$Ar_{126}$ and $Ar_{127}$ in Formula 401 may each independently be a $C_1$-$C_{10}$ alkyl group (e.g., a methyl group, an ethyl group, or a propyl group).

k and l in Formula 401 may each independently be an integer of 0 to 4. For example, k and l may be 0, 1, or 2.

In some embodiments, the anthracene-based compound represented by Formula 401 may be one of the following compounds, but Formula 401 is not limited thereto.

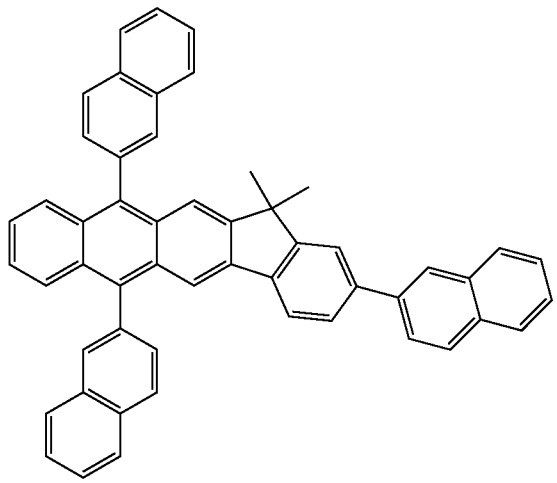

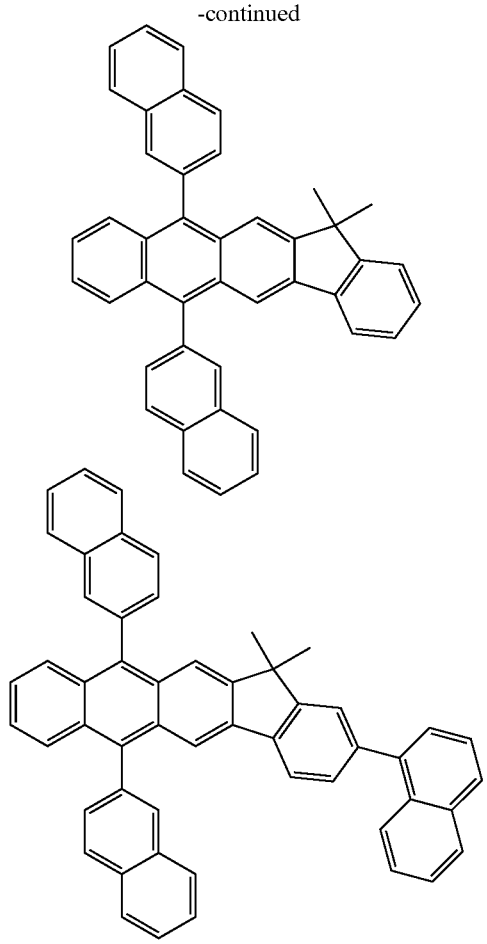
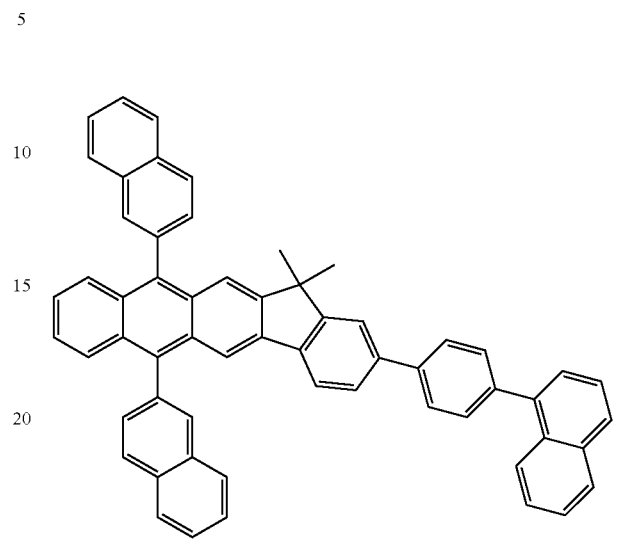
When the OLED is a full color OLED, the EML may be patterned into a red layer, a green layer, and a blue layer.
At least one of the red layer, the green layer, and the blue layer may include one of the following dopants below (here, ppy refers to phenylpyridine).
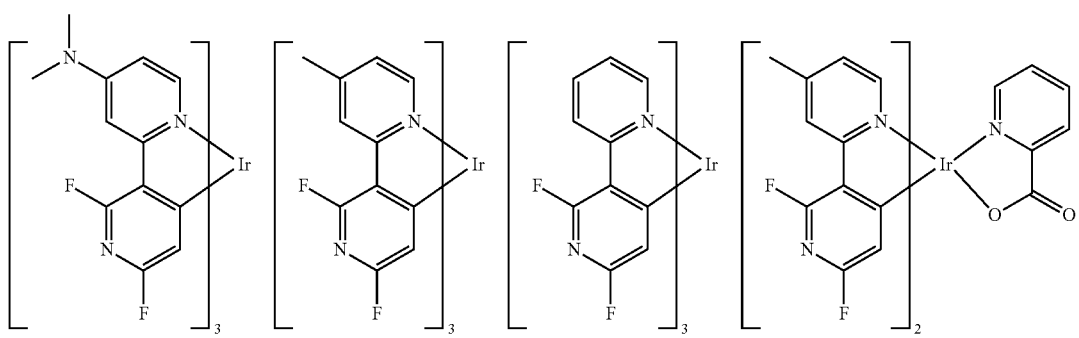
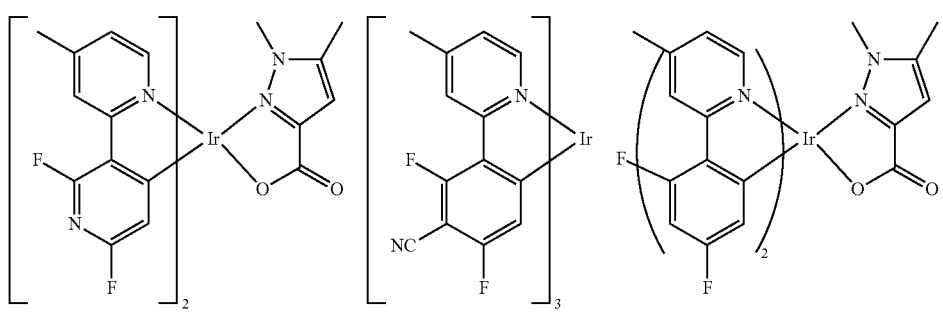

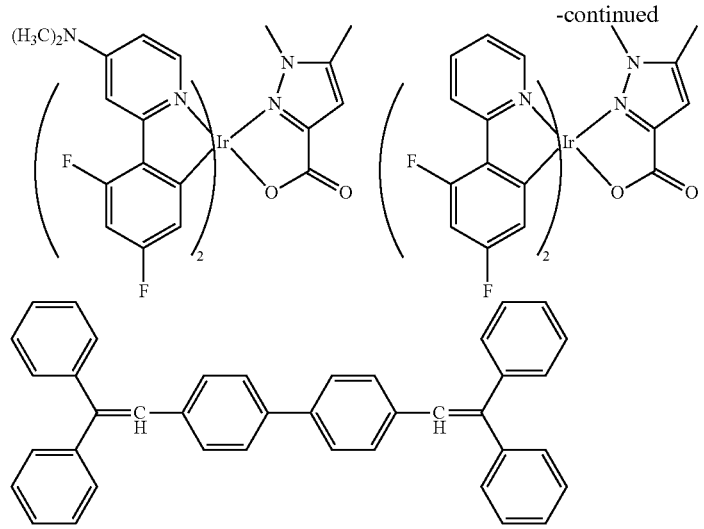
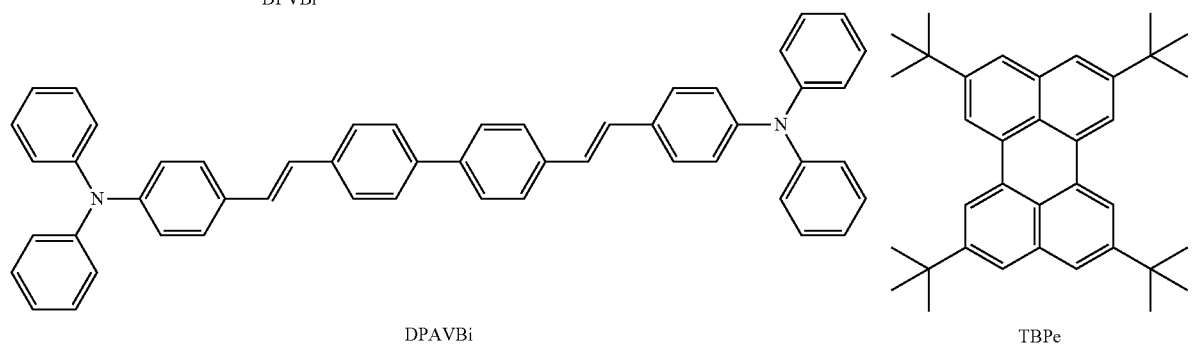
DPVBi
DPAVBi
TBPe
For example, non-limiting examples of the red dopant include the following compounds.
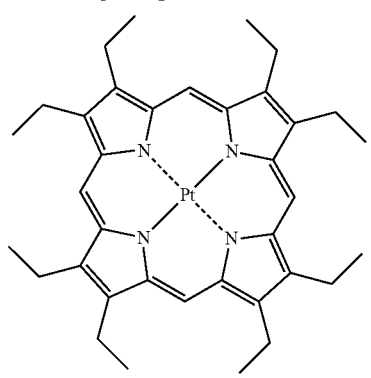
PtOEP
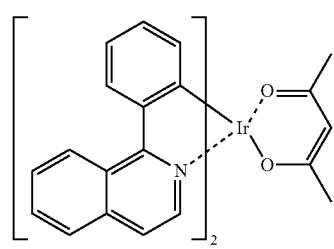
-continued
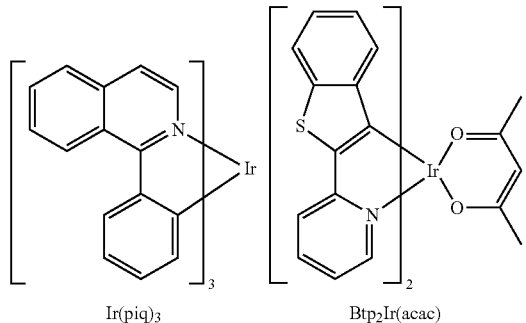
Ir(piq)₃   Btp₂Ir(acac)
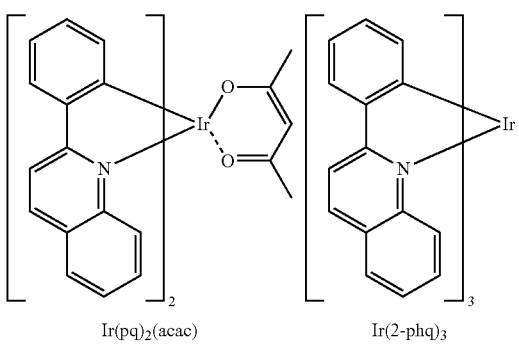
Ir(pq)₂(acac)   Ir(2-phq)₃

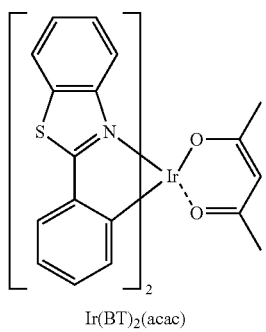
Ir(BT)₂(acac)
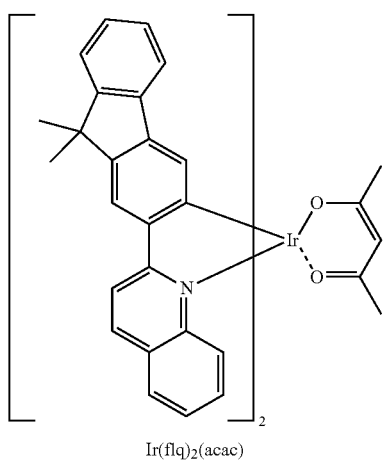
Ir(flq)₂(acac)
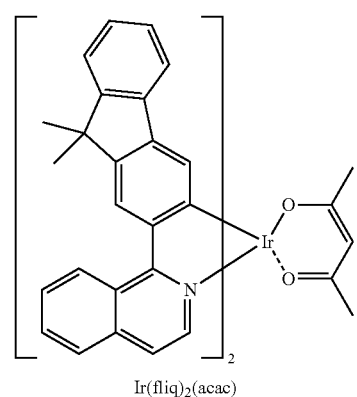
Ir(fliq)₂(acac)
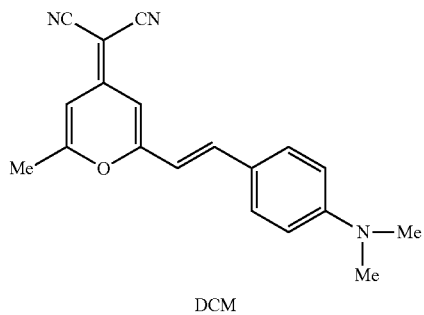
DCM
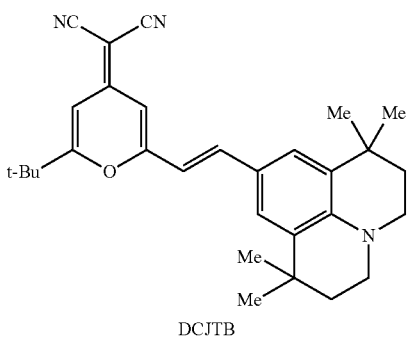
DCJTB
For example, non-limiting examples of the green dopant include the following compounds.
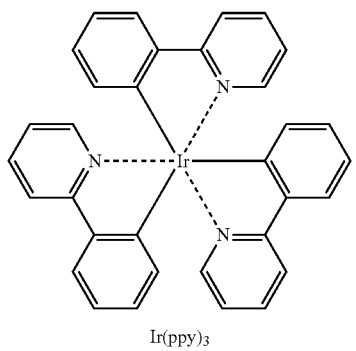
Ir(ppy)₃
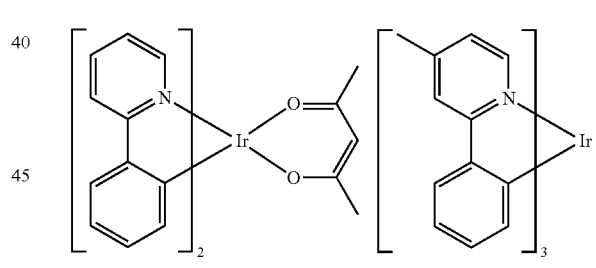
Ir(ppy)₂(acac)    Ir(mpyp)₃
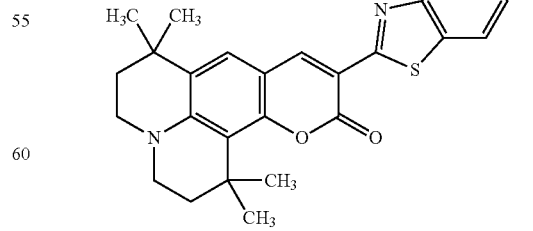
C545T
Non-limiting examples of dopants that may be used in the EML include Pd-complexes or Pt-complexes represented by Compounds D1 through D50 below.

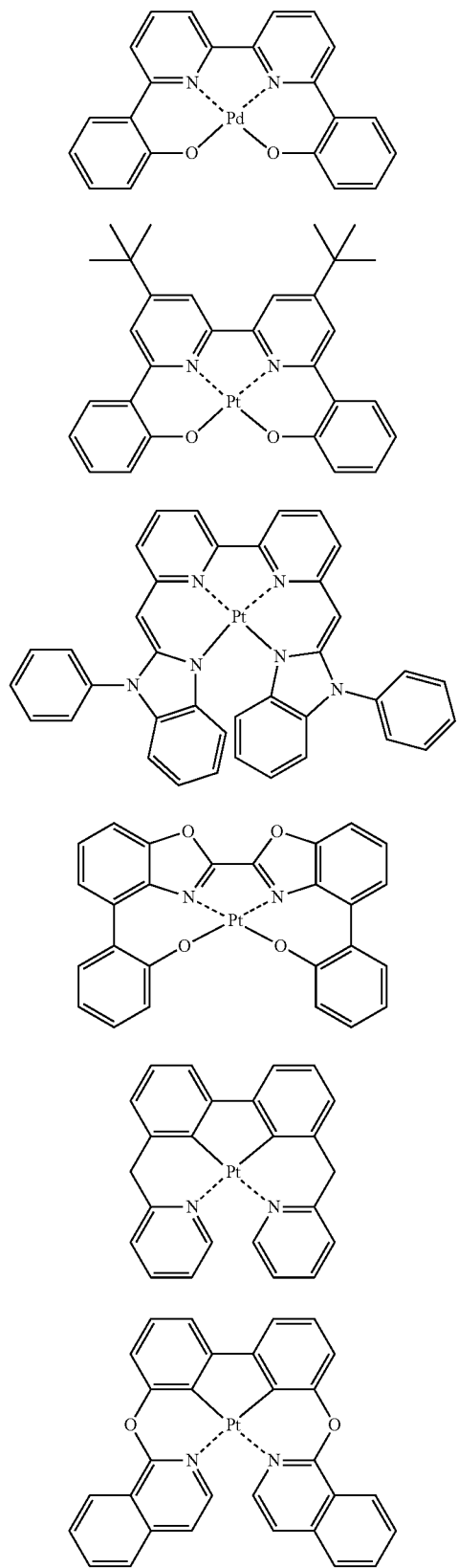
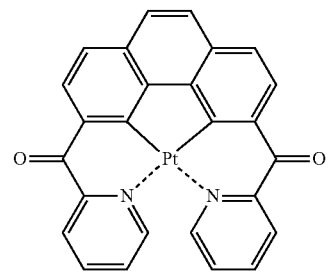
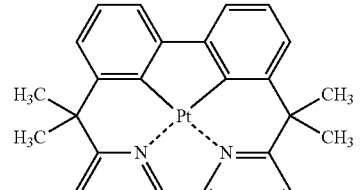
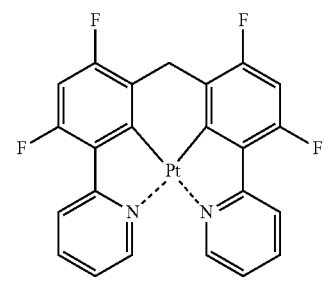
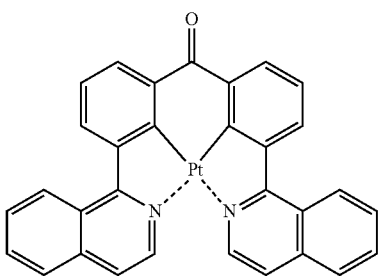
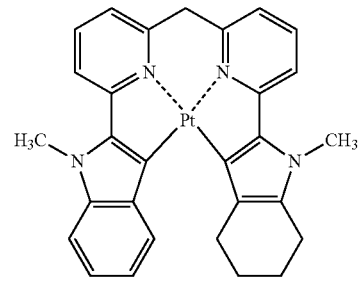
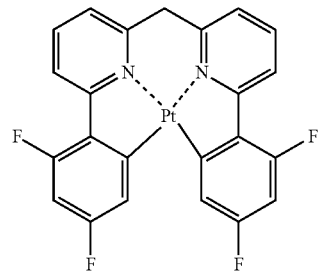

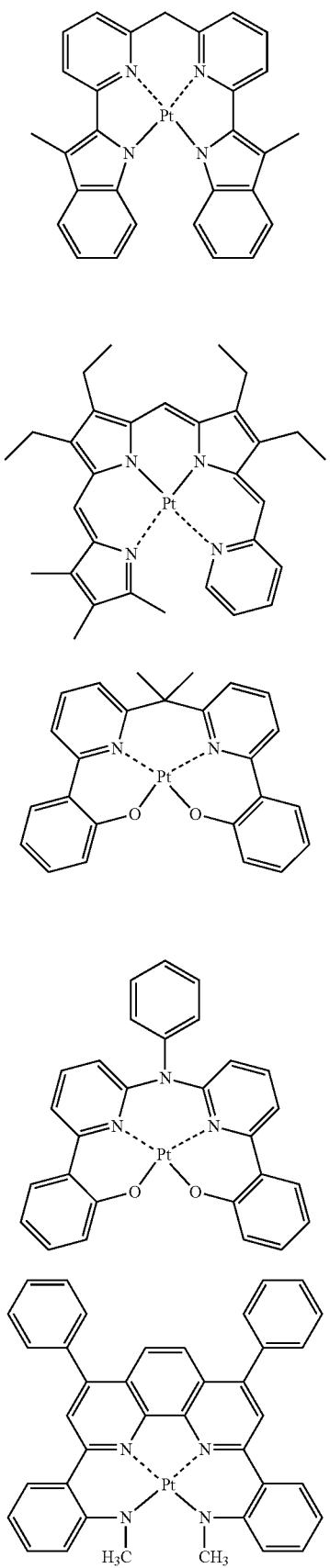
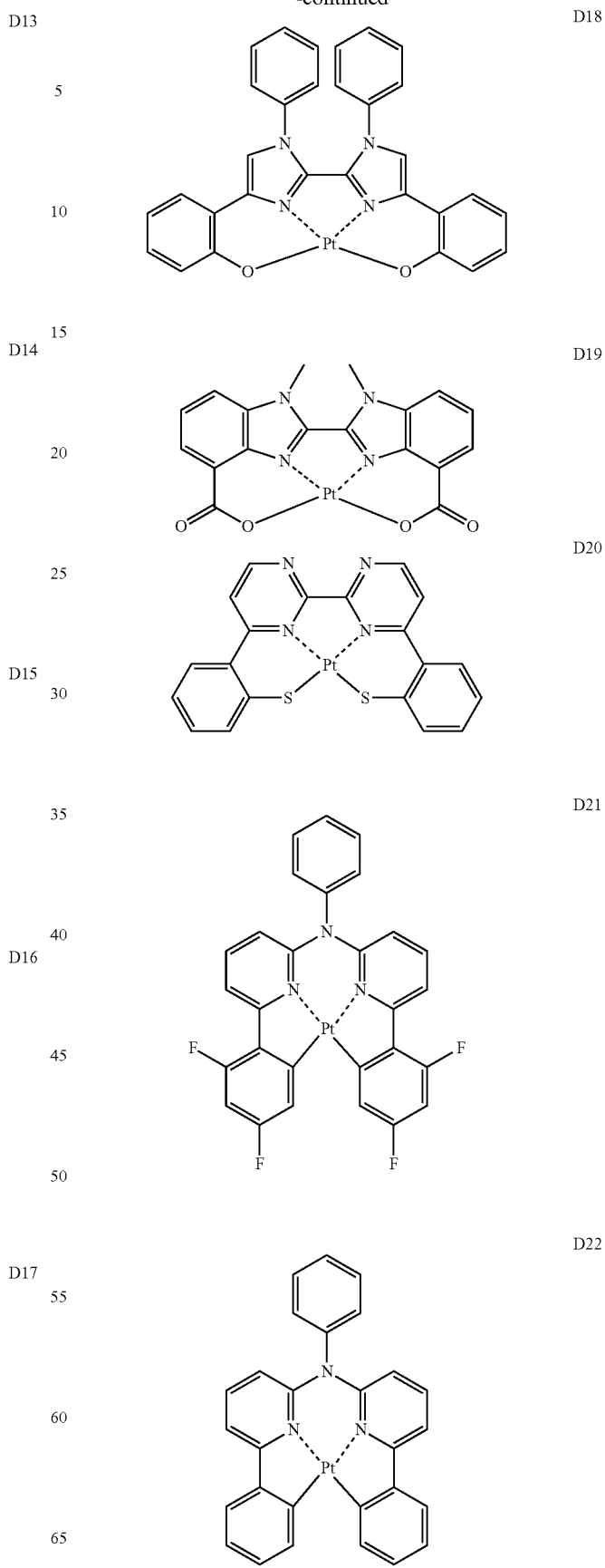

D23 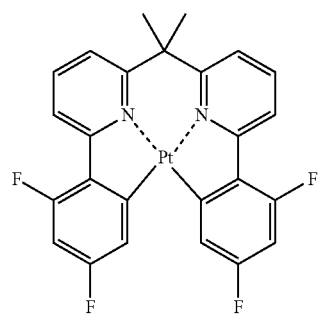
D24 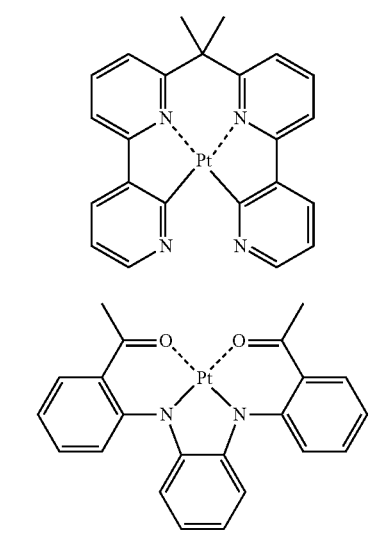
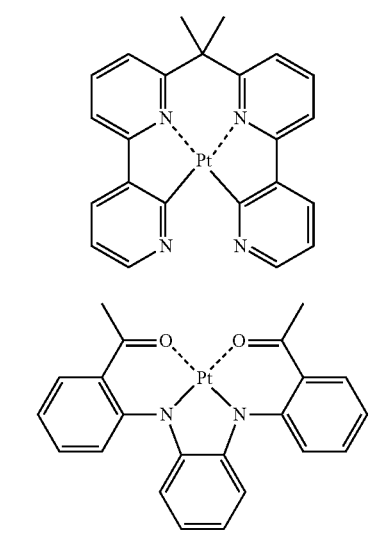
D25 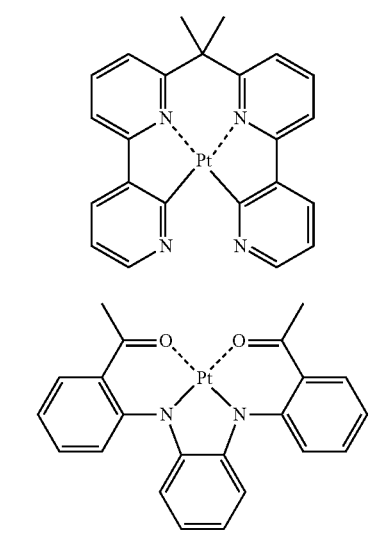
D26 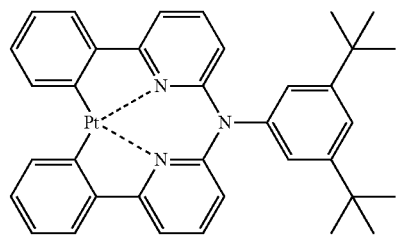
D27 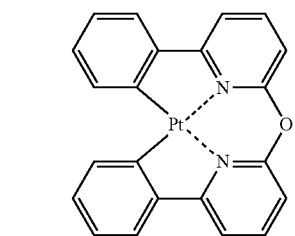
D28 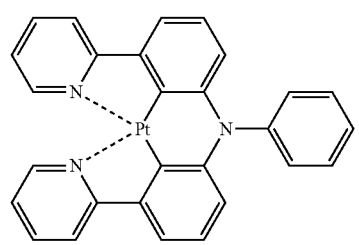
D29 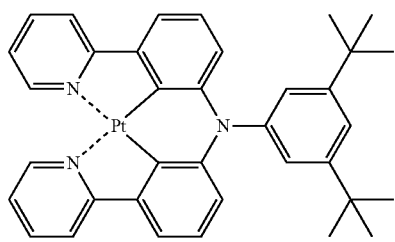
D30 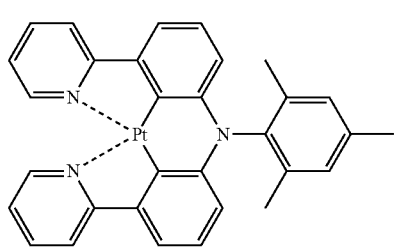
D31 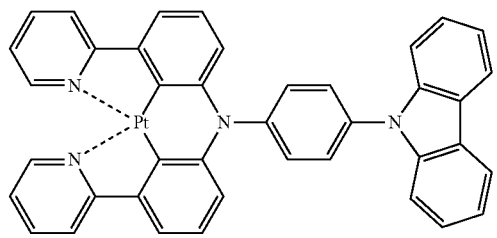
D32 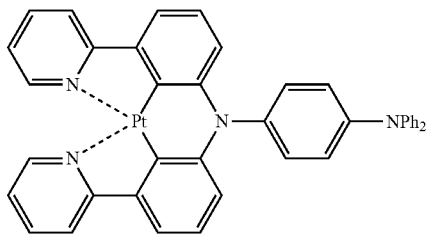
D33 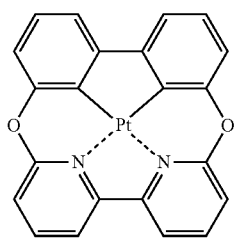
D34 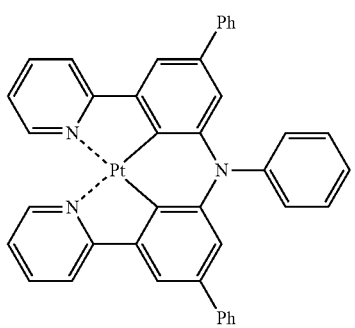

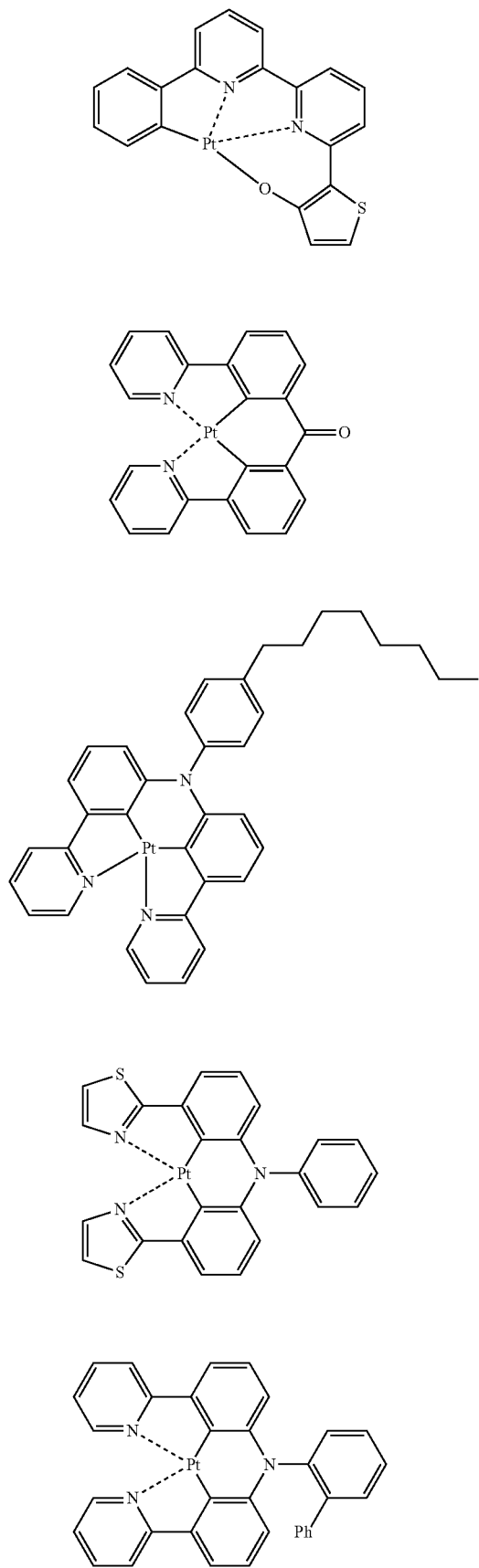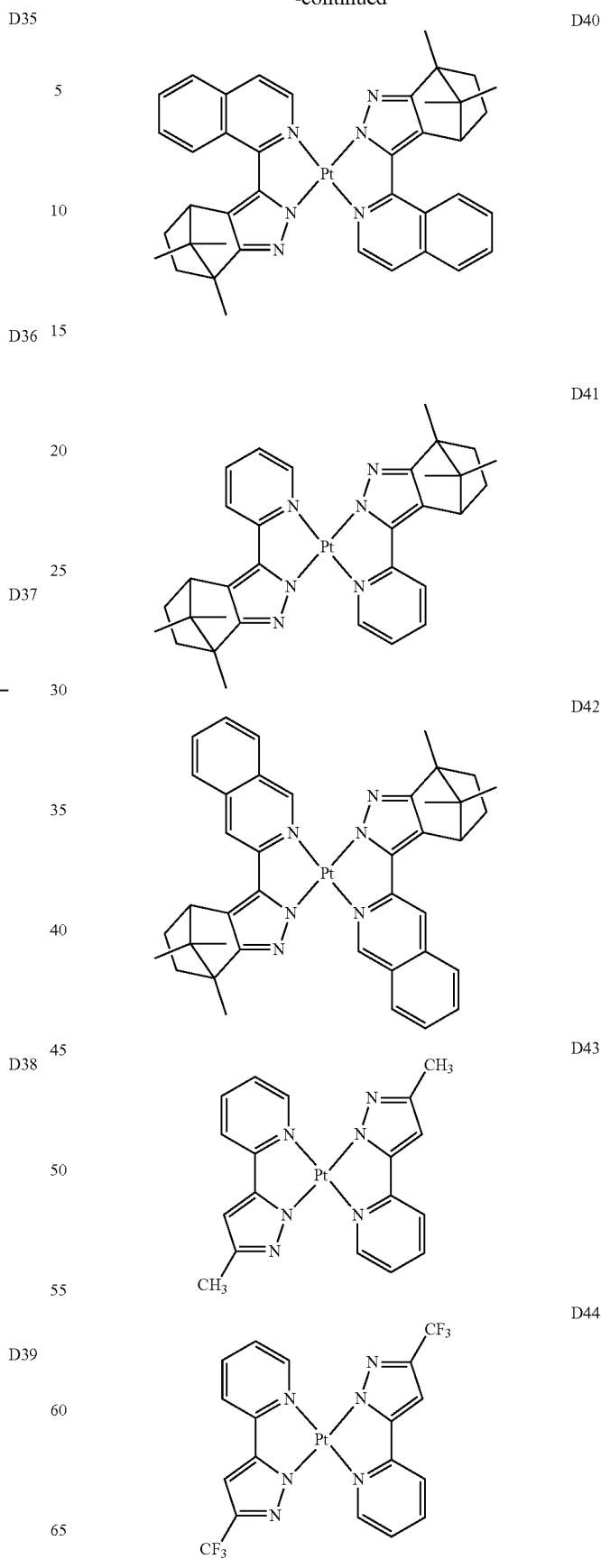

D45 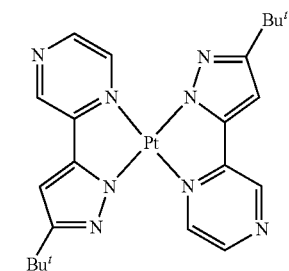
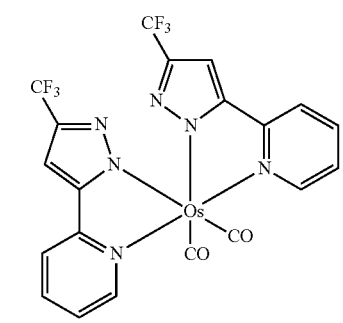
Non-limiting examples of dopants that may be used in the EML include Os-complexes represented by the following compounds,
D46 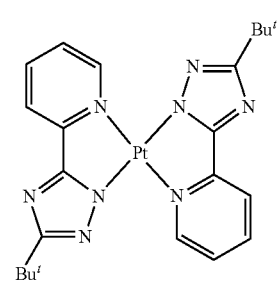
D47 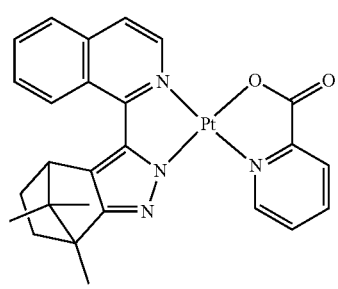
Os(fppz)₂(CO)₂
D48 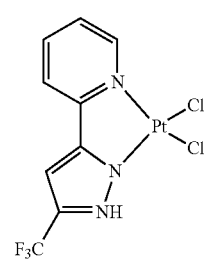
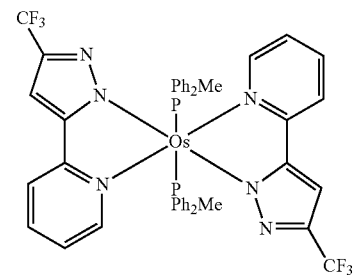
Os(fppz)₂(PPh₂Me)₂
D49 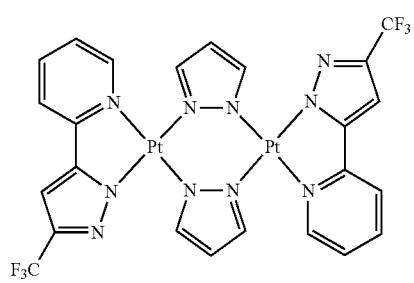
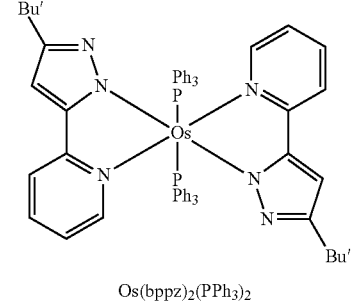
Os(bppz)₂(PPh₃)₂

-continued

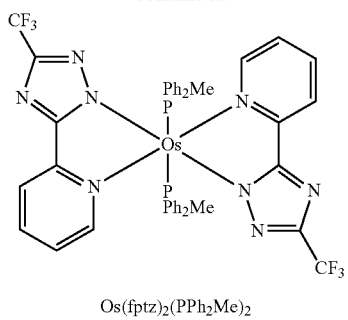

Os(fptz)₂(PPh₂Me)₂

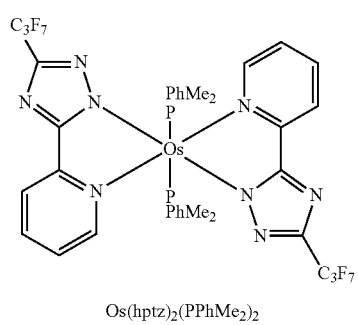

Os(hptz)₂(PPhMe₂)₂

When the EML includes a host and a dopant, an amount of the dopant may be about 0.01 to about 15 parts by weight based on 100 parts by weight of the host, but the EML is not limited thereto.

The thickness of the EML may be about 100 Å to about 1,000 Å, for example, about 200 Å to about 600 Å. When the thickness of the EML is within these ranges, the EML may have good light-emitting ability without a substantial increase in driving voltage.

Then, an ETL may be formed on the EML by vacuum deposition, spin coating, casting, or the like. When the ETL is formed using vacuum deposition or spin coating, the deposition or coating conditions may be similar to those described above for the formation of the HIL, although the deposition or coating conditions may vary depending on the compound used to form the ETL. The material for forming the ETL may be any material that can stably transport electrons injected from an electron-injecting electrode (cathode). Non-limiting examples of the material for forming the ETL include quinoline derivatives such as tris(8-quinolinorate)aluminum (Alq3), TAZ, BAlq, beryllium bis(benzoquinolin-10-olate (Bebq₂), 9,10-di(naphthalene-2-yl)anthracene ADN, Compound 201, and Compound 202.

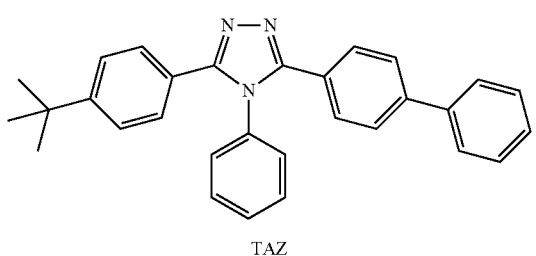

TAZ

-continued

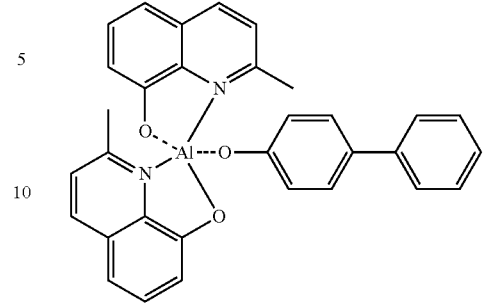

BAlq

Error! Objects cannot be created from editing field codes.

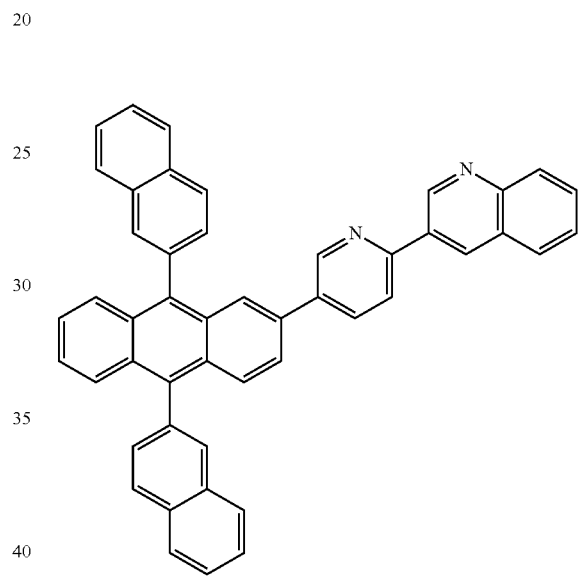

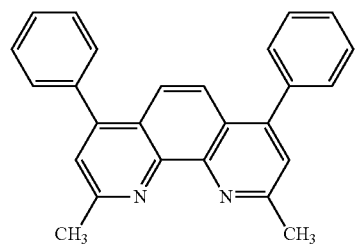

BCP

The thickness of the ETL may be about 100 Å to about 1,000 Å, for example, about 150 Å to about 500 Å. When the thickness of the ETL is within these ranges, the ETL may have a satisfactory electron transporting ability without a substantial increase in driving voltage.

In some embodiments, the ETL may further include a metal-containing material in addition to the electron-transporting organic compound. The metal-containing material may include a lithium (Li) complex. Non-limiting examples of the Li complex include lithium quinolate (LiQ) and Compound 203 below.

Compound 203

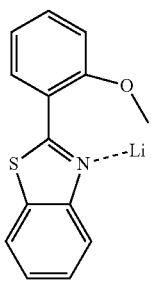

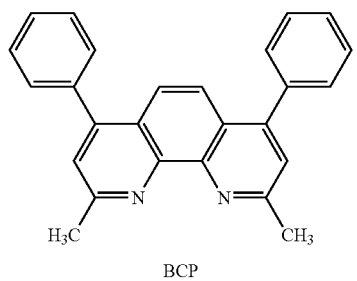 [SMILES: Cc1cc(-c2ccccc2)c2ccc3c(-c4ccccc4)cc(C)nc3c2n1 ; "BCP"]

BCP

Then, an EIL, which facilitates injection of electrons from the cathode, may be formed on the ETL. Any suitable electron-injecting material may be used to form the EIL. Non-limiting examples of materials for forming the EIL include LiF, NaCl, CsF, $Li_2O$, and BaO. The deposition conditions of the EIL may be similar to those described above for formation of the HIL, although the conditions may vary depending on the material used to form the EIL.

The thickness of the EIL may be about 1 Å to about 100 Å, for example, about 3 Å to about 90 Å. When the thickness of the EIL is within these ranges, the EIL may have satisfactory electron injection ability without a substantial increase in driving voltage.

A second electrode is disposed on the organic layer. The second electrode may be a cathode, which is an electron injection electrode. Here, the material for forming the second electrode may be a metal, an alloy, or an electro-conductive compound, all of which have low work functions, or a mixture thereof. The second electrode may be formed of lithium (Li), magnesium (Mg), aluminum (Al), aluminum-lithium (Al—Li), calcium (Ca), magnesium-indium (Mg—In), magnesium-silver (Mg—Ag), or the like, and may be formed as a thin film type transmissive electrode. In some embodiments, to manufacture a top-emission organic light-emitting diode, the second electrode may be formed of indium tin oxide (ITO) or indium zinc oxide (IZO).

An OLED according to an embodiment of the present invention has been described above with reference to FIG. 1, but the present invention is not limited to the structure illustrated in FIG. 1.

In addition, when the EML is formed by using a phosphorescent dopant, to prevent diffusion of triplet excitons or holes toward the ETL, a hole blocking layer (HBL) may be formed between the HTL and the EML or between the H-functional layer and the EML by, for example, vacuum deposition, spin coating, casting, LB deposition, or the like. When the HBL is formed using vacuum deposition or spin coating, the deposition or coating conditions may be similar to those described above for the formation of the HIL, although the conditions for deposition or coating may vary depending on the material used to form the HBL. Any hole-blocking material may be used, and non-limiting examples of suitable hole-blocking materials include oxadiazole derivatives, triazole derivatives, and phenanthroline derivatives. For example, BCP (illustrated below) may be used as a material for the HBL.

The thickness of the HBL may be about 20 Å to about 1,000 Å, for example, about 30 Å to about 300 Å. When the thickness of the HBL is within these ranges, the HBL may have improved hole blocking ability without a substantial increase in driving voltage.

The OLED according to an embodiment of the present invention may be provided in various types of flat panel display devices, such as passive matrix OLED devices and active matrix OLED devices. In particular, when the OLED is provided in an active matrix OLED, the first electrode on the substrate (which acts as a pixel electrode) may be electrically connected to a source electrode or a drain electrode of a thin-film transistor (TFT). In addition, the OLED may be provided in a flat panel display device having double-sided screens.

In some embodiments, the compound of the organic layer of the OLED may be formed by deposition or by a wet process involving coating a solution of the compound.

Hereinafter, the present invention will be described with reference to the following synthesis examples and other examples. However, these examples are presented for illustrative purposes only and are not intended to limit the scope of the present invention.

[Synthesis Example 1] Synthesis of Compound 1

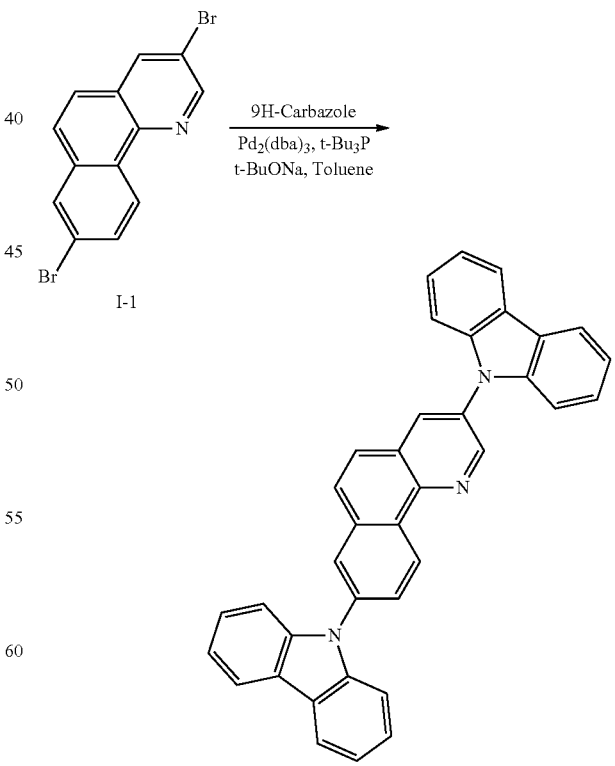

Synthesis of Compound 1

135.8 mg (0.148 mmol) of Pd2(dba)3 and 60.0 mg (0.297 mmol) of t-Bu3P were dissolved in 50 ml of o-xylene 50 ml, and then stirred at room temperature for 10 minutes. 5 g (14.8 mmol) of 3,8-dibromobenzo[h]quinoline, 6.2 g (37.09 mmol) of 9H-carbazole, and 855.5 mg (8.90 mmol) of t-BuONa were added to the solution, and the solution was stirred under reflux at a temperature of 160° C. for 48 hours. After completion of the reaction, 20 ml of cold distilled water was added thereto, and the reaction solution was extracted with ethylacetate. The reaction solution was dried with magnesium sulfate, filtered, and the solvent was evaporated. Then, the residue was separation-purified by column chromatography to obtain 5.42 g (Yield: 72%) of Compound 1 (3,8-di(9H-carbazol-9-yl)benzo[h]quinoline).

1H NMR (300 MHz, CDCl3), d (ppm): 9.63-9.53 (1H, m), 8.79-8.68 (1H, m), 8.53-8.42 (1H, m), 8.35-8.23 (1H, d), 8.01-7.89 (2H, m), 7.83-7.63 (9H, m), 7.32-7.23 (4H, m), 7.22-7.12 (4H, m). EI-MS, m/e, calcd for C37H23N3 509.19. found 509.25.

[Synthesis Example 2] Synthesis of Compound 5

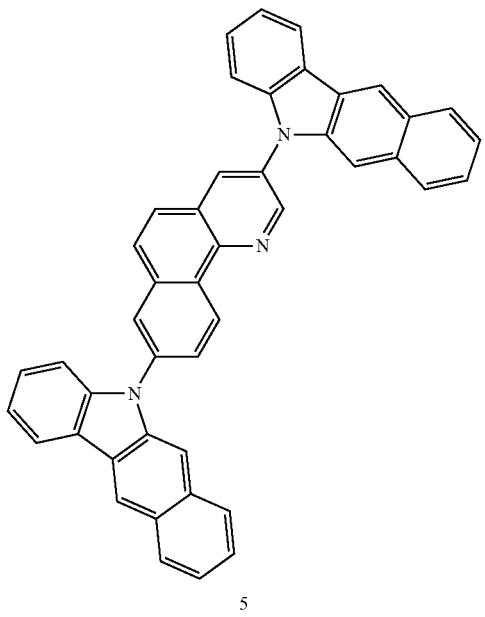

5

Synthesis of Compound 5

135.8 mg (0.148 mmol) of Pd2(dba)3 and 60.0 mg (0.297 mmol) of t-Bu3P were dissolved in 50 ml of o-xylene 50 ml, and the solution was stirred at room temperature for 10 minutes. 5 g (14.8 mmol) of 3,8-dibromobenzo[h]quinoline, 8.1 g (37.09 mmol) of 5H-benzo[b]carbazole, and 855.5 mg (8.90 mmol) of t-BuONa were added to the solution, and the solution was stirred under reflux at a temperature of 160° C. for 48 hours. After completion of the reaction, 20 ml of cold distilled water was added thereto, and the reaction solution was extracted with ethylacetate. The reaction solution was dried with magnesium sulfate, filtered, and the solvent was evaporated. Then, the residue was separation-purified by column chromatography to obtain 6.25 g (Yield: 69%) of Compound 5 (5,5'-(benzo[h]quinoline-3,8-diyl)bis(5H-benzo[b]carbazole)).

1H NMR (300 MHz, CDCl3), d (ppm): 9.74-9.62 (1H, m), 8.81-8.70 (1H, m), 8.56-8.46 (1H, m), 8.36-8.27 (1H, d), 8.18-8.08 (2H, m), 8.05-7.93 (4H, m), 7.90-7.77 (7H, m), 7.76-7.67 (2H, m), 7.49-7.38 (4H, m), 7.34-7.25 (2H, m), 7.24-7.13 (2H, m). EI-MS, m/e, calcd for C45H27N3 609.22. found 609.28.

[Synthesis Example 3] Synthesis of Compound 6

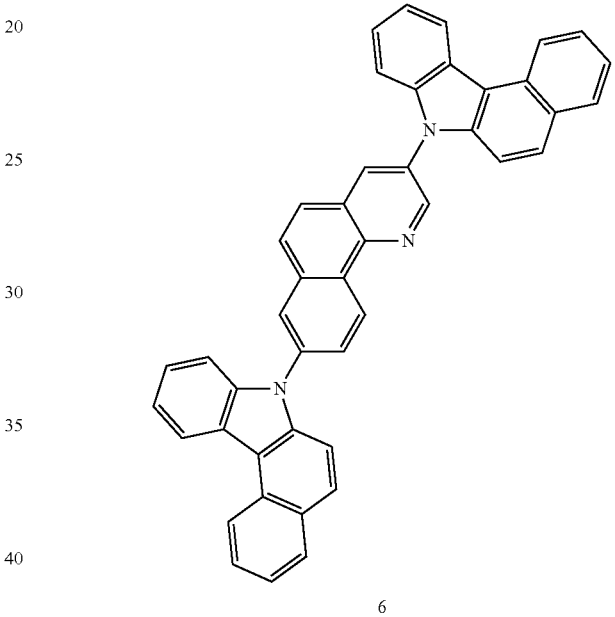

6

Synthesis of Compound 6

135.8 mg (0.148 mmol) of Pd2(dba)3 and 60.0 mg (0.297 mmol) of t-Bu3P were dissolved in 50 ml of o-xylene 50 ml, and the solution was stirred at room temperature for 10 minutes. 5 g (14.8 mmol) of 3,8-dibromobenzo[h]quinoline, 8.1 g (37.09 mmol) of 7H-benzo[c]carbazole, and 855.5 mg (8.90 mmol) of t-BuONa were added to the solution, and the solution was stirred under reflux at a temperature of 160° C. for 48 hours. After completion of the reaction, 20 ml of cold distilled water was added thereto, and the reaction solution was extracted with ethylacetate. The reaction solution was dried with magnesium sulfate, filtered, and the solvent was evaporated. Then, the residue was separation-purified by column chromatography to obtain 6.62 g (Yield: 73%) of Compound 6 (7,7'-(benzo[h]quinoline-3,8-diyl)bis(7H-benzo[c]carbazole)).

1H NMR (300 MHz, CDCl3), d (ppm): 9.36-9.27 (1H, m), 8.64-8.54 (1H, m), 8.38-8.33 (1H, m), 8.32-8.25 (1H, d), 8.10-8.01 (2H, m), 7.97-7.89 (3H, m), 7.89-7.84 (1H, m), 7.83-7.78 (2H, m), 7.77-7.70 (1H, m), 7.55-7.34 (10H, m), 7.27-7.15 (4H, m). EI-MS, m/e, calcd for C45H27N3 609.22. found 609.30.

[Synthesis Example 4] Synthesis of Compound 29

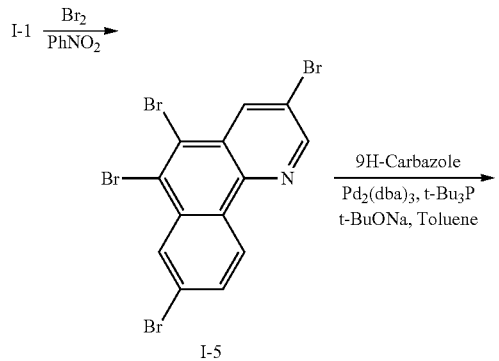

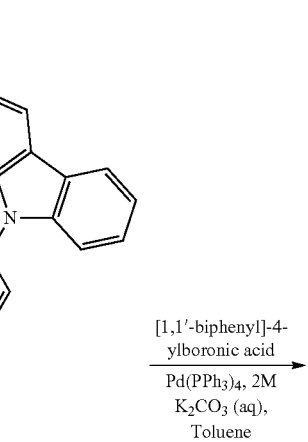

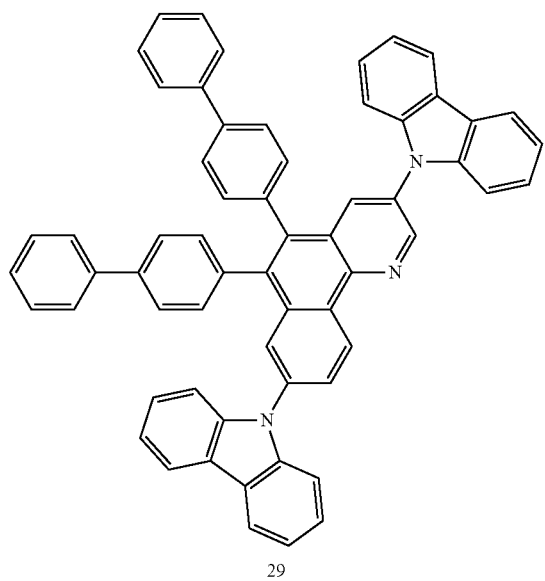

Synthesis of Intermediate I-5

5 g (14.8 mmol) of 3,8-Dibromobenzo[h]quinoline was dissolved in 40 ml of nitrobenzene, and the solution was stirred at a temperature of 80° C. 4.92 ml (96.06 mmol) of bromine was diluted with 10 ml of nitrobenzene, and was then slowly added to the solution. Then, the reaction solution was stirred under reflux at a temperature of 100° C. for 3 hours. A saturated solution of $NaHSO_3$ was added thereto, and then, the resulting solid compound was filtered. The reaction solution was washed with distilled water and n-hexane in that order, and then was vacuum dried to obtain 6.65 g (Yield: 91%) of Intermediate I-5 (3,5,6,8-tetrabromobenzo[h]quinoline).

1H NMR (300 MHz, CDCl3), d (ppm): 8.88-8.79 (1H, m), 8.76-8.68 (1H, m), 8.24-8.15 (1H, m), 8.01-7.92 (1H, d), 7.58-7.49 (1H, m). EI-MS, m/e, calcd for C13H5Br4N, 490.72. found 490.78.

Synthesis of Intermediate I-6

55.5 mg (0.061 mmol) of Pd2(dba)3 and 24.5 mg (0.121 mmol) of t-Bu3P were dissolved in 30 ml of o-xylene, and the solution was stirred at room temperature for 10 minutes. 3 g (6.06 mmol) of 3,5,6,8-tetrabromobenzo[h]quinoline, 2.53 g (15.15 mmol) of 9H-carbazole, and 349.6 mg (3.64 mmol) of t-BuONa was added to the solution, and the reaction solution was stirred under reflux at a temperature of 160° C. for 48 hours. After completion of the reaction, 20 ml of cold distilled water was added thereto, and the reaction solution was extracted with ethylacetate. The reaction solution was dried with magnesium sulfate, filtered, and the solvent was evaporated. Then, the residue was separation-purified by column chromatography to obtain 3.27 g (Yield: 81%) of Intermediate I-6 (5,6-dibromo-3,8-di(9H-carbazol-9-yl)benzo[h]quinoline).

1H NMR (300 MHz, CDCl3), d (ppm): 9.24-9.17 (1H, m), 9.00-8.91 (1H, m), 8.54-8.47 (1H, m), 8.32-8.23 (1H, d), 7.86-7.79 (1H, m), 7.78-7.69 (4H, m), 7.41-7.31 (4H, m), 7.27-7.10 (8H, m). EI-MS, m/e, calcd for C37H21 Br2N3 665.01. found 665.12.

Synthesis of Compound 29

3 g (4.51 mmol) of Intermediate I-6, 1.97 g (9.92 mmol) of [1,1'-biphenyl]-4-ylboronic acid, and 260.6 mg (0.226 mmol) of tetrakis(triphenylphosphine)palladium(0) were dissolved in 22.55 ml of 2M K2CO3 (aq) and 30 ml of toluene 30 ml, and the solution was stirred at a temperature of 70° C. for 12 hours. After completion of the reaction, 50 ml of cold distilled water was added thereto, and the reaction solution was extracted with ethylacetate. The reaction solution was dried with magnesium sulfate, filtered, and the solvent was evaporated. Then, the residue was separation-purified by column chromatography to obtain 2.72 g (Yield: 74%) of Compound 29 (5,6-di([1,1'-biphenyl]-4-yl)-3,8-di (9H-carbazol-9-yl)benzo[h]quinoline).

1H NMR (300 MHz, CDCl3), d (ppm): 9.48-9.38 (1H, m), 8.34-8.25 (2H, m), 8.18-8.10 (1H, d), 7.97-7.87 (6H, m), 7.86-7.80 (6H, m), 7.80-7.72 (3H, m), 7.70-7.63 (2H, m), 7.61-7.51 (6H, m), 7.50-7.40 (4H, m), 7.29-7.21 (2H, m), 7.20-7.12 (4H, m), 7.08-7.00 (2H, m). EI-MS, m/e, calcd for C61H39N3 813.31. found 813.37.

[Synthesis Example 5] Synthesis of Compound 13

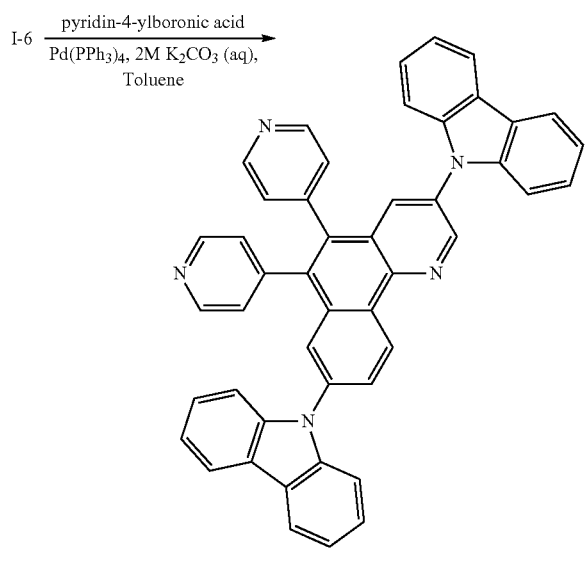

13

[Synthesis Example 6] Synthesis of Compound 34

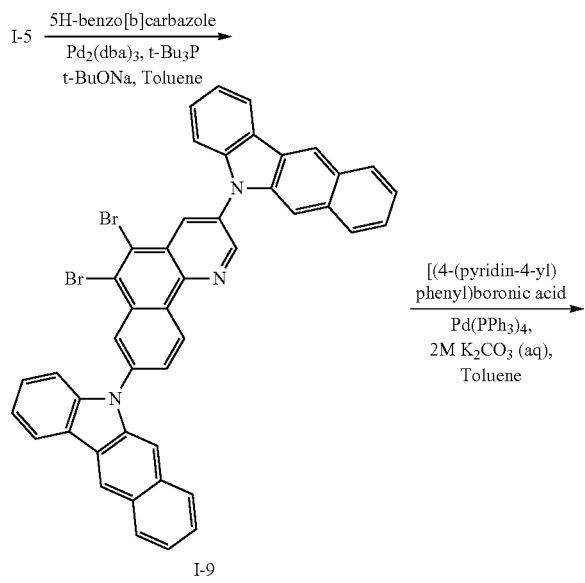

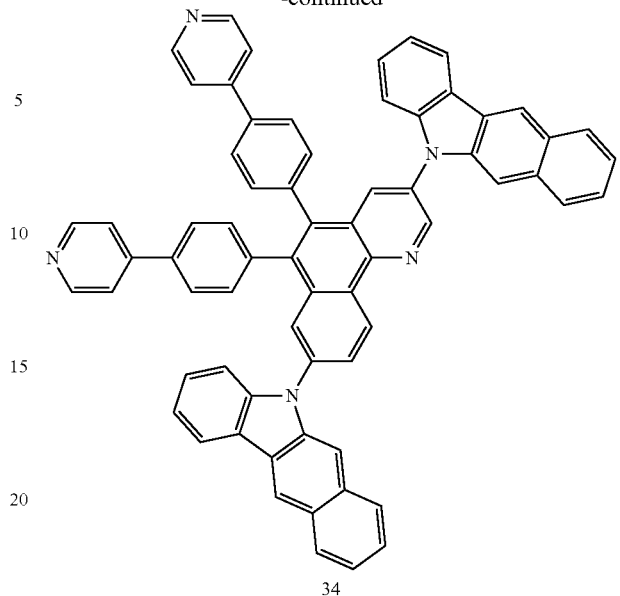

34

Synthesis of Compound 13

3 g (4.51 mmol) of Intermediate I-6, 1.22 g (9.92 mmol) of pyridin-4-ylboronic acid, and 260.6 mg (0.226 mmol) of tetrakis(triphenylphosphine)palladium(0) were dissolved in 22.55 ml of 2M K2CO3 (aq) and 30 ml of toluene 30 ml, and the solution was stirred at a temperature of 70° C. for 12 hours. After completion of the reaction, 50 ml of cold distilled water was added thereto, and the reaction solution was extracted with ethylacetate. The reaction solution was dried with magnesium sulfate, filtered, and the solvent was evaporated. Then, the residue was separation-purified by column chromatography to obtain 2.36 g (Yield: 78%) of Compound 13 (3,8-di(9H-carbazol-9-yl)-5,6-di(pyridin-4-yl)benzo[h]quinoline).

1H NMR (300 MHz, CDCl3), d (ppm): 9.50-9.41 (1H, m), 8.78-8.62 (5H, m), 8.33-8.27 (1H, d), 8.26-8.20 (1H, m), 7.88-7.82 (1H, m), 7.77-7.61 (10H, m), 7.41-7.34 (2H, m), 7.32-7.10 (8H, m). EI-MS, m/e, calcd for C47H29N5 663.24. found 663.29.

Synthesis of Intermediate I-9

55.5 mg (0.061 mmol) of Pd2(dba)3 and 24.5 mg (0.121 mmol) of t-Bu3P were dissolved in 30 ml of o-xylene, and the solution was stirred at room temperature for 10 minutes. 3 g (6.06 mmol) of 3,5,6,8-tetrabromobenzo[h]quinoline, 3.29 g (15.15 mmol) of 5H-benzo[b]carbazole, and 349.6 mg (3.64 mmol) of t-BuONa were added to the solution, and the reaction solution was stirred under reflux at a temperature of 160° C. for 48 hours. After completion of the reaction, 20 ml of cold distilled water as added thereto, and the reaction solution was extracted with ethylacetate. The reaction solution was dried with magnesium sulfate, filtered, and the solvent was evaporated. Then, the residue was separation-purified by column chromatography to obtain 3.16 g (Yield: 68%) of Intermediate I-9 (5,5'-(5,6-dibromobenzo[h]quinoline-3,8-diyl)bis(5H-benzo[b]carbazole)).

1H NMR (300 MHz, CDCl3), d (ppm): 9.67-9.56 (1H, m), 9.24-9.13 (1H, m), 8.79-8.69 (1H, m), 8.38-8.28 (1H, d), 8.18-8.08 (2H, m), 8.04-7.94 (3H, m), 7.90-7.79 (6H, m), 7.79-7.70 (2H, m), 7.49-7.37 (4H, m), 7.35-7.26 (2H, m), 7.25-7.14 (2H, m EI-MS, m/e, calcd for C45H25Br2N3 765.04. found 765.11.

Synthesis of Compound 34

3 g (3.90 mmol) of Intermediate I-9, 1.71 g (8.60 mmol) of (4-(pyridin-4-yl)phenyl)boronic acid, and 225.8 mg (0.195 mmol) of tetrakis(triphenylphosphine)palladium(0) were dissolved in 19.54 ml of 2M K2CO3 (aq) and 30 ml of toluene, and the solution was stirred at a temperature of 70° C. for 12 hours. After completion of the reaction, 50 ml of cold distilled water was added thereto, and the reaction solution was extracted with ethylacetate. The reaction solution was dried with magnesium sulfate, filtered, and the solvent was evaporated. Then, the residue was separation-purified by column chromatography to obtain 2.71 g (Yield: 76%) of compound 34 (5,5'-(5,6-bis(4-(pyridin-4-yl)phenyl)benzo[h]quinoline-3,8-diyl)bis(5H-benzo[b]carbazole)).

1H NMR (300 MHz, CDCl3), d (ppm): 8.87-8.79 (4H, d), 8.57-8.50 (2H, m), 8.30-8.24 (1H, m), 8.19-8.11 (2H, d), 8.07-8.04 (1H, m), 8.03-7.93 (3H, m), 7.91-7.72 (17H, m), 7.71-7.66 (1H, m), 7.65-7.58 (2H, m), 7.52-7.42 (3H, m), 7.37-7.31 (1H, m), 7.21-7.11 (2H, m), 7.10-6.99 (2H, m). EI-MS, m/e, calcd for C67H41N5 915.34. found 915.38.

[Synthesis Example 7] Synthesis of Compound 47

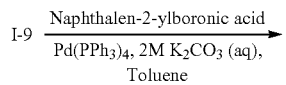

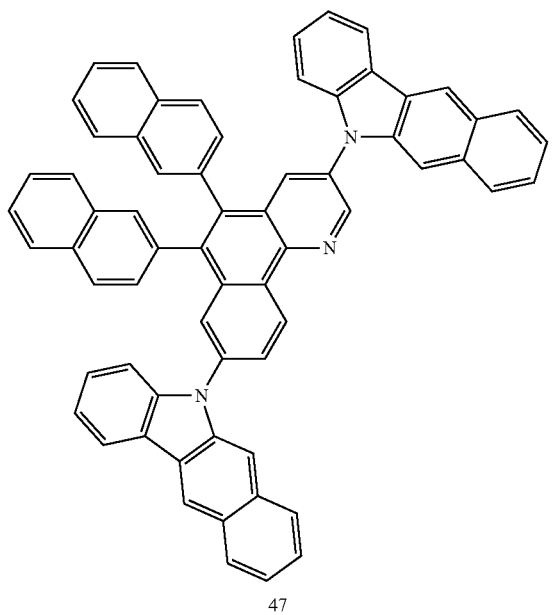

47

[Synthesis Example 8] Synthesis of Compound 38

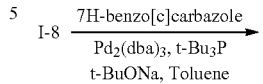

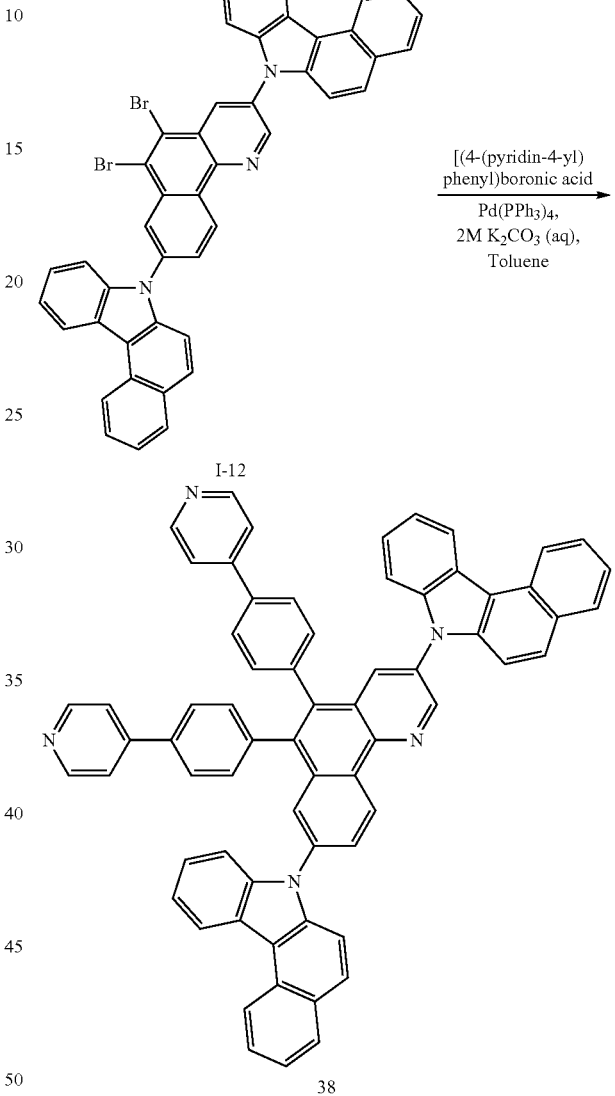

Synthesis of Compound 47

3 g (3.90 mmol) of Intermediate I-9, 1.48 g (8.60 mmol) of naphthalen-2-ylboronic acid, and 225.8 mg (0.195 mmol) of tetrakis(triphenylphosphine)palladium(0) were dissolved in 19.54 ml of 2M K2CO3 (aq) and 30 ml of toluene, and the solution was stirred at a temperature of 70° C. for 12 hours. After completion of the reaction, 50 ml of cold distilled water was added thereto, and the reaction solution was extracted with ethylacetate. The reaction solution was dried with magnesium sulfate, filtered, and the solvent was evaporated. Then, the residue was separation-purified by column chromatography to obtain 2.54 g (Yield: 75%) of Compound 47 (5,5'-(5,6-di(naphthalen-2-yl)benzo[h]quinoline-3,8-diyl)bis(5H-benzo[b]carbazole)).

1H NMR (300 MHz, CDCl3), d (ppm): 8.97-8.89 (1H, m), 8.69-8.65 (1H, m), 8.65-8.61 (2H, m), 8.61-8.53 (1H, d), 8.35-8.27 (2H, m), 8.26-8.19 (1H, m), 8.16-8.03 (4H, m), 7.97-7.89 (3H, m), 7.89-7.80 (8H, m), 7.79-7.72 (3H, m), 7.72-7.64 (3H, m), 7.63-7.56 (2H, m), 7.55-7.45 (4H, m), 7.31-7.22 (2H, m), 7.10-6.99 (2H, m). EI-MS, m/e, calcd for C65H39N3 861.31. found 861.36.

Synthesis of Intermediate I-12

55.5 mg (0.061 mmol) of Pd2(dba)3 and 24.5 mg (0.121 mmol) of t-Bu3P were dissolved in 30 ml of o-xylene 30 ml, and the solution was stirred at room temperature for 10 minutes. 3 g (6.06 mmol) of 3,5,6,8-tetrabromobenzo[h]quinoline, 3.29 g (15.15 mmol) of 7H-benzo[c]carbazole, and 349.6 mg (3.64 mmol) of t-BuONa were added to the solution, and the reaction solution was stirred under reflux at a temperature of 160° C. for 48 hours. After completion of the reaction, 20 ml of cold distilled water was added thereto, and the reaction solution was extracted with ethylacetate. The reaction solution was dried with magnesium sulfate, filtered, and the solvent was evaporated. Then, the residue was separation-purified by column chromatography to obtain 3.05 g (Yield: 66%) of Intermediate I-12 (7,7'-(5,6-dibromobenzo[h]quinoline-3,8-diyl)bis(7H-benzo[c]carbazole)).

1H NMR (300 MHz, CDCl3), d (ppm): 9.62-9.54 (1H, m), 9.24-9.16 (1H, m), 8.78-8.72 (1H, m), 8.37-8.29 (1H, d), 8.11-8.04 (2H, m), 8.00-7.92 (3H, m), 7.88-7.80 (4H, m), 7.79-7.71 (2H, m), 7.54-7.39 (6H, m), 7.33-7.16 (4H, m). EI-MS, m/e, calcd for C45H25Br2N3 765.04. found 765.08.

Synthesis of Compound 38

3 g (3.90 mmol) of Intermediate I-12, 1.71 g (8.60 mmol) of (4-(pyridin-4-yl)phenyl)boronic acid, and 225.8 mg (0.195 mmol) of tetrakis(triphenylphosphine)palladium(0) were dissolved in 19.54 ml of 2M K2CO3 (aq) and 30 ml of toluene, and the solution was stirred at a temperature of 70° C. for 12 hours. After completion of the reaction, 50 ml of cold distilled water was added thereto, and the reaction solution was extracted with ethylacetate. The reaction solution was dried with magnesium sulfate, filtered, and the solvent was evaporated. Then, the residue was separation-purified by column chromatography to obtain 2.58 g (Yield: 72%) of Compound 38 (7,7'-(5,6-bis(4-(pyridin-4-yl)phenyl)benzo[h]quinoline-3,8-diyl)bis(7H-benzo[c]carbazole)).

1H NMR (300 MHz, CDCl3), d (ppm): 8.82-8.72 (4H, d), 8.42-8.36 (1H, m), 8.27-8.21 (1H, m), 8.16-8.10 (1H, m), 8.07-8.01 (1H, d), 7.98-7.93 (2H, m), 7.93-7.77 (16H, m), 7.77-7.71 (2H, m), 7.69-7.57 (4H, m), 7.52-7.46 (1H, d), 7.45-7.40 (1H, m), 7.37-7.28 (3H, m), 7.21-7.14 (2H, m), 7.13-7.06 (2H, m). EI-MS, m/e, calcd for C67H41N5 915.34. found 915.41.

[Synthesis Example 9] Synthesis of Compound 52

Synthesis of Compound 52

3 g (3.90 mmol) of Intermediate I-12, 1.49 g (8.60 mmol) of quinolin-6-ylboronic acid, and 225.8 mg (0.195 mmol) of tetrakis(triphenylphosphine)palladium(0) were dissolved in 19.54 ml of 2M K2CO3 (aq) and 30 ml of toluene, and the solution was stirred at a temperature of 70° C. for 12 hours. After completion of the reaction, 50 ml of cold distilled water was added thereto, and the reaction solution was extracted with ethylacetate. The reaction solution was dried with magnesium sulfate, filtered, and the solvent was evaporated. Then, the residue was separation-purified by column chromatography to obtain 2.33 g (Yield: 69%) of Compound 52 (7,7"-(5,6-di(quinolin-6-yl)benzo[h]quinoline-3,8-diyl)bis(7H-benzo[c]carbazole)).

1H NMR (300 MHz, CDCl3), d (ppm): 9.08-8.99 (2H, m), 8.71-8.63 (2H, m), 8.52-8.47 (1H, d), 8.47-8.41 (1H, m), 8.37-8.33 (1H, m), 8.31-8.25 (1H, m), 8.20-8.15 (1H, m), 8.14-8.06 (2H, m), 8.04-7.88 (5H, m), 7.85-7.71 (5H, m), 7.66-7.58 (3H, m), 7.57-7.46 (6H, m), 7.42-7.33 (3H, m), 7.33-7.25 (2H, m), 7.18-7.07 (2H, m). EI-MS, m/e, calcd for C63H37N5 863.30. found 863.36.

Example 1

An anode was prepared by cutting a corning 15 Ω/cm² ITO glass substrate for a front diode to a size of 50 mm×50 mm×0.7 mm, sonicating the glass substrate for 5 minutes each in isopropyl alcohol and pure water, and then cleaning the glass substrate by irradiation with ultraviolet rays for 30 minutes, and exposure to ozone. The resulting glass substrate was loaded into a vacuum deposition device.

2-TNATA, as a hole injecting compound, was vacuum deposited on the anode to a thickness of about 600 Å to form an HIL, and 4'-bis[N-(1-naphthyl)-N-phenylamino]biphenyl (hereinafter, NPB), as a hole transporting compound, was vacuum-deposited on the HIL to a thickness of about 300 Å to form an HTL.

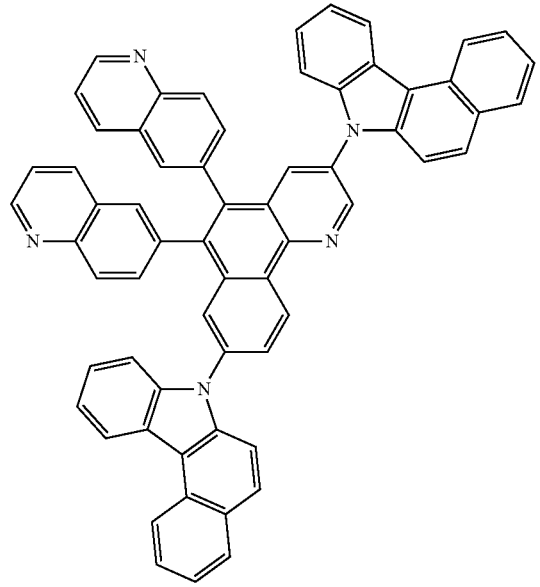

52

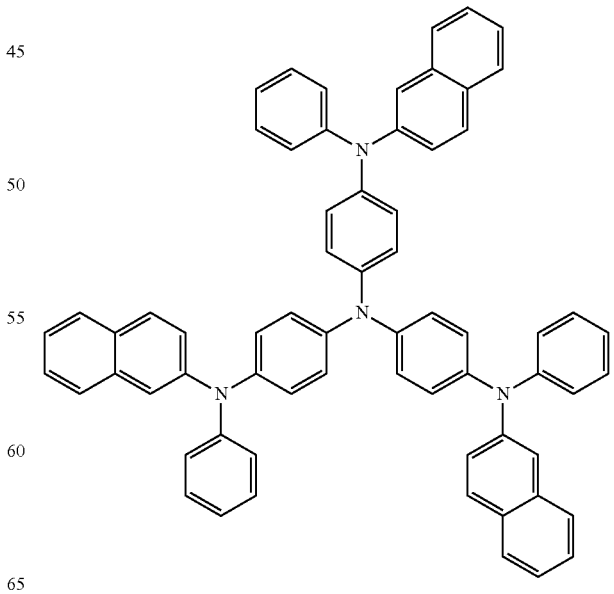

2-TNATA

-continued

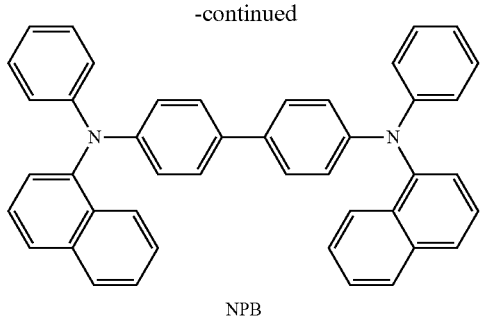

NPB

Compound 1 and PTOEP as a red phosphorescent dopant were co-deposited at a weight ratio of 90:10 on the HTL to form an EML having a thickness of 500 Å.

Next, Compound 200 was deposited on the EML to form an ETL with a thickness of 300 Å, and then LiF, which is a halogenated alkali metal, was deposited on the ETL to form an EIL with a thickness of 10 Å. Then, Al was vacuum-deposited on the EIL to form a cathode having a thickness of 2000 Å, thereby forming a LiF/Al electrode and completing the manufacture of an OLED.

Compound 200

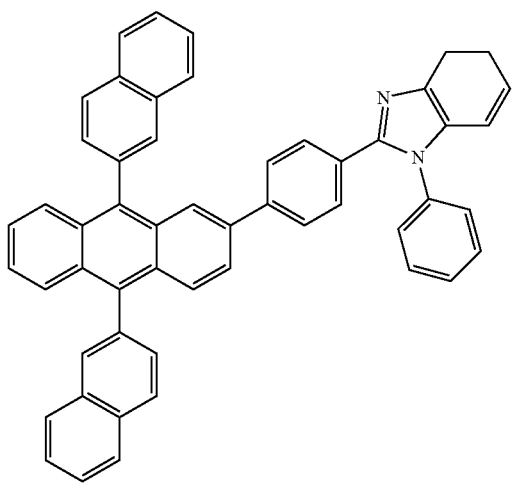

Compound 201

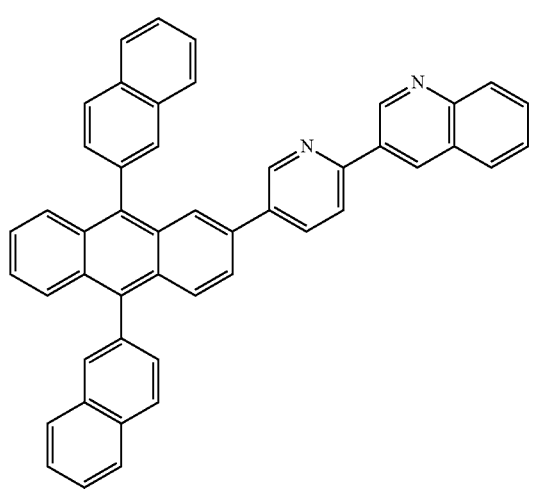

In the OLED, red emission having a driving voltage of about 6.1 V at a luminosity of 1,000 cd/m$^2$, and a luminescent efficiency of 17.4 cd/A was confirmed.

Example 2

An OLED was manufactured as in Example 1, except that Compound 5 was used instead of Compound 1 to form the EML.

In the OLED, red emission having a driving voltage of about 6.0 V at a luminosity of 1,000 cd/m$^2$, and a luminescent efficiency of 18.1 cd/A was confirmed.

Example 3

An OLED was manufactured as in Example 1, except that Compound 6 was used instead of Compound 1 to form the EML.

In the OLED, red emission having a driving voltage of about 6.4 V at a luminosity of 1,000 cd/m$^2$, and a luminescent efficiency of 17.2 cd/A was confirmed.

Example 4

An OLED was manufactured as in Example 1, except that Compound 13 was used instead of Compound 1 to form the EML.

In the OLED, red emission having a driving voltage of about 6.1 V at a luminosity of 1,000 cd/m$^2$, and a luminescent efficiency of 17.9 cd/A was confirmed.

Example 5

An OLED was manufactured as in Example 1, except that Compound 29 was used instead of Compound 1 to form the EML.

In the OLED, red emission having a driving voltage of about 5.9 V at a luminosity of 1,000 cd/m$^2$, and a luminescent efficiency of 16.9 cd/A was confirmed.

Example 6

An OLED was manufactured as in Example 1, except that Compound 34 was used instead of Compound 1 to form the EML.

In the OLED, red emission having a driving voltage of about 6.2 V at a luminosity of 1,000 cd/m$^2$, and a luminescent efficiency of 18.0 cd/A was confirmed.

Example 7

An OLED was manufactured as in Example 1, except that Compound 47 was used instead of Compound 1 to form the EML.

In the OLED, red emission having a driving voltage of about 6.1 V at a luminosity of 1,000 cd/m$^2$, and a luminescent efficiency of 17.6 cd/A was confirmed.

Example 8

An OLED was manufactured as in Example 1, except that Compound 52 was used instead of Compound 1 to form the EML.

In the OLED, red emission having a driving voltage of about 6.4 V at a luminosity of 1,000 cd/m$^2$, and a luminescent efficiency of 17.5 cd/A was confirmed.

Comparative Example 1

An OLED was manufactured as in Example 1, except that CBP was used instead of Compound 1 to form the EML.

In the OLED, red emission having a driving voltage of about 7.4 V at a luminosity of 1,000 cd/m², and a luminescent efficiency of 11.8 cd/A was confirmed.

TABLE 1

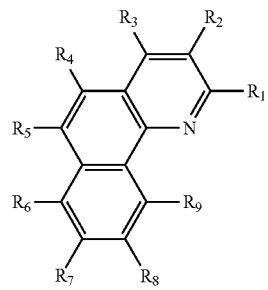
CBP

| | Organic compound | Driving voltage (V) | Efficiency (cd/A) | Luminescence color |
|---|---|---|---|---|
| Example 1 | Compound 1 | 6.1 | 17.4 | Red |
| Example 2 | Compound 5 | 6.0 | 18.1 | Red |
| Example 3 | Compound 6 | 6.4 | 17.2 | Red |
| Example 4 | Compound 13 | 6.1 | 17.9 | Red |
| Example 5 | Compound 29 | 5.9 | 16.9 | Red |
| Example 6 | Compound 34 | 6.2 | 18.0 | Red |
| Example 7 | Compound 47 | 6.1 | 17.6 | Red |
| Example 8 | Compound 52 | 6.4 | 17.5 | Red |
| Comparative Example 1 | CBP | 7.4 | 11.8 | Red |

As described above, using compounds of Formula 1 or Formula 2 and a metallic complex in an organic light-emitting layer yields a novel organic light-emitting diode (OLED) having advantages such as high efficiency and long lifetime that may be suitable for a full color OLED.

While the present invention has been illustrated and described with reference to certain exemplary embodiments, those of ordinary skill in the art will understand that various modifications may be made to the described embodiments without departing from the spirit and scope of the present invention as defined by the following claims.

What is claimed is:

1. An organic light-emitting diode (OLED) comprising:
a first electrode;
a second electrode; and
an organic layer between the first electrode and the second electrode, wherein the organic layer includes a metallic complex and a compound represented by Formula 1 or 2:

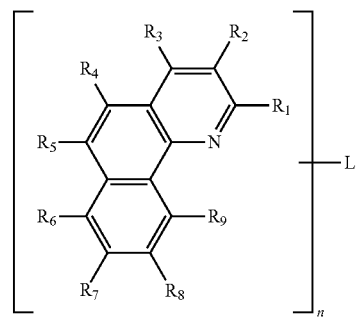

Formula 1

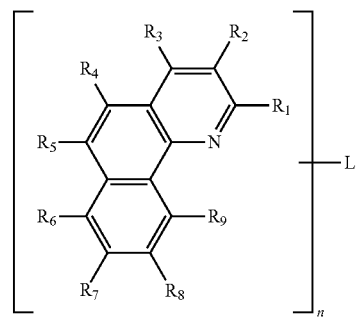

Formula 2 wherein, in Formula 1 and 2,
$R_1$ to $R_9$ are each independently a bonding site to a benzoquinone moiety, a hydrogen atom, a deuterium atom, a substituted or unsubstituted $C_1$-$C_{50}$ alkyl group, a substituted or unsubstituted $C_3$-$C_{50}$ cycloalkyl group, a substituted or unsubstituted $C_1$-$C_{50}$ alkoxy group, a substituted or unsubstituted $C_5$-$C_{50}$ aryloxy group, a substituted or unsubstituted $C_5$-$C_{50}$ arylthio group, a substituted or unsubstituted $C_5$-$C_{60}$ aryl group, an amino group substituted with a $C_5$-$C_{50}$ aryl group, a substituted or unsubstituted $C_3$-$C_{60}$ heteroaryl group, a substituted or unsubstituted $C_6$-$C_{60}$ condensed polycyclic group, a halogen group, a cyano group, a nitro group, a hydroxyl group, or a carboxyl group, wherein adjacent R groups selected from $R_1$ to $R_9$ optionally combine to form a ring, and
at least one of $R_2$ or $R_7$ is selected from moieties represented by Formulas 2a to 2c:

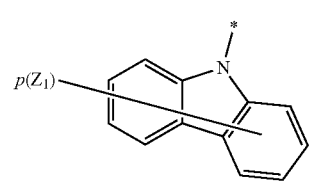
2a

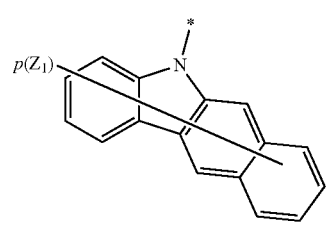
2b

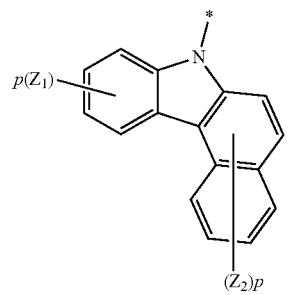
2c wherein, in Formulas 2a to 2c,
$Z_1$ and $Z_2$ are each independently a hydrogen atom, a deuterium atom, a substituted or unsubstituted C$_1$-C$_{20}$ alkyl group, a substituted or unsubstituted C$_5$-C$_{20}$ aryl group, a substituted or unsubstituted C$_3$-C$_{20}$ heteroaryl group, a substituted or unsubstituted C$_6$-C$_{20}$ condensed polycyclic group, a halogen group, a cyano group, a nitro group, a hydroxyl group, or a carboxyl group;

p is an integer from 1 to 9; and

* is a binding site;

wherein, in Formula 2,

- in -L represents a bonding site for connection to a benzoquinone moiety at a position corresponding to one of R$_1$ to R$_9$;

L represents a single bond, a substituted or unsubstituted C$_6$-C$_{60}$ arylene group or a substituted or unsubstituted C$_3$-C$_{60}$ heteroarylene group; and n is an integer of 2 to 4.

2. The OLED of claim 1, wherein the metallic complex comprises a metal selected from the group consisting of Ir, Pt, Os, or Pd.

3. The OLED of claim 1, wherein at least two adjacent R groups selected from R$_1$ to R$_9$ combine to form a ring.

4. The OLED of claim 1, wherein n is an integer of 2 or 3.

5. The OLED of claim 1, wherein R$_2$ and R$_7$ are independently selected from moieties represented by Formulas 2a to 2c:

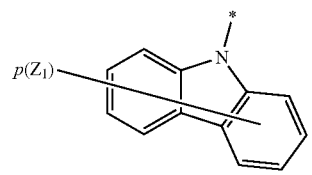

2a

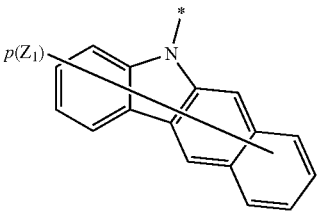

2b

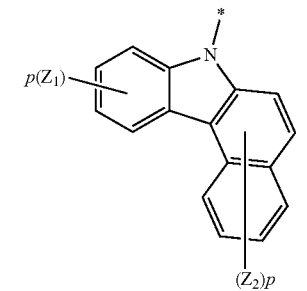

2c wherein, in Formulas 2a to 2c,

Z$_1$ and Z$_2$ are each independently a hydrogen atom, a deuterium atom, a substituted or unsubstituted C$_1$-C$_{20}$ alkyl group, a substituted or unsubstituted C$_5$-C$_{20}$ aryl group, a substituted or unsubstituted C$_3$-C$_{20}$ heteroaryl group, a substituted or unsubstituted C$_6$-C$_{20}$ condensed polycyclic group, a halogen group, a cyano group, a nitro group, a hydroxyl group, or a carboxyl group;

p is an integer from 1 to 9; and

* is a binding site.

6. The OLED of claim 1, wherein R$_4$ and R$_5$ are each independently a moiety represented by one of Formulas 3a to 3d:

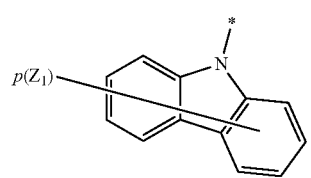

3a

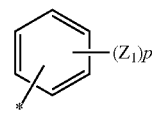

3b

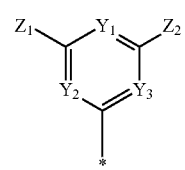

3c

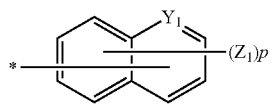

3d wherein, in Formulas 3a to 3d,

Z$_1$ and Z$_2$ are each independently a hydrogen atom, a deuterium atom, a substituted or unsubstituted C$_1$-C$_{20}$ alkyl group, a substituted or unsubstituted C$_5$-C$_{20}$ aryl group, a substituted or unsubstituted C$_3$-C$_{20}$ heteroaryl group, a substituted or unsubstituted C$_6$-C$_{20}$ condensed polycyclic group, a halogen group, a cyano group, a nitro group, a hydroxyl group, or a carboxyl group;

Y$_1$ to Y$_3$ are each independently CH or N;

p is an integer from 1 to 8; and

* is a binding site.

7. The OLED of claim 1, wherein R$_1$, R$_3$, R$_6$, R$_8$, and R$_9$ are each independently a hydrogen atom or a deuterium atom.

8. The OLED of claim 1, wherein L is a moiety represented by one of Formulas 4a and 4b:

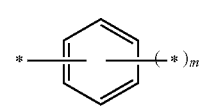

4a

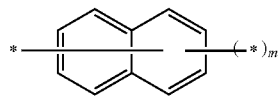

4b wherein m is an integer from 1 to 3; and

* is a binding site.

9. The OLED of claim 1, wherein the compound of Formula 1 or 2 is one of Compounds 1 through 58:

91　　　　　　　　　　　　　　　92
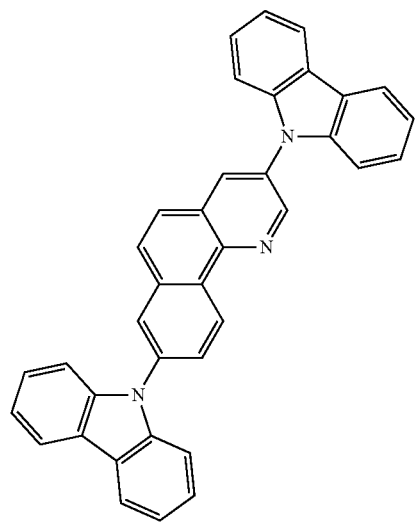
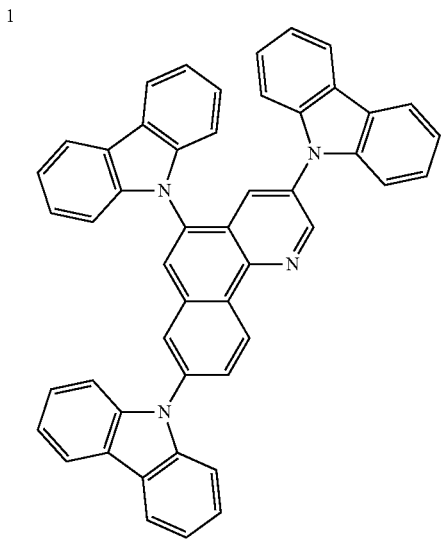
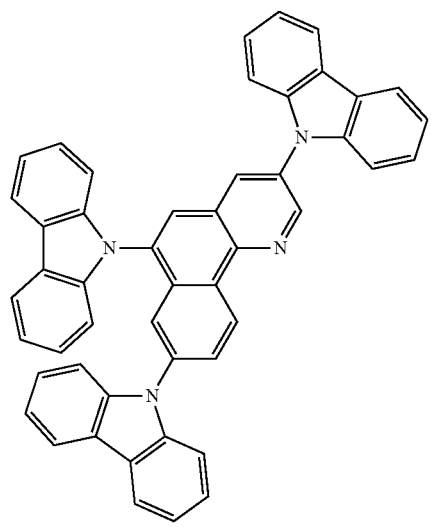
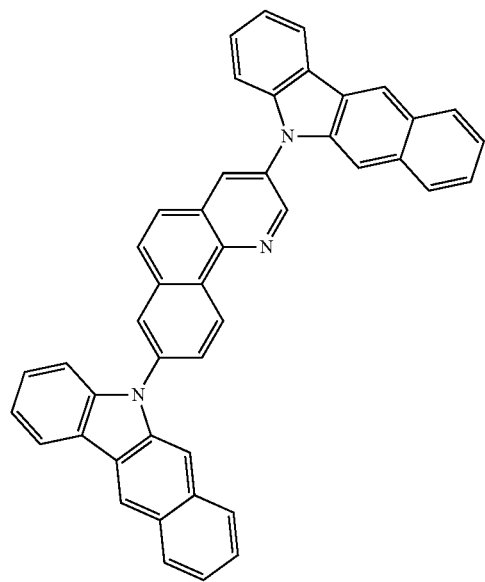
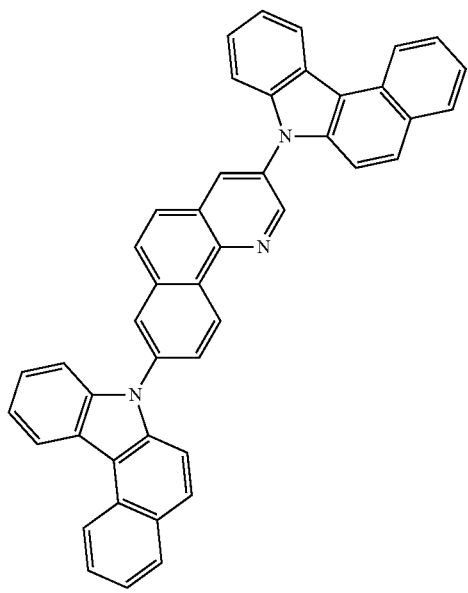

-continued
7
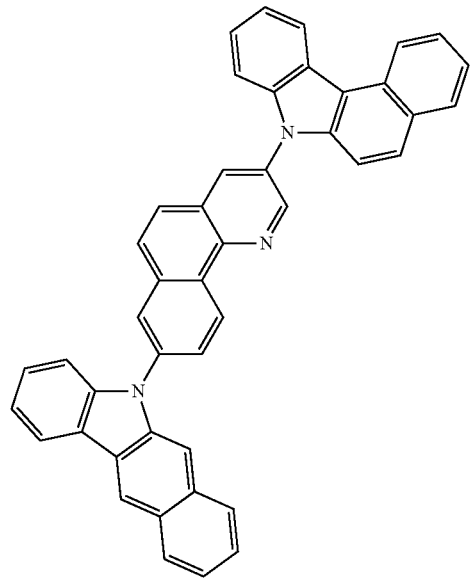
8
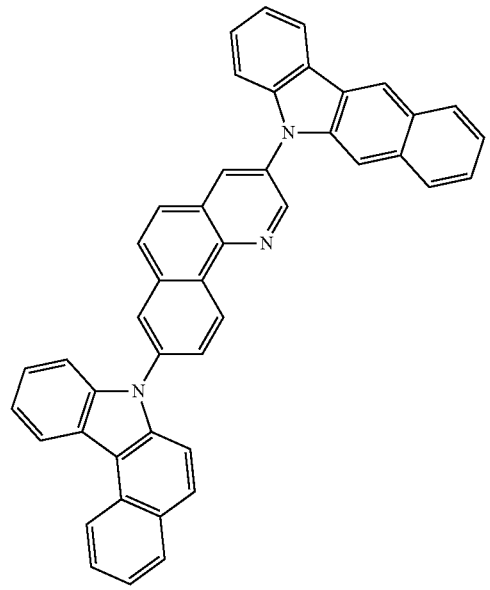
9
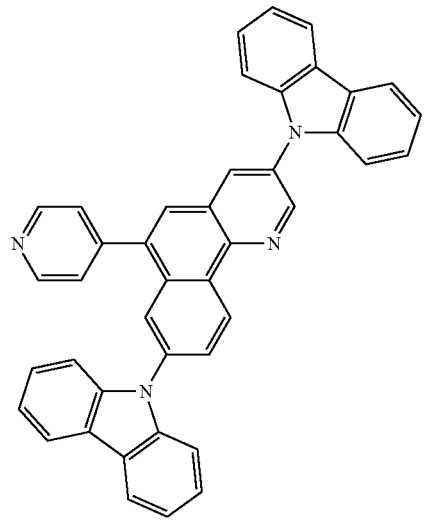
10
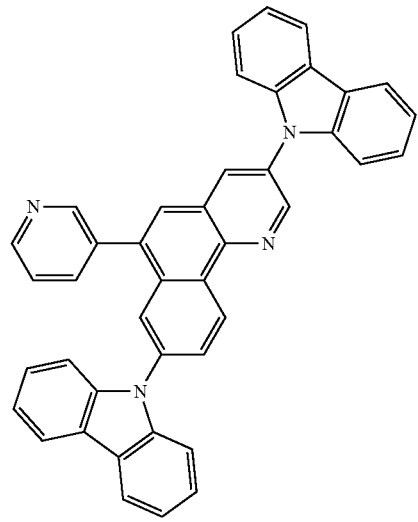
11
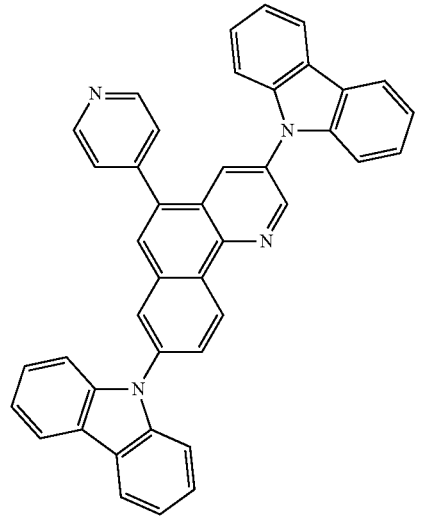
12
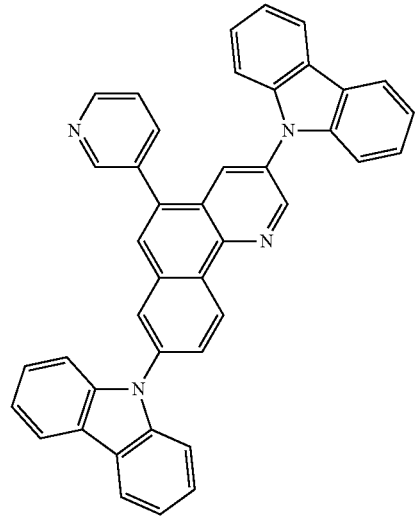

-continued
13
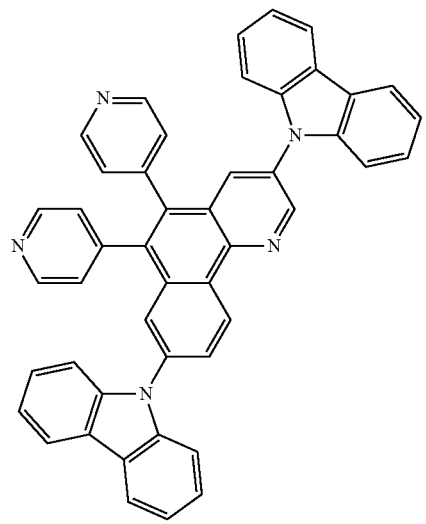
14
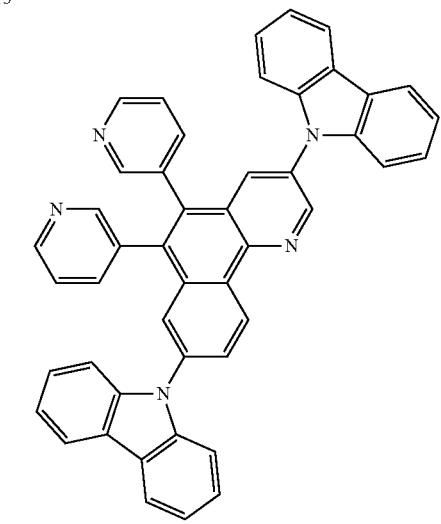
15
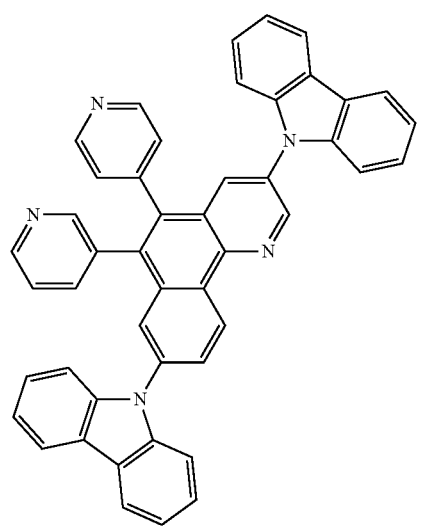
16
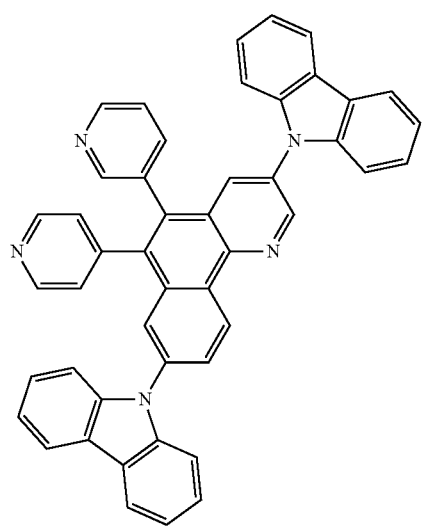
17
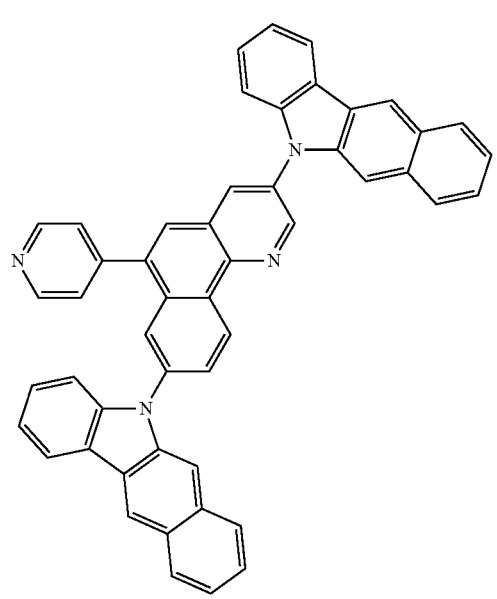
18
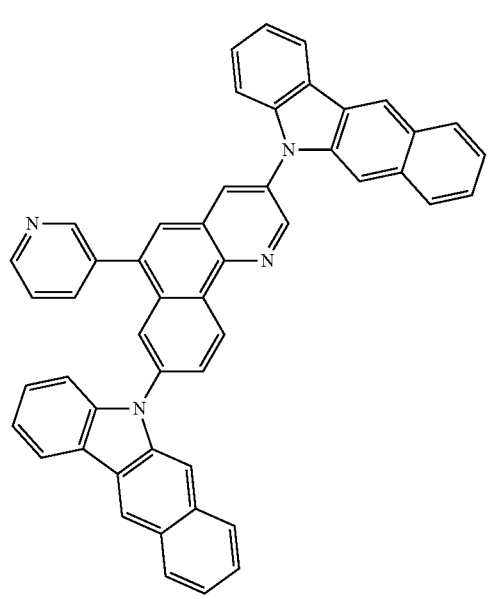

-continued
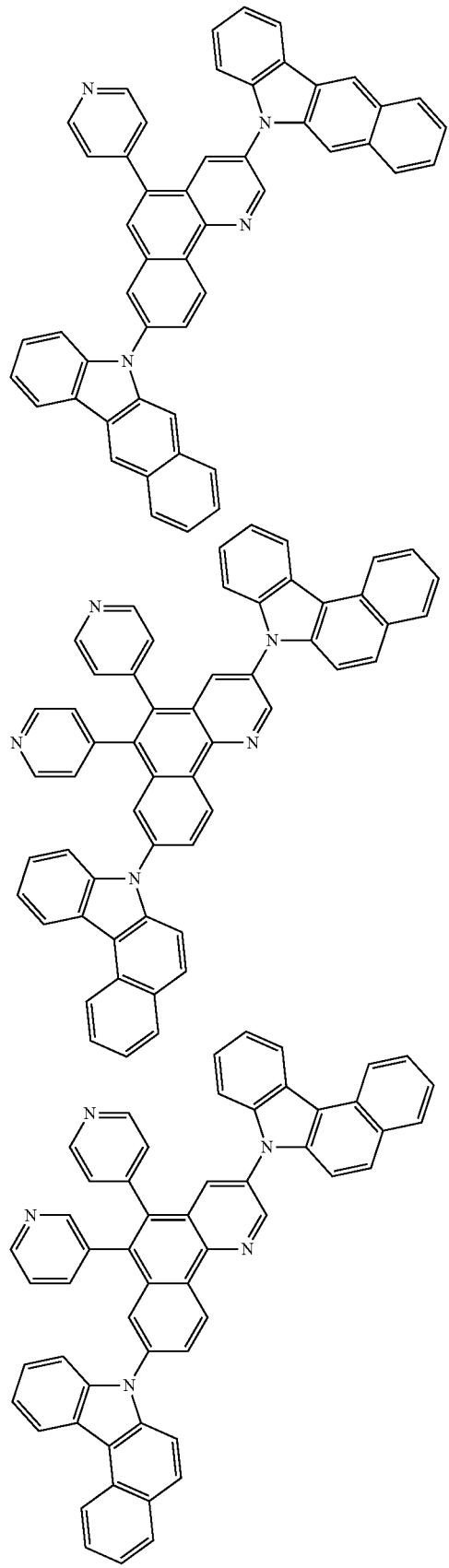
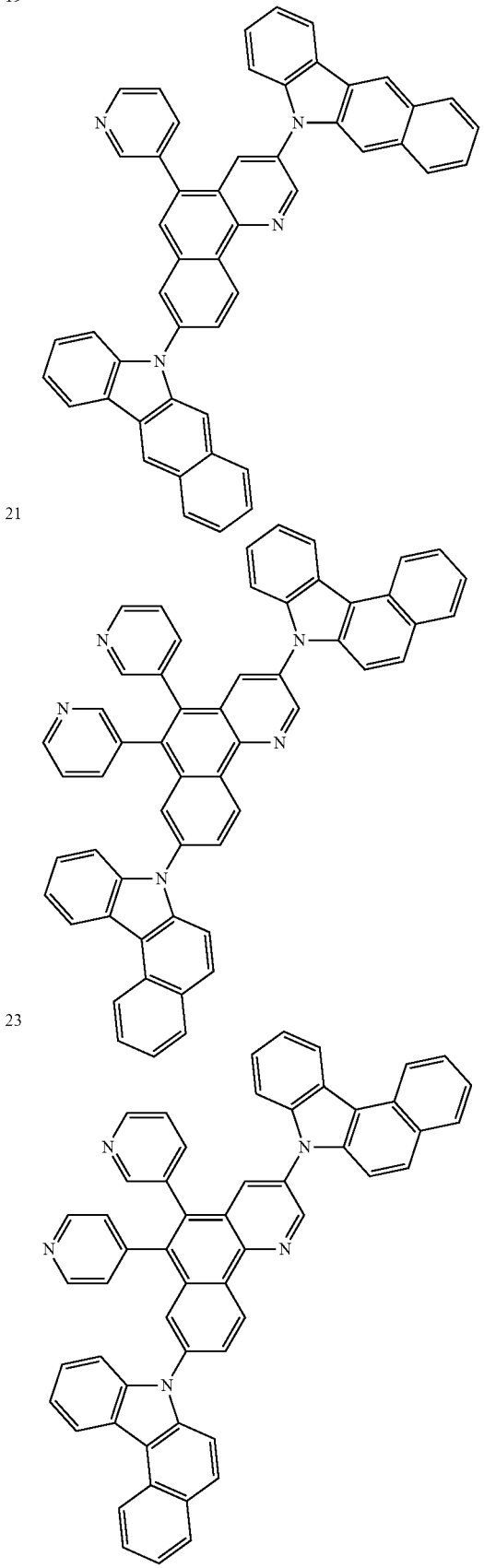

25
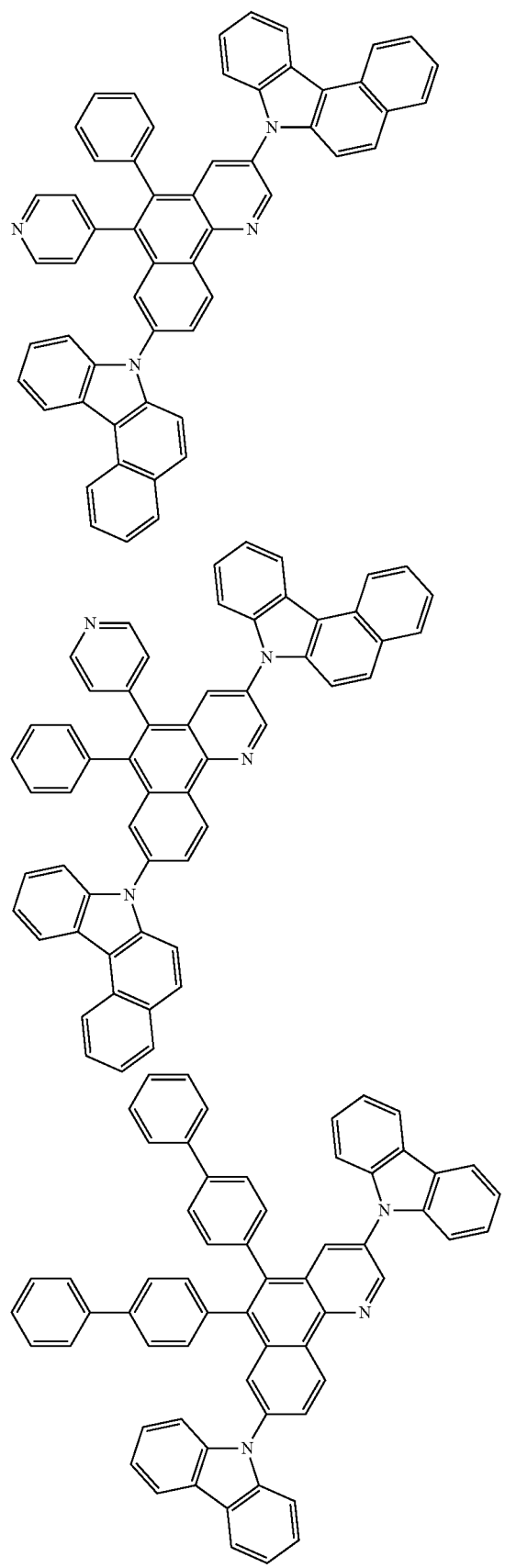
26
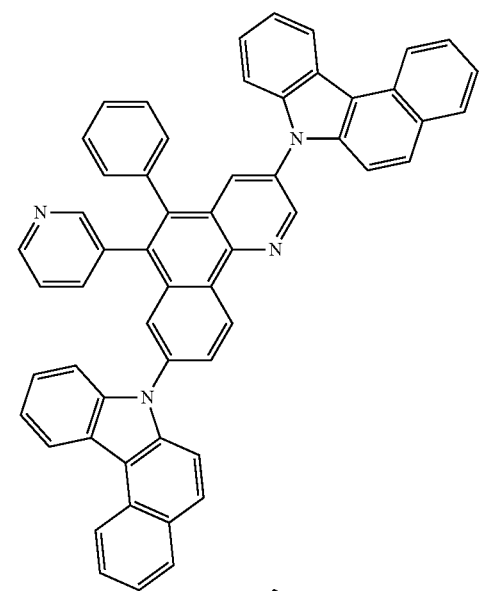
27
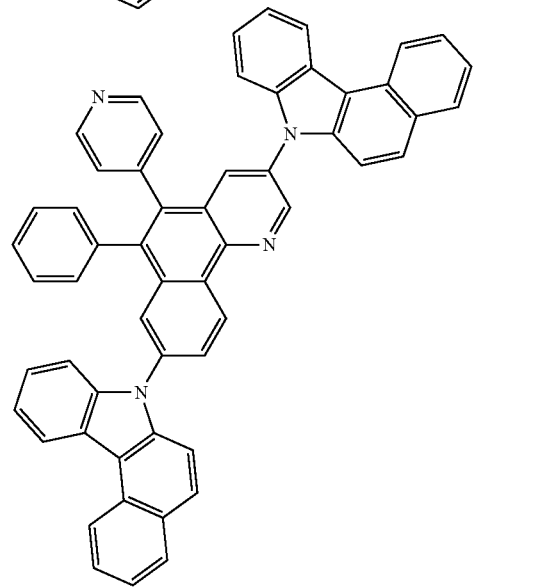
28
29
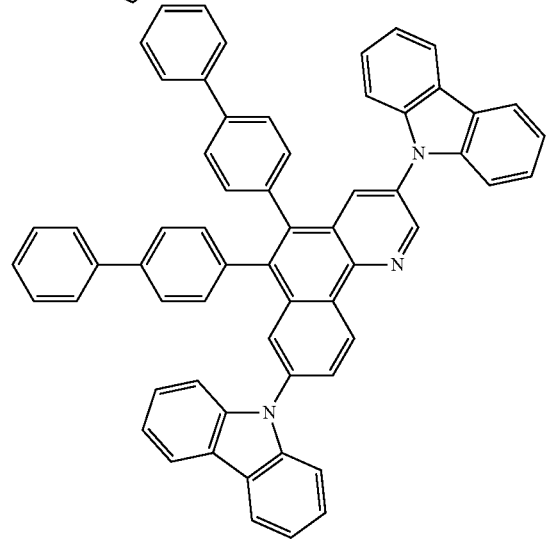
30
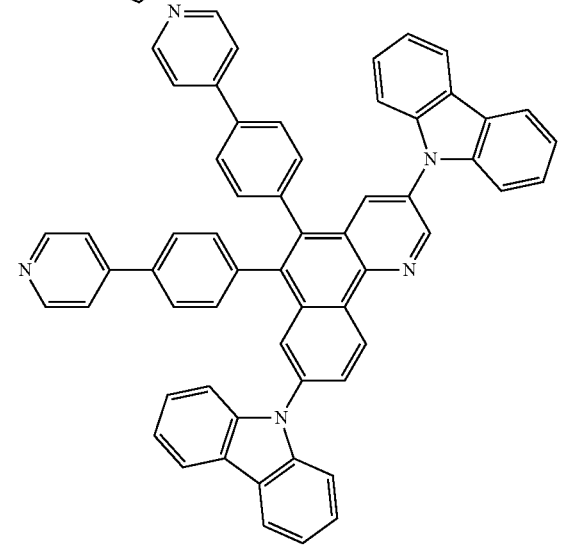

-continued
31
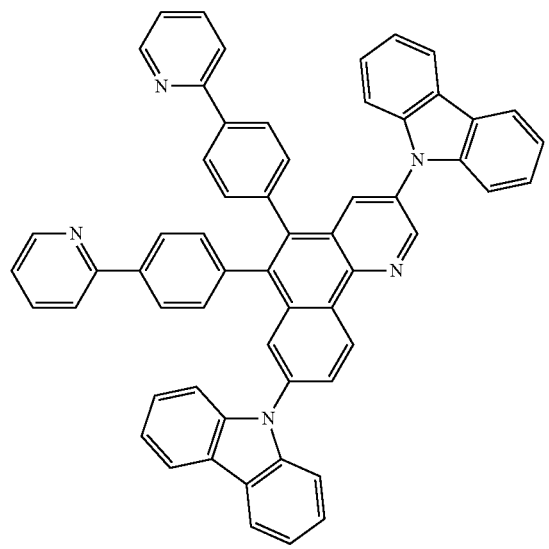
32
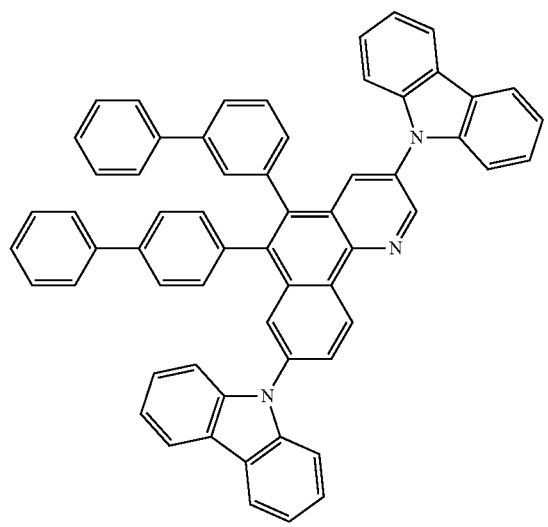
33
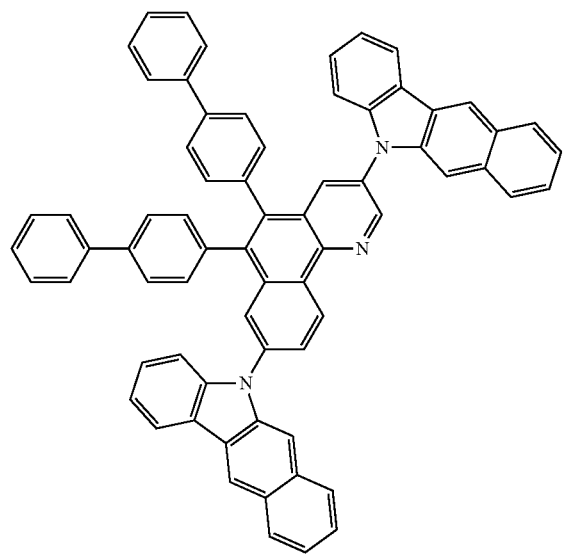
34
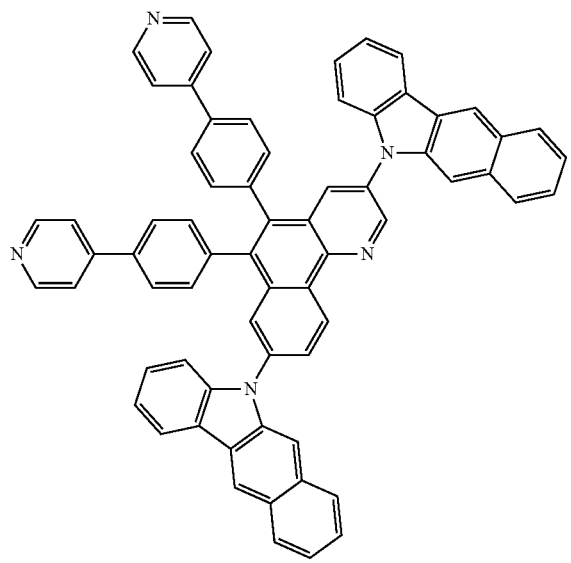
35
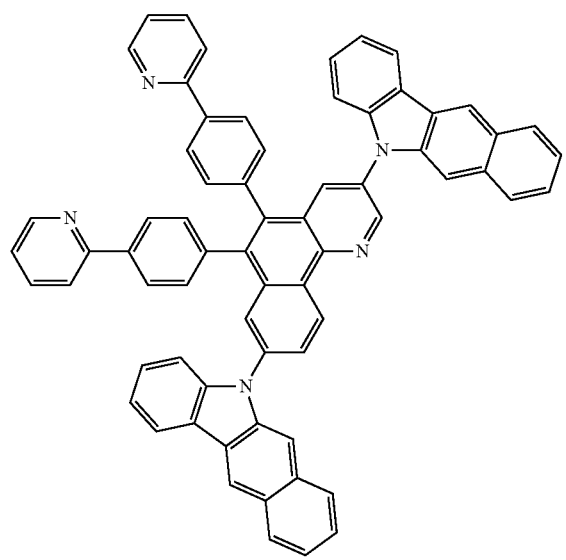
36
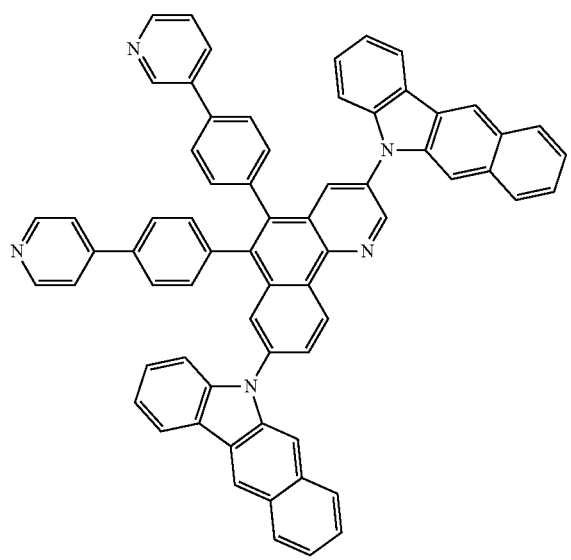

-continued
37
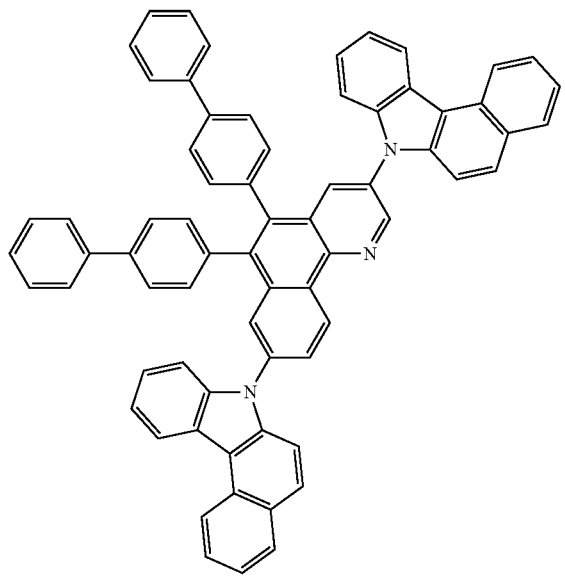
38
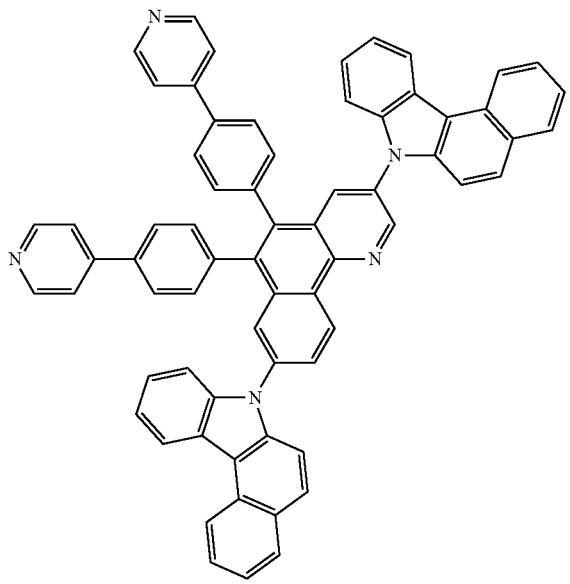
39
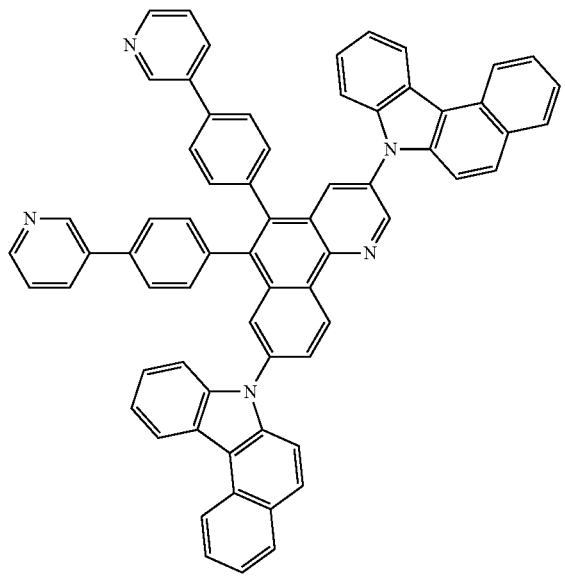
40
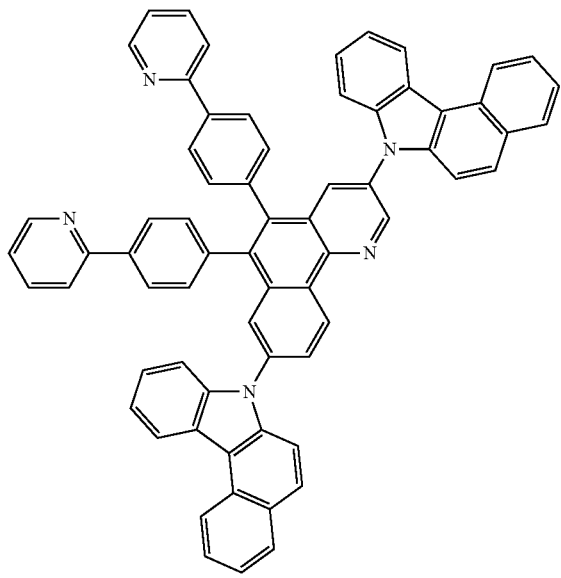
41
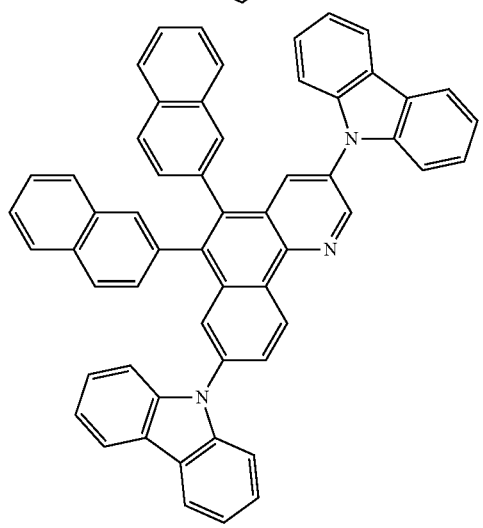
42
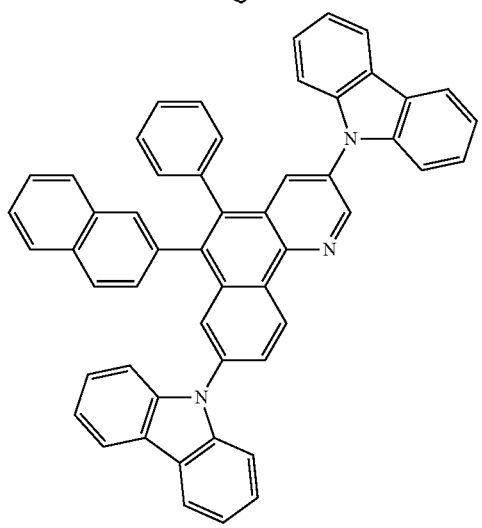

-continued
43
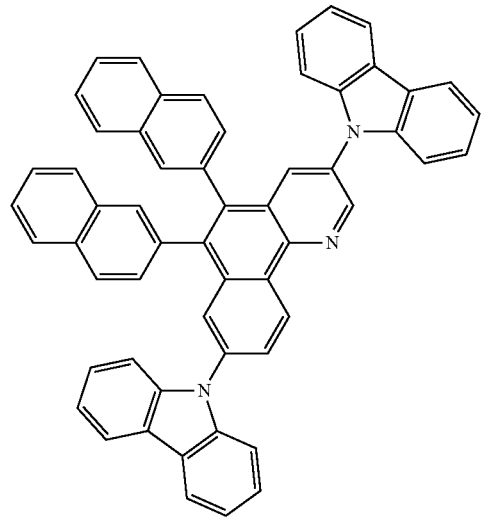
44
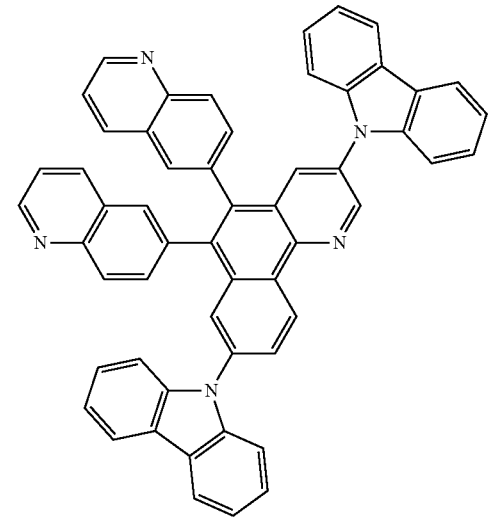
45
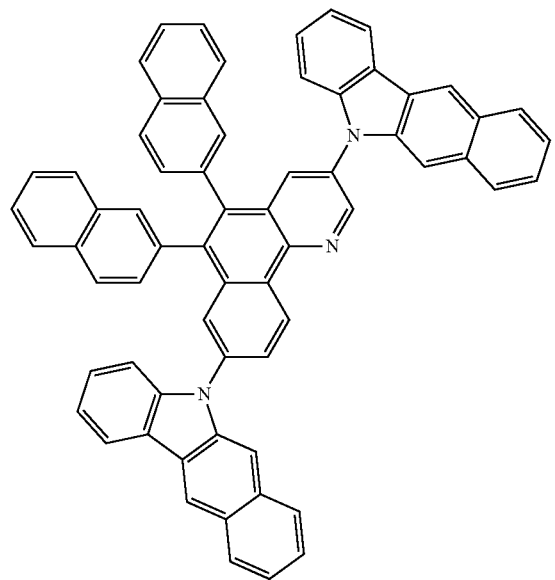
46
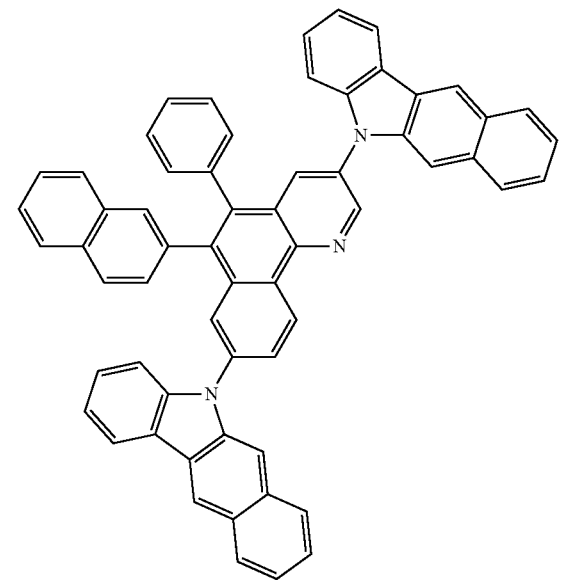
47
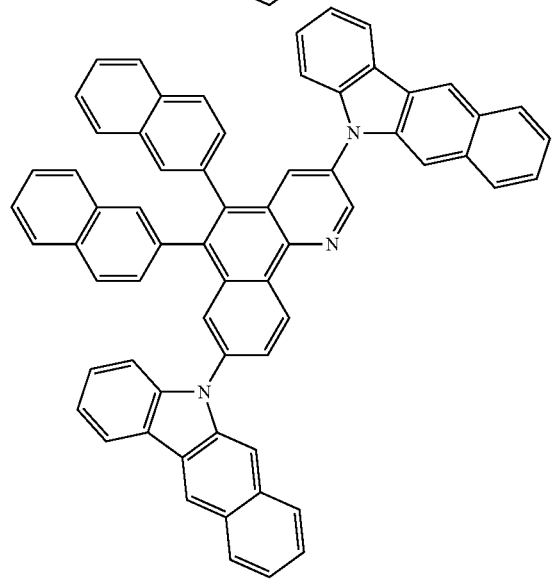
48
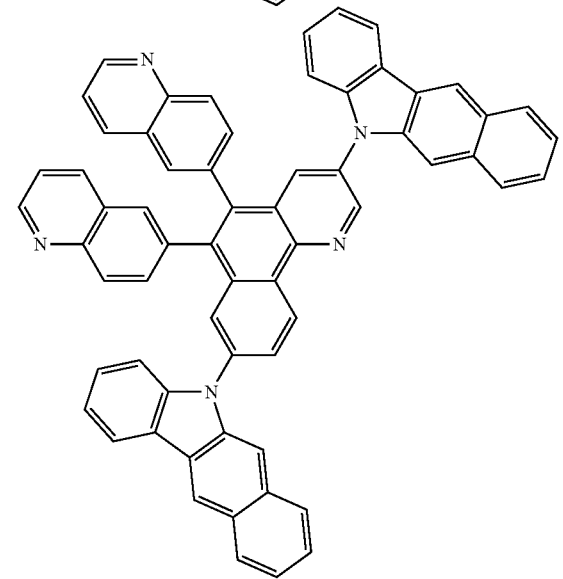

-continued
49
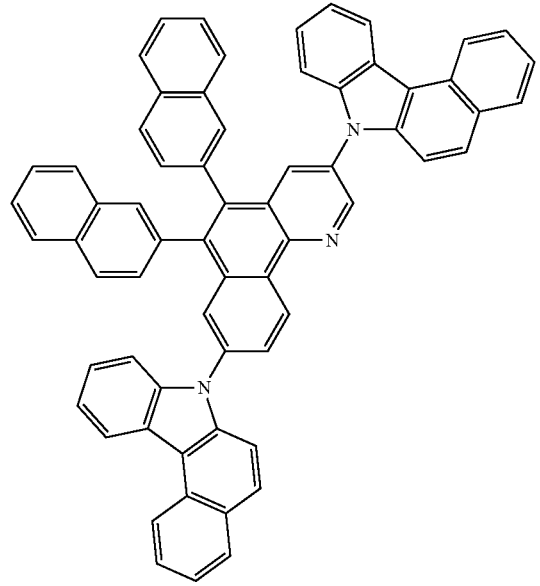
50
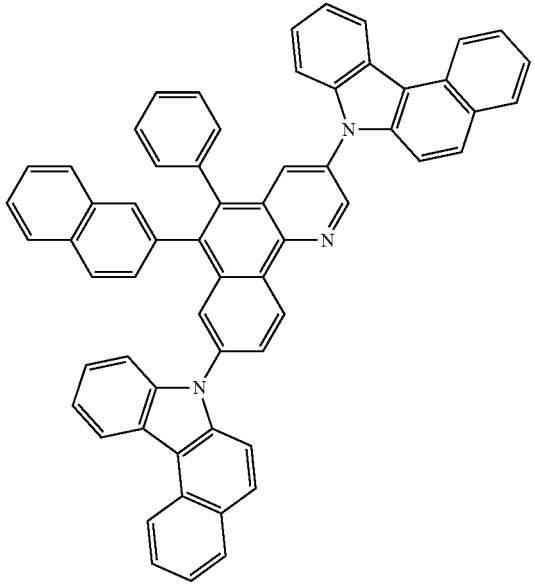
51
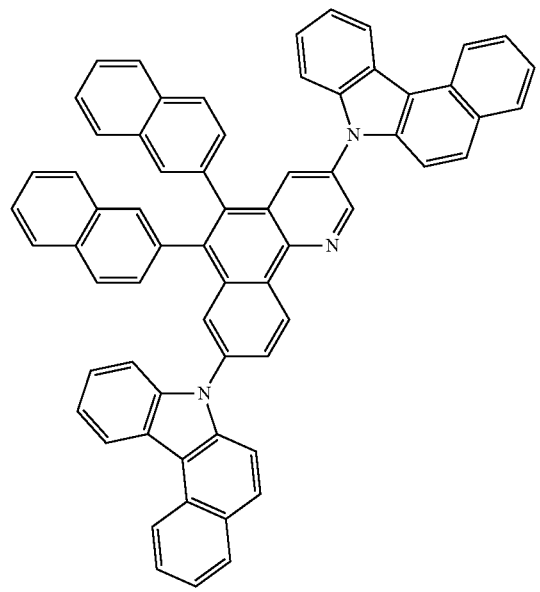
52
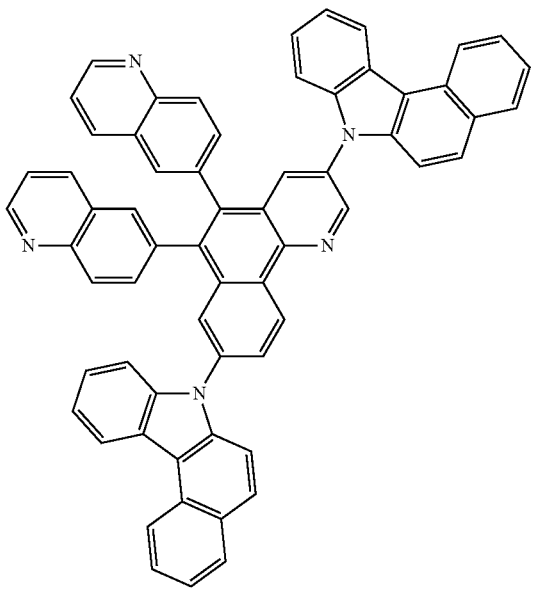

-continued
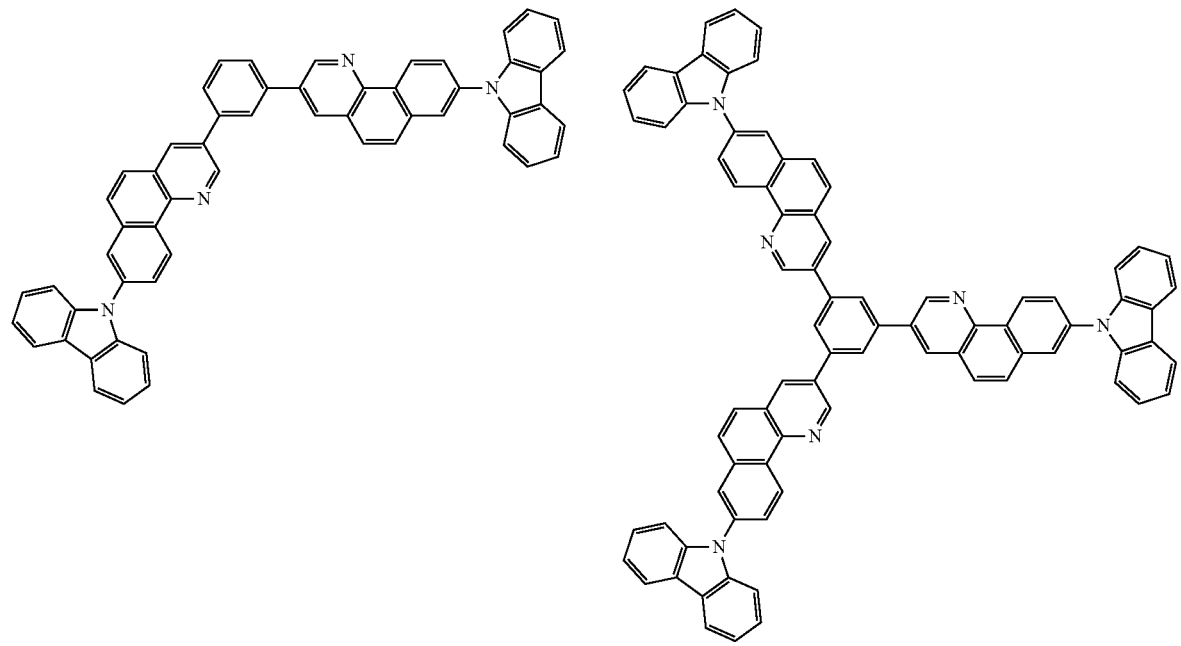

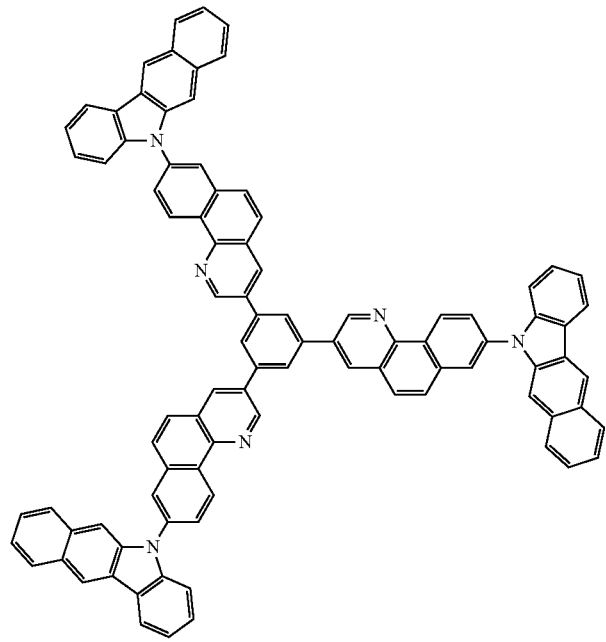
56
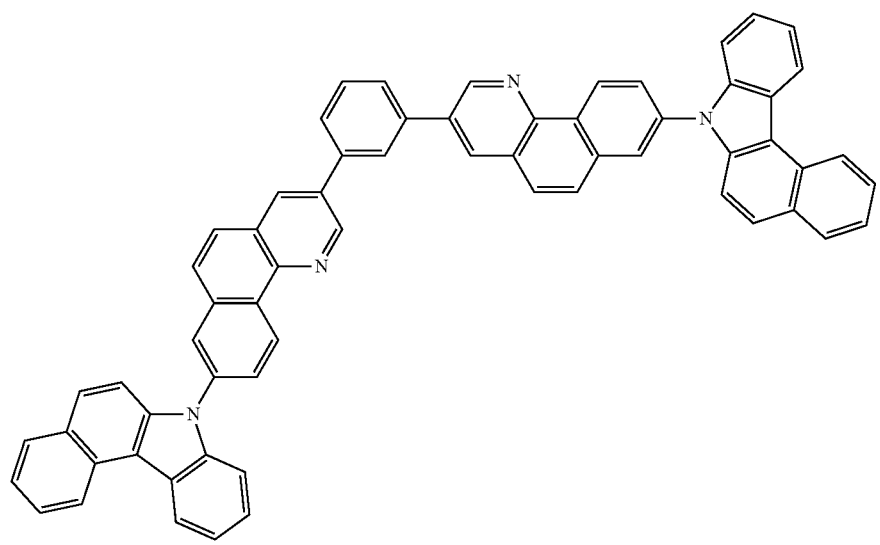
57

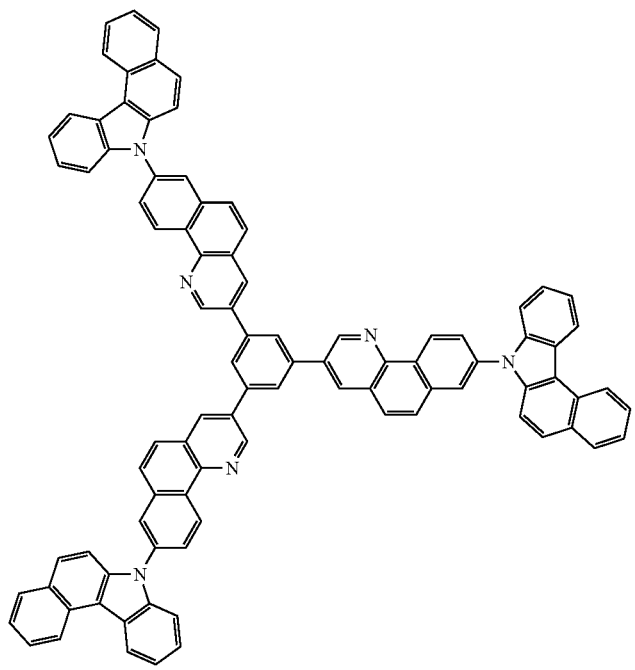
10. The OLED of claim 1, wherein the metallic complex is one of:
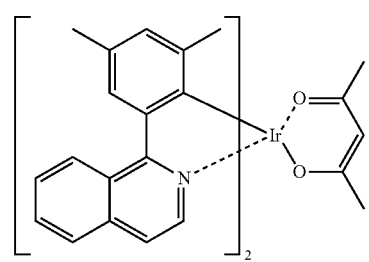
401
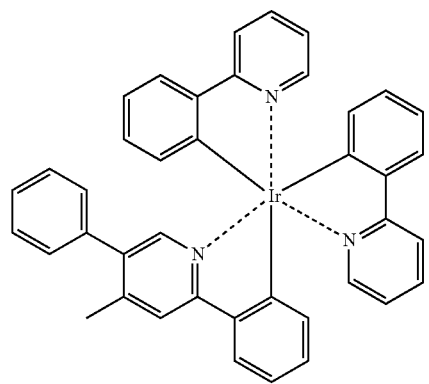
402
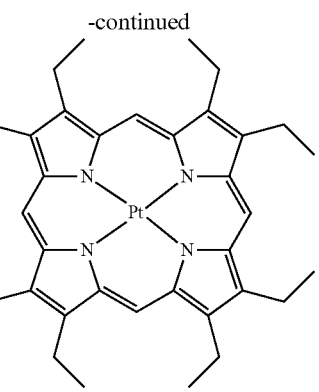
PtOEP
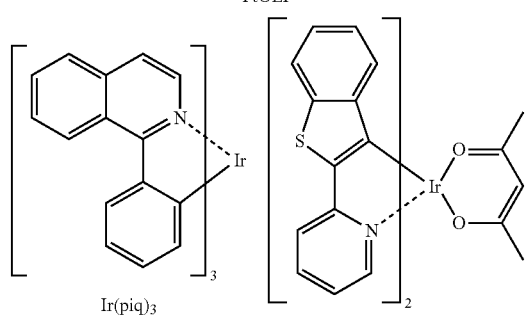
Ir(piq)₃           Btp₂Ir(acac)
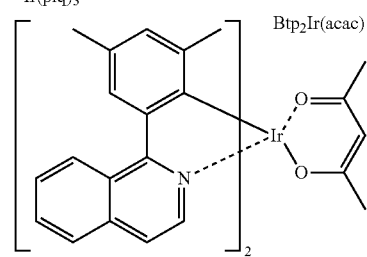

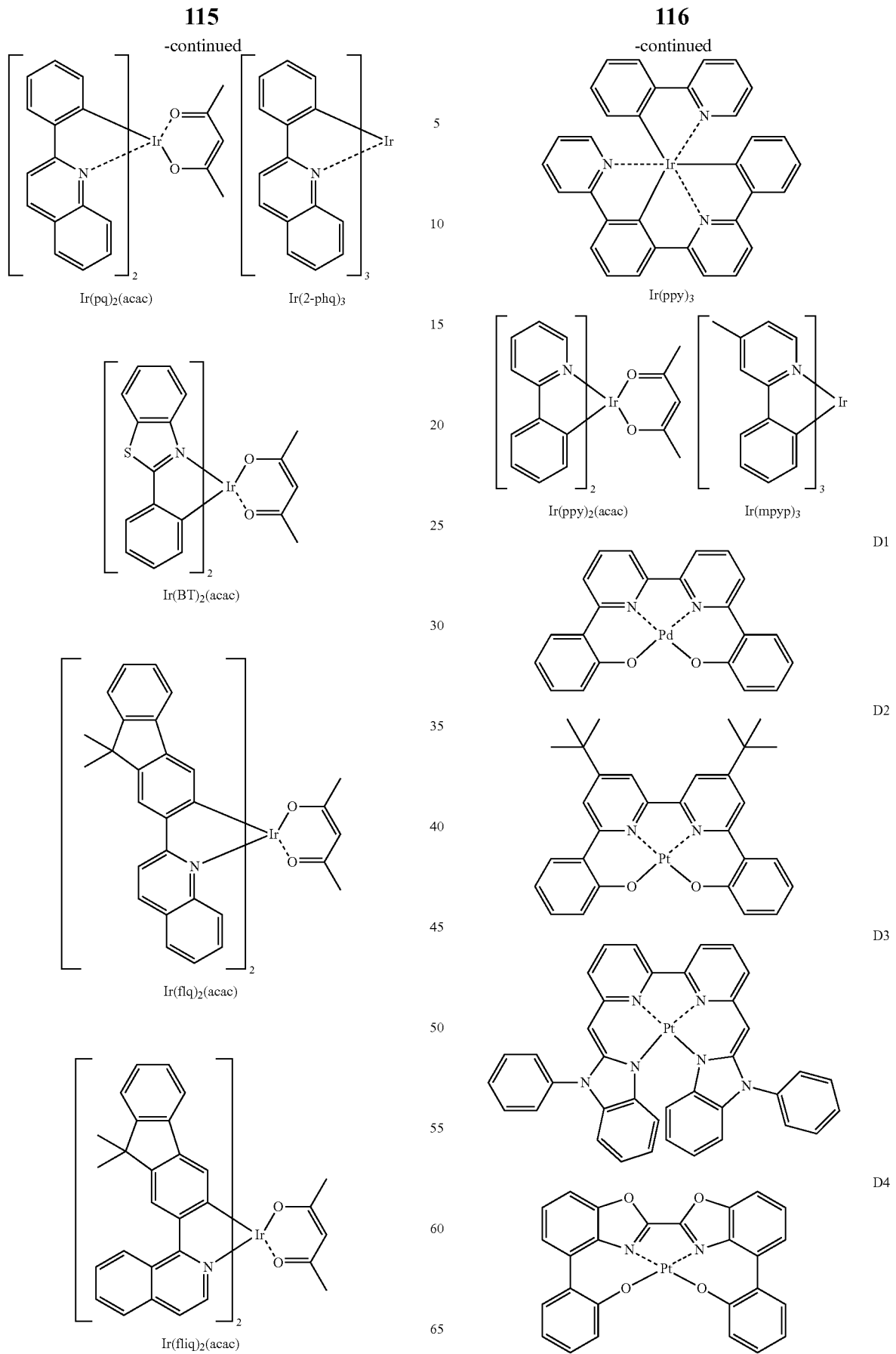

117
-continued
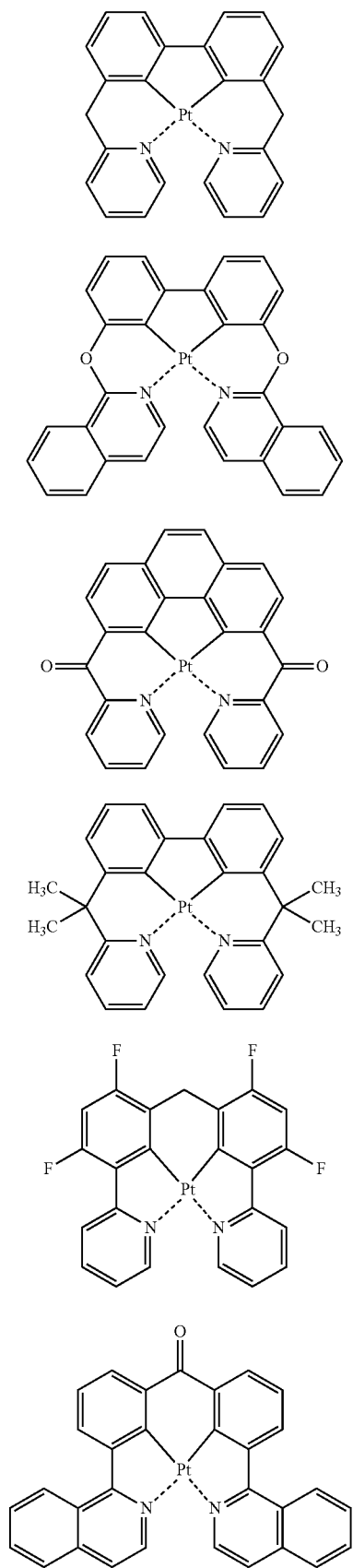
D5
D6
D7
D8
D9
D10
118
-continued
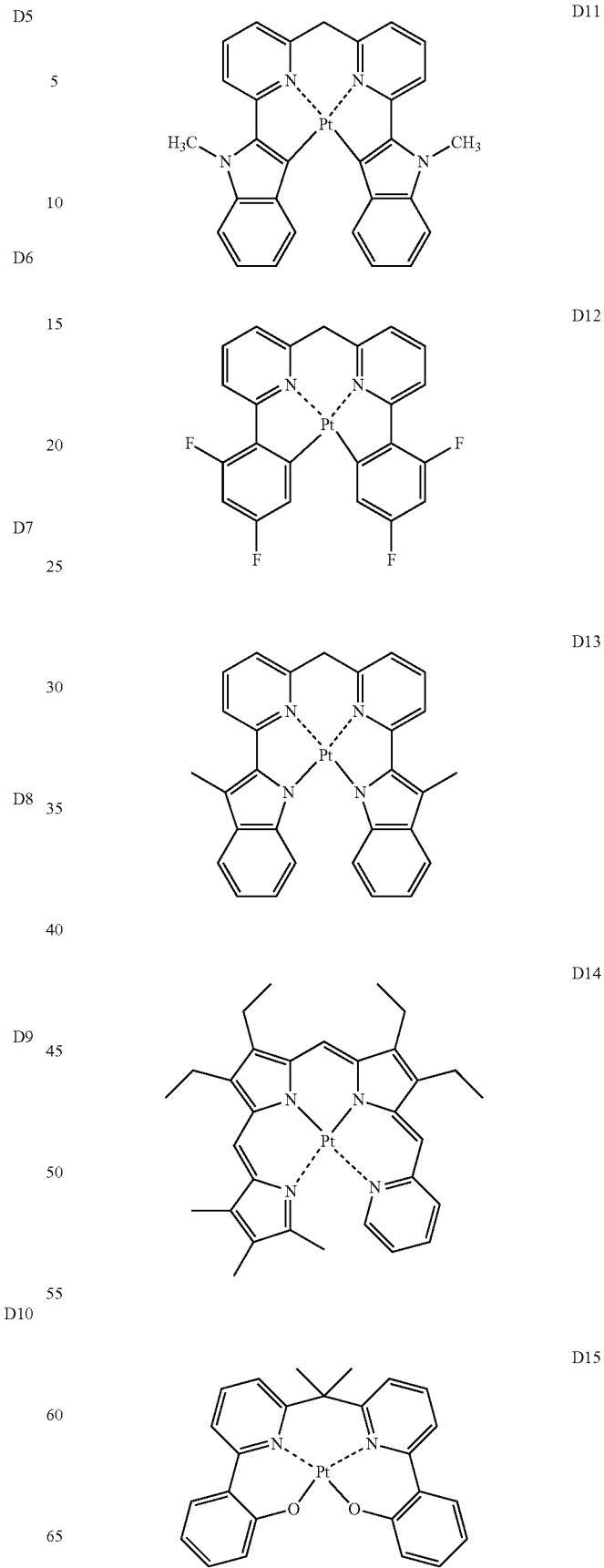
D11
D12
D13
D14
D15

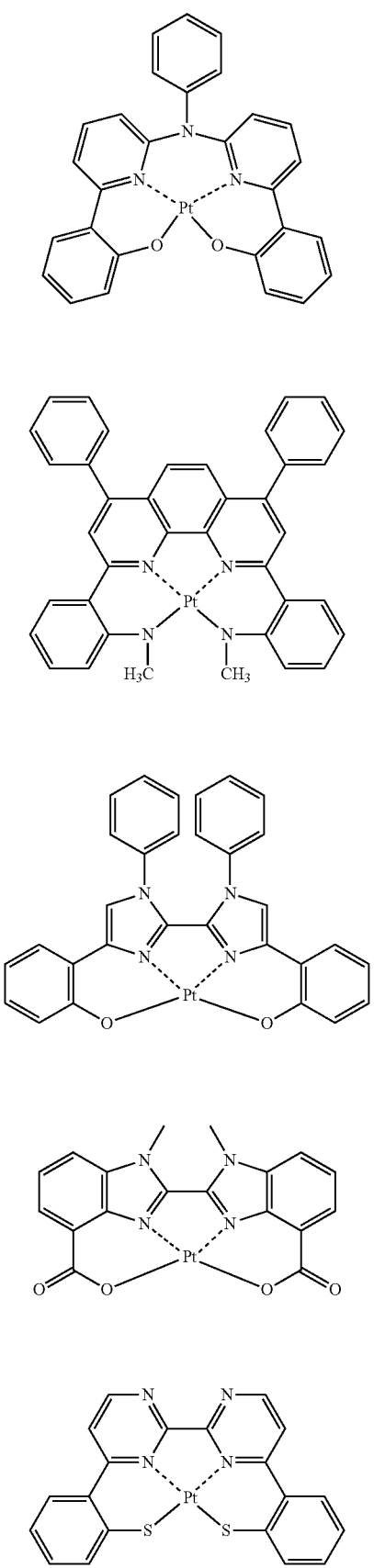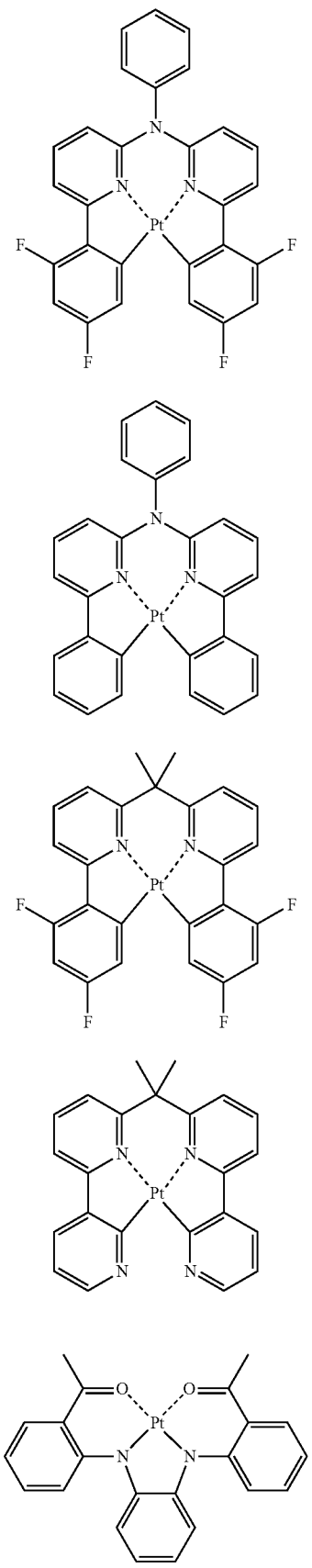

-continued
D26
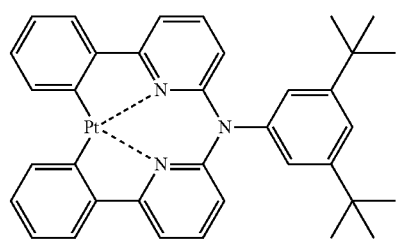
D27
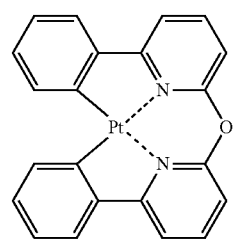
D28
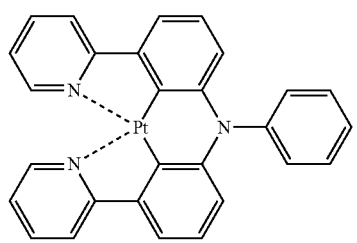
D29
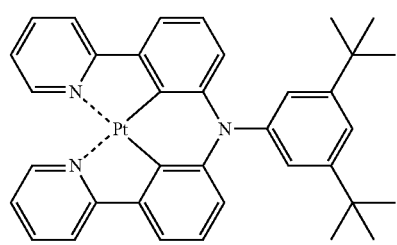
D30
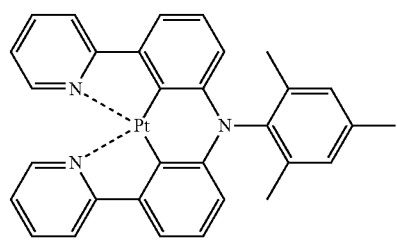
D31
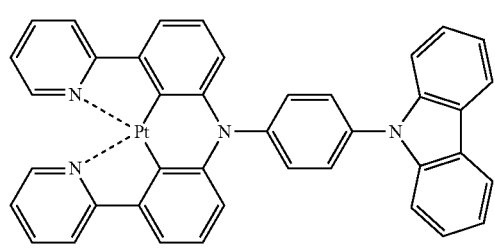
-continued
D32
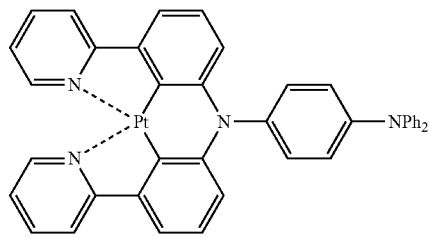
D33
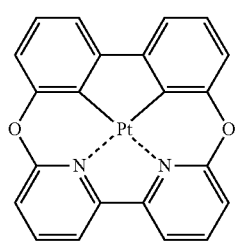
D34
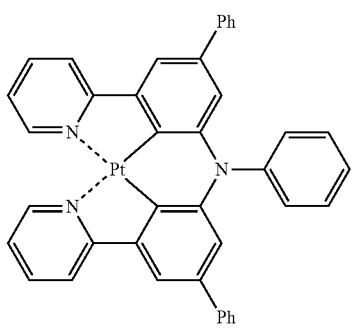
D35
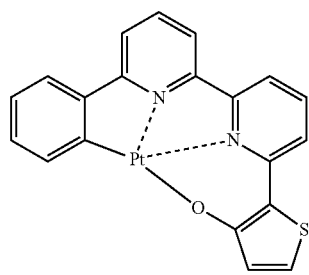
D36
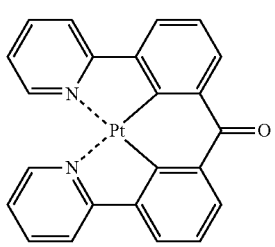

-continued
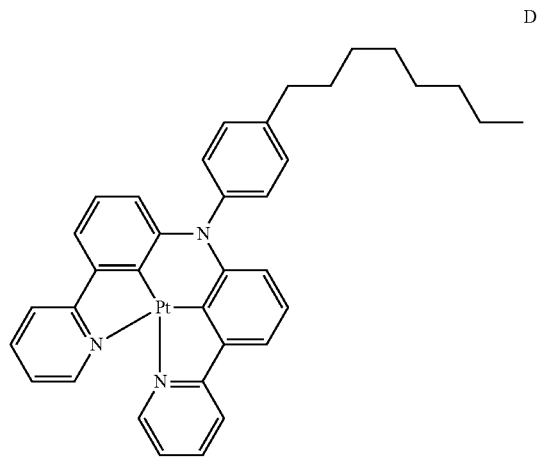
D37
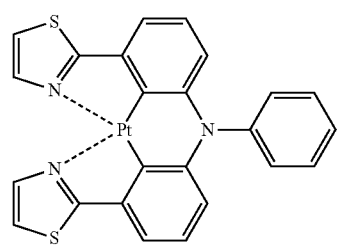
D38
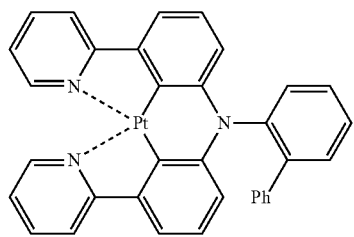
D39
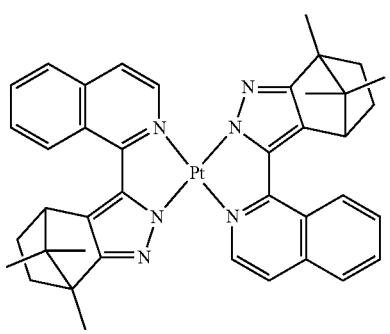
D40
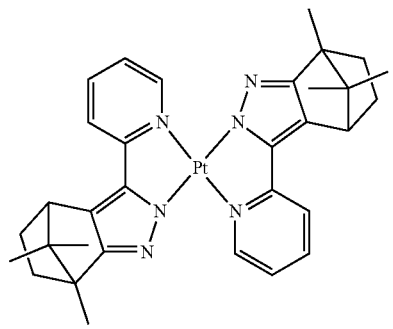
D41
-continued
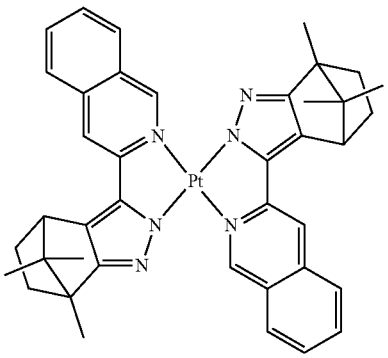
D42
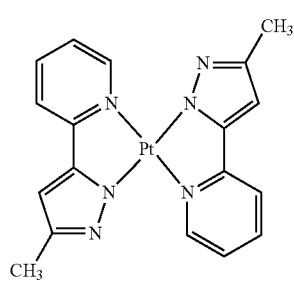
D43
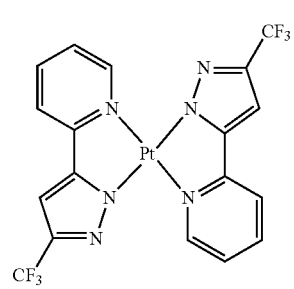
D44
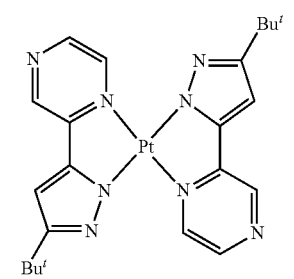
D45
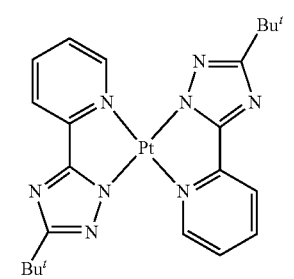
D46

D47 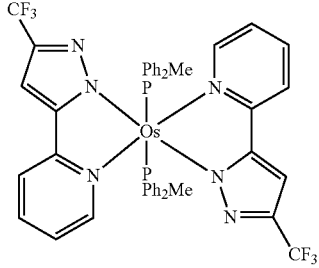
Os(fppz)₂(PPh₂Me)₂

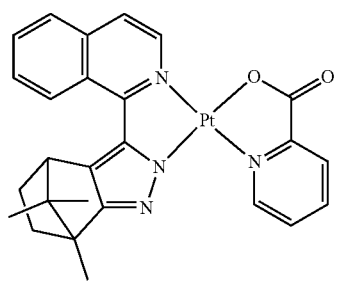

D48 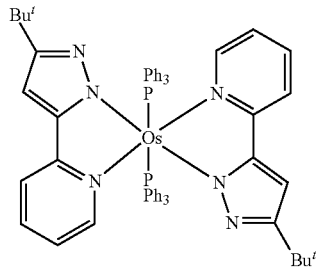
Os(bppz)₂(PPh₃)₂

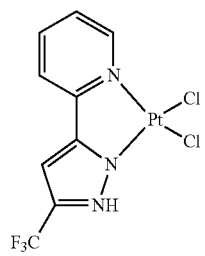

D49 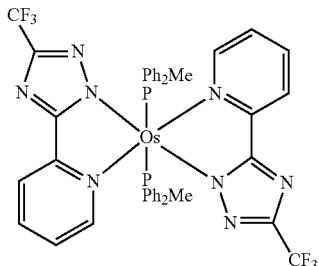
Os(fptz)₂(PPh₂Me)₂

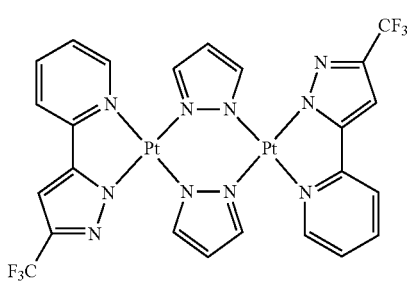

D50 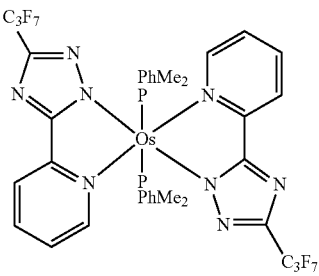
Os(bptz)₂(PPhMe₂)₂

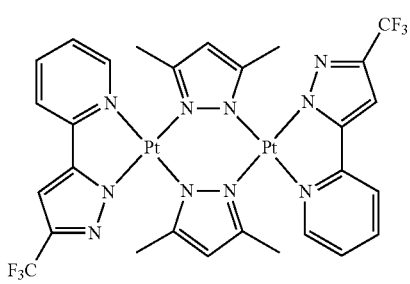

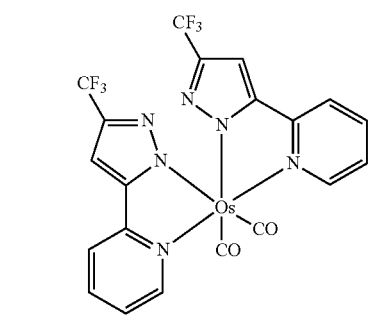
Os(fppz)₂(CO)₂

11. The OLED of claim 1, wherein the organic layer is an emission layer.

12. The OLED of claim 1, wherein the compound of Formula 1 or 2 is a host.

13. The OLED of claim 1, wherein the metallic complex is a dopant.

14. The OLED of claim 1, further comprising an emission layer, a hole injection layer, a hole transport layer, or a functional layer having both hole injection and hole transport capabilities,
wherein any one of a red layer, a green layer, a blue layer, and a white layer of the emission layer comprises a phosphorescent compound.

15. The OLED of claim 14, wherein the hole injection layer, the hole transport layer, or the functional layer having both hole injection and hole transport capabilities comprises a charge-generating material.

16. The OLED of claim 15, wherein the charge-generating material is a p-dopant.

17. The OLED of claim 16, wherein the p-dopant is a quinone derivative, a metallic oxide, or a cyano group-containing compound.

18. The OLED of claim 1, wherein the organic layer comprises an electron transport layer, and the electron transport layer comprises an electron transport organic compound and the metallic complex.

19. The OLED of claim 18, wherein the metallic complex is a lithium quinolate (LiQ) compound or Compound 203:

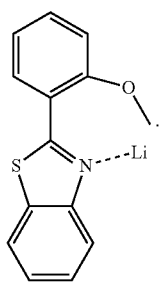

20. A flat panel display device comprising the OLED of claim 1,
   wherein the first electrode of the OLED is electrically connected to a source electrode or a drain electrode of a thin film transistor (TFT).

* * * * *